United States Patent
Hirose et al.

(10) Patent No.: US 9,548,198 B2
(45) Date of Patent: Jan. 17, 2017

(54) METHOD OF MANUFACTURING SEMICONDUCTOR DEVICE, SUBSTRATE PROCESSING APPARATUS, AND RECORDING MEDIUM

(71) Applicants: HITACHI KOKUSAI ELECTRIC INC., Tokyo (JP); L'AIR LIQUIDE, SOCIETE ANONYME POUR L'ETUDE ET L'EXPLOITATION DES PROCEDES GEORGES CLAUDE, Paris (FR)

(72) Inventors: Yoshiro Hirose, Toyama (JP); Norikazu Mizuno, Toyama (JP); Kazutaka Yanagita, Tsukuba (JP); Shingo Okubo, Tsukuba (JP)

(73) Assignees: HITACHI KOKUSAI ELECTRIC INC., Tokyo (JP); L'AIR LIQUIDE, SOCIETE ANONYME POUR L'ETUDE ET L'EXPLOITATION DES PROCEDES GEORGES CLAUDE, Paris (FR)

( * ) Notice: Subject to any disclaimer, the term of this patent is extended or adjusted under 35 U.S.C. 154(b) by 0 days.

(21) Appl. No.: 14/218,484

(22) Filed: Mar. 18, 2014

(65) Prior Publication Data
US 2014/0287596 A1 Sep. 25, 2014

(30) Foreign Application Priority Data
Mar. 19, 2013 (JP) .................................. 2013-057100

(51) Int. Cl.
*H01L 21/02* (2006.01)
*C23C 16/30* (2006.01)
*C23C 16/455* (2006.01)

(52) U.S. Cl.
CPC ......... *H01L 21/02126* (2013.01); *C23C 16/30* (2013.01); *C23C 16/45531* (2013.01);
(Continued)

(58) Field of Classification Search
CPC ............... C23C 16/30; C23C 16/45534; H01L 21/02126; H01L 21/02164; H01L 21/02211; H01L 21/02219
See application file for complete search history.

(56) References Cited

U.S. PATENT DOCUMENTS 8,329,599 B2  12/2012  Fukazawa et al.
2004/0018694 A1  1/2004  Lee et al.
(Continued)

FOREIGN PATENT DOCUMENTS

JP  2004-040110 A  2/2004
JP  2004-260192 A  9/2004
(Continued)

OTHER PUBLICATIONS

Japanese Notice of Reasons for Refusal, JP Application No. 2013-057100, Oct. 4, 2016, 4 pgs. (English translation provided).

*Primary Examiner* — Bac Au
(74) *Attorney, Agent, or Firm* — Volpe and Koenig, P.C.

(57) ABSTRACT

A method of manufacturing a semiconductor device including forming a thin film containing silicon, oxygen and carbon on a substrate by performing a cycle a predetermined number of times, the cycle including: supplying a precursor gas containing silicon, carbon and a halogen element and having an Si—C bonding, and a first catalytic gas to the substrate; and supplying an oxidizing gas and a second catalytic gas to the substrate.

16 Claims, 17 Drawing Sheets

(52) U.S. Cl.
CPC ...... *C23C 16/45534* (2013.01); *H01L 21/022* (2013.01); *H01L 21/0228* (2013.01); *H01L 21/02164* (2013.01); *H01L 21/02211* (2013.01); *H01L 21/02219* (2013.01); *H01L 21/02274* (2013.01)

(56) References Cited

U.S. PATENT DOCUMENTS

| | | |
|---|---|---|
| 2004/0180557 A1 | 9/2004 | Park et al. |
| 2008/0085612 A1 | 4/2008 | Smythe et al. |
| 2010/0041179 A1* | 2/2010 | Lee ............................ 438/104 |
| 2010/0124618 A1* | 5/2010 | Kobayashi et al. .......... 427/535 |
| 2010/0210118 A1 | 8/2010 | Mizuno |
| 2010/0233886 A1 | 9/2010 | Yang et al. |
| 2010/0304047 A1* | 12/2010 | Yang et al. .................... 427/577 |
| 2011/0076789 A1* | 3/2011 | Kuroda ................. H01L 21/266 438/14 |
| 2014/0051260 A1* | 2/2014 | Sasajima et al. ............. 438/762 |
| 2014/0287164 A1* | 9/2014 | Xiao et al. .................... 427/579 |

FOREIGN PATENT DOCUMENTS

| | | |
|---|---|---|
| JP | 2009-117646 A | 5/2009 |
| JP | 2009-182286 A | 8/2009 |
| JP | 2010-219500 A | 9/2010 |
| JP | 2010-219533 A | 9/2010 |
| JP | 2011-091362 A | 5/2011 |
| JP | 2011-108737 A | 6/2011 |
| JP | 2011-524087 A | 8/2011 |
| WO | 2011/042882 A2 | 4/2011 |
| WO | 2012/167060 A2 | 12/2012 |

\* cited by examiner

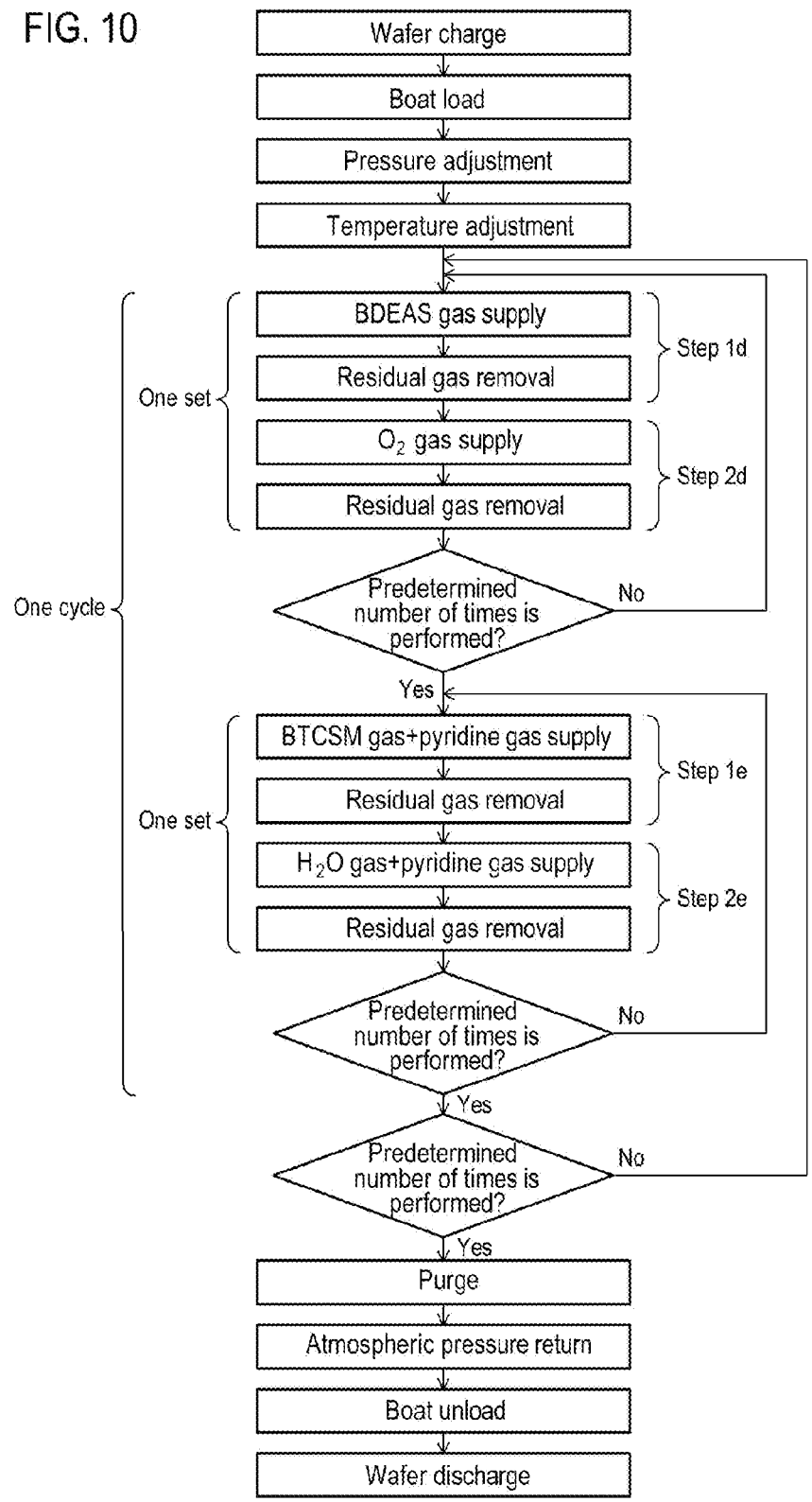

FIG. 13A

| Name | Pyridine | Aminopyridine | Picoline | Lutidine | Piperazine | Piperidine |
|---|---|---|---|---|---|---|
| Composition formula | $C_5H_5N$ | $C_5H_6N_2$ | $C_6H_7N$ | $C_7H_9N$ | $C_4H_{10}N_2$ | $C_5H_{11}N$ |
| Structural formula | | | | | | |
| Acid dissociation constant (pKa) | 5.67 | 6.89 | 6.07 | 6.96 | 9.80 | 11.12 |

Triethylamine (TEA)
acid dissociation constant (pKa) 10.7

Diethylamine (DEA)
acid dissociation constant (pKa) 10.9

Monoethylamine (MEA)
acid dissociation constant (pKa) 10.6

Trimethylamine (TMA)
acid dissociation constant (pKa) 9.8

Monomethylamine (MMA)
acid dissociation constant (pKa) 10.6

FIG. 14A
| Atomic ratio % | C | N | O | Si | Cl | R.I. | WER (1%HF) |
|---|---|---|---|---|---|---|---|
| TCDMDS/O$_3$/TEA – 30°C | 16.2 | 2.4 | 44.8 | 36.4 | 0.3 | 1.45 | ~ 200 Å/min |
| TCDMDS/O$_3$/Piperidine – 70°C | 23.9 | 3.6 | 36.4 | 36.4 | 0.3 | 1.41 | ~ 50 Å/min |
| DCTMDS/O$_3$/TEA – 50°C | 26.0 | 0 | 38.4 | 35.6 | 0 | 1.51 | ~ 9 Å/min |
| BTCSM/H$_2$O/TEA – 70°C | 12.9 | 0 | 45.4 | 41.7 | 0 | 1.54 | ~ 23 Å/min |
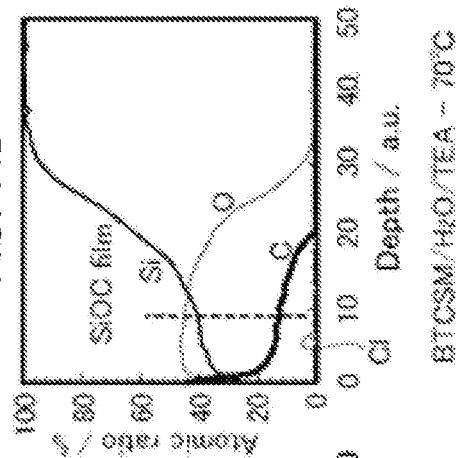
FIG. 14D — BTCSM/H$_2$O/TEA – 70°C
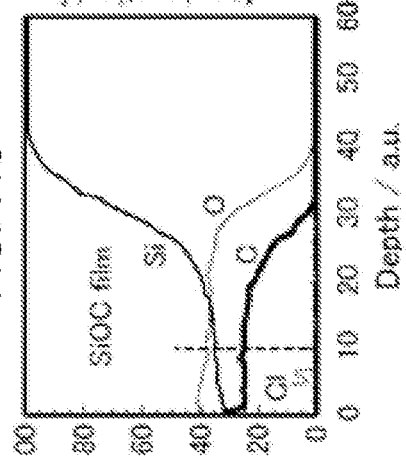
FIG. 14C — DCTMDS/O$_3$/TEA – 50°C
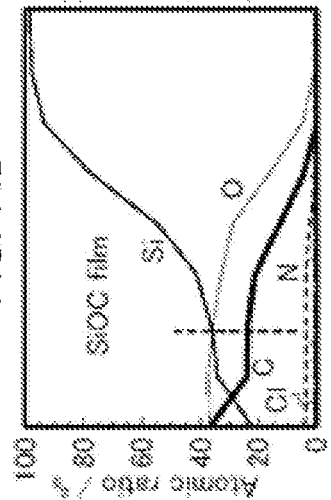
FIG. 14B — TCDMDS/O$_3$/Piperidine – 70°C

FIG. 15

| BTCSM | 30°C | 50°C | 70°C | 100°C | 120°C | 150°C |
|---|---|---|---|---|---|---|
| $H_2O$ - TEA | | Yes (5.7 Å /cycle) R.I. = 1.56 WER = 86 Å/min | Yes (1.0 Å /cycle) R.I. = 1.54 WER = 23 Å/min | No (< 0.1 Å /cycle) | | |
| $O_3$ - TEA | Yes (2.9 Å /cycle) R.I. = 1.26 WER = 2800 Å/min (Porous film) | Yes (1.8 Å /cycle) R.I. = 1.36 WER = 1000 Å/min (Porous film) | Yes (1.4 Å /cycle) R.I. = 1.57 WER = 940 Å/min | Yes (1.0 Å /cycle) R.I. = 1.51 WER = 437.3 Å/min ($SiO_2$) | Yes (0.6 Å /cycle) R.I. = 1.51 ($SiO_2$) | No (< 0.1 Å /cycle) |
| $H_2O$ - piperidine | | No (10.3 Å /cycle) R.I. = 1.62 (Salt deposition) | Yes (1.0 Å /cycle) R.I. = 1.90 WER ≥ 1850 Å/min | No (< 0.1 Å /cycle) | | |
| $O_3$ - piperidine | | No (11.9 Å /cycle) R.I. = 1.20 (Salt deposition) | Yes (1.7 Å /cycle) R.I. = 1.22 WER ≥ 1101 Å/min | Yes (1.5 Å /cycle) R.I. = 1.38 WER ≥ 815 Å/min | Yes (0.5 Å /cycle) R.I. = 1.56 ($SiO_2$) | Yes (0.5 Å /cycle) R.I. = 1.58 ($SiO_2$) |
| $H_2O$ - pyridine | | Yes (0.9 Å /cycle) R.I. = 1.28 WER = 26.5 Å/min | No (< 0.1 Å /cycle) | | | |

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2013-057100, filed on Mar. 19, 2013, the entire contents of which are incorporated herein by reference.

TECHNICAL FIELD

The present disclosure relates to a method of manufacturing a semiconductor device, a substrate processing apparatus, and a recording medium.

BACKGROUND

The processes of manufacturing a semiconductor device may include a process of forming a thin film such as a silicon oxide film on a substrate. For example, the thin film is formed by supplying a precursor gas containing silicon, an oxidizing gas or the like to the substrate. In this case, a catalytic gas may be used to form a thin film at a relatively low temperature thereby improving a thermal budget or the like of the semiconductor device.

In addition, in forming a thin film on a substrate carbon or the like may be added to the thin film to enhance the film quality such as a resistance to wet etching.

However, under a relatively low temperature condition, it may be difficult to introduce carbon into a film, which results in failing to obtain a sufficient carbon concentration or failing to control the carbon concentration with high precision, or the like. Due to these problems, it is impossible to form a thin film having sufficient etching resistance, for example.

SUMMARY

The present disclosure provides some embodiments of a method of manufacturing a semiconductor device capable of increasing carbon concentration in a thin film or controlling the carbon concentration with high precision, a substrate processing apparatus, and a recording medium.

According to an aspect of the present disclosure, there is provided a method of manufacturing a semiconductor device, including forming a thin film containing silicon, oxygen and carbon on a substrate by performing a cycle a predetermined number of times, the cycle including: supplying a precursor gas containing silicon, carbon and a halogen element and having an Si—C bonding, and a first catalytic gas to the substrate; and supplying an oxidizing gas and a second catalytic gas to the substrate.

According to another aspect of the present disclosure, there is provided a substrate processing apparatus, including: a process chamber configured to accommodate a substrate therein; a precursor gas supply system configured to supply a precursor gas containing silicon, carbon and a halogen element and having an Si—C bonding into the process chamber; an oxidizing gas supply system configured to supply an oxidizing gas into the process chamber; a catalytic gas supply system configured to supply first and second catalytic gases into the process chamber; and a control unit configured to control the precursor gas supply system, the oxidizing gas supply system, and the catalytic gas supply system such that a thin film containing silicon, oxygen and carbon is formed on the substrate by performing a cycle a predetermined number of times, the cycle including supplying the precursor gas and the first catalytic gas to the substrate in the process chamber, and supplying the oxidizing gas and the second catalytic gas to the substrate in the process chamber.

According to still another aspect of the present disclosure, there is provided a non-transitory computer-readable recording medium storing a program that causes a computer to perform a process of forming a thin film containing silicon, oxygen and carbon on a substrate by performing a cycle a predetermined number of times, the cycle including: supplying a precursor gas containing silicon, carbon and a halogen element and having an Si—C bonding, and a first catalytic gas to the substrate in a process chamber of a substrate processing apparatus; and supplying an oxidizing gas and a second catalytic gas to the substrate in the process chamber.

BRIEF DESCRIPTION OF THE DRAWINGS

FIGS. 6A and 6B are views illustrating catalytic reactions in the film forming sequence according to the first embodiment of the present disclosure, FIG. 6A being a view illustrating a catalytic reaction in Step 1a and FIG. 6B being a view illustrating a catalytic reaction in Step 2a.

FIG. 10 is a flow chart illustrating a flow of film formation in a film forming sequence according to a modification of the second embodiment of the present disclosure.

FIGS. 13A to 13F are views illustrating names, chemical composition formulas, chemical structural formulas and acid dissociation constants of various amines used as a catalytic gas, FIGS. 13A to 13F showing names, chemical composition formulas, chemical structural formulas and acid dissociation constants of cyclic amines, TEA, DEA, MEA, TMA and MMA, respectively.

FIGS. 14A to 14D are views illustrating results of examples of the present disclosure, FIG. 14A being a table showing composition ratios, refractive indices and wet etching rates of SiOC films formed by using different types of precursor gases, oxidizing gases and catalytic gases, FIG. 14B being a graph showing an example of using TCDMDS gas as a precursor gas, FIG. 14C being a graph showing an example of using DCTMDS gas as a precursor gas, and FIG. 14D being a graph showing an example of using BTCSM gas as a precursor gas.

FIG. 15 is a view illustrating results of examples of the present disclosure, FIG. 15 showing a table showing film forming rates, refractive indices and temperature dependency of wet etching rates of SiOC films formed by using a predetermined precursor gas and different types of oxidizing gases, and catalytic gases.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Figure 1:
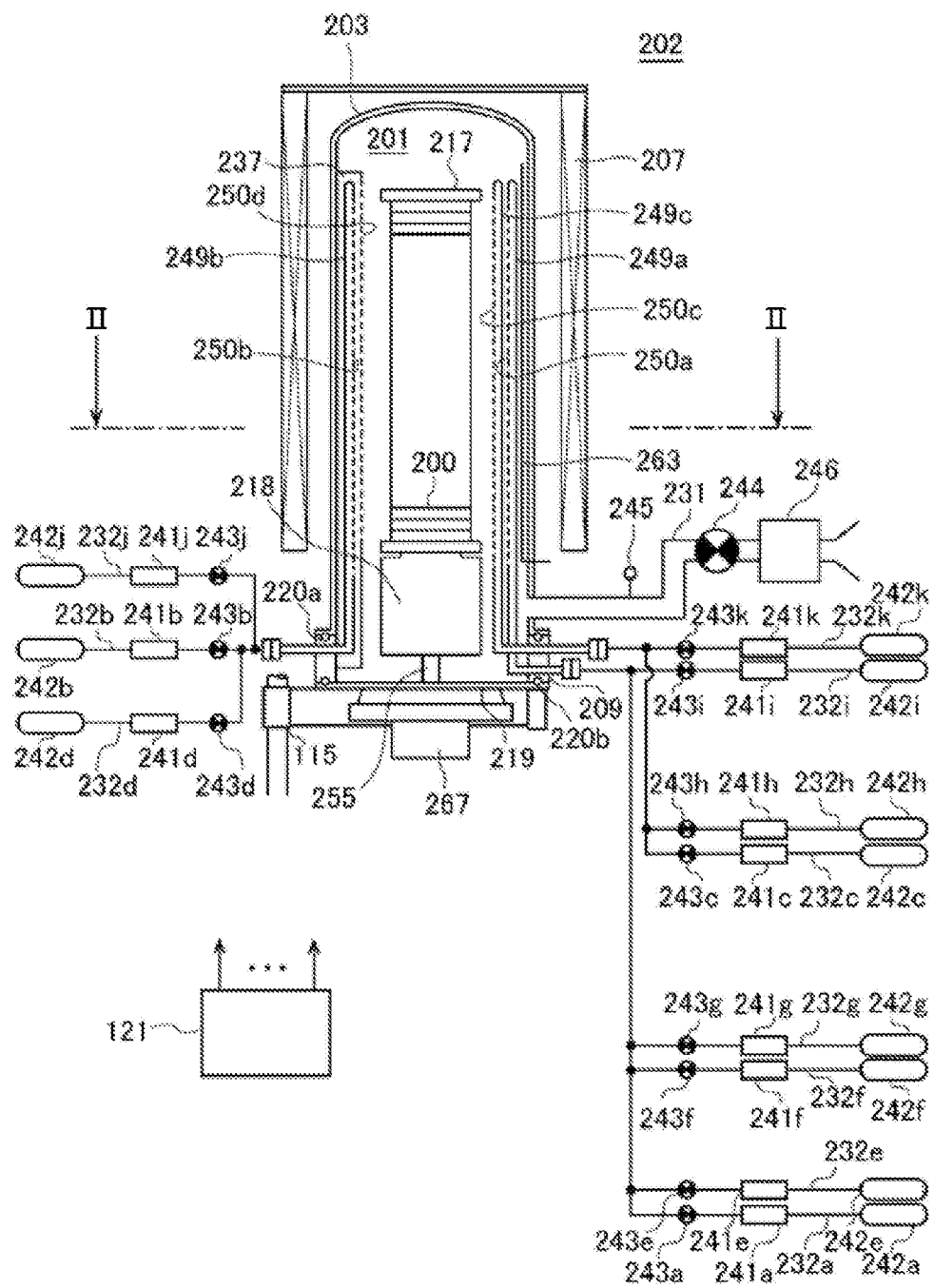
FIG. 1 is a schematic view illustrating a configuration of a vertical processing furnace of a substrate processing apparatus appropriately used in a first embodiment of the present disclosure, the processing furnace being shown in a longitudinal sectional view.
Figure 2:
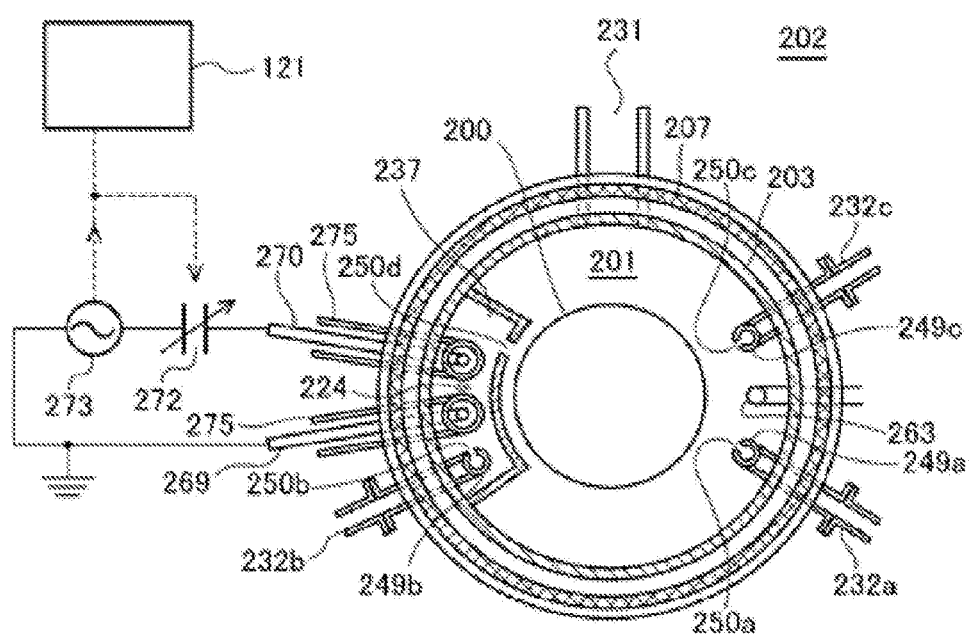
FIG. 2 is a schematic view illustrating a configuration of the vertical processing furnace of the substrate processing apparatus appropriately used in the first embodiment of the present disclosure, the processing furnace being shown in a sectional view taken along line II-II in FIG. 1.

Hereinafter, a first embodiment of the present disclosure will now be described with reference to the drawings.
(1) Overall Configuration of Substrate Processing Apparatus FIG. 1 is a schematic view illustrating a configuration of a vertical processing furnace 202 of a substrate processing apparatus appropriately used in this embodiment, the processing furnace 202 being shown in a longitudinal sectional view. FIG. 2 is a schematic view illustrating a configuration of the vertical processing furnace 202 of the substrate processing apparatus appropriately used in this embodiment, the processing furnace 202 being shown in a sectional view taken along line II-II in FIG. 1.

As shown in FIG. 1, the processing furnace 202 includes a heater 207 as a heating unit (heating mechanism). The heater 207 has a cylindrical shape and is supported by a heater base (not shown) as a support plate so as to be vertically installed. The heater 207 also acts as an activating mechanism (exciting unit) to activate (excite) gas by heat, as will be described later.

A reaction tube 203 is disposed inside the heater 207 in a concentric form along the heater 207. The reaction tube 203 is made of a heat resistant material such as quartz ($SiO_2$) or silicon carbide (SiC), and has a cylindrical shape with its upper end closed and its lower end opened. A manifold (inlet flange) 209 is disposed below the reaction tube 203 in a concentric form along the reaction tube 203. The manifold 209 is made of, for example, metal such as stainless steel, and is formed in a cylindrical shape with its upper and lower ends opened. The upper end of the manifold 209 is caught and coupled to the lower end of the reaction tube 203 and is configured to support the reaction tube 203. In addition, an O-ring 220a as a seal member is installed between the manifold 209 and the reaction tube 203. As the manifold 209 is supported by the heater base, the reaction tube 203 is in a vertical installation state. Mostly, a process vessel (reaction vessel) is configured with the reaction tube 203 and the manifold 209. A process chamber 201 is defined in a hollow cylindrical portion of the process vessel. The process chamber 201 is configured to accommodate a plurality of wafers 200 as substrates. The wafers 200 are horizontally stacked in multiple stages to be aligned in a vertical direction in a boat 217, which will be described later.

A first nozzle 249a, a second nozzle 249b and a third nozzle 249c are installed in the process chamber 201 to penetrate through a sidewall of the manifold 209. The first nozzle 249a, the second nozzle 249b and the third nozzle 249c are respectively connected to a first precursor gas supply pipe 232a, a first oxidizing gas supply pipe 232b and a first catalytic gas supply pipe 232c. In addition, a plurality of precursor gas supply pipes 232e, 232f and 232g are connected to the first precursor gas supply pipe 232a. Also, a second oxidizing gas supply pipe 232d is connected to the first oxidizing gas supply pipe 232b. A second catalytic gas supply pipe 232h is also connected to the first catalytic gas supply pipe 232c. As described above, the three nozzles 249a to 249c and the plurality of gas supply pipes 232a to 232h are installed at the reaction tube 203, and thus, a plurality of types of gases can be supplied into the process chamber 201.

An $(SiCl_3)_2CH_2$ (BTCSM) gas supply source 242a, for example, as a first precursor gas supply source, an MFC (Mass Flow Controller) 241a, which is a flow rate controller (flow rate control part), and a valve 243a, which is an opening/closing valve, are sequentially installed in the first precursor gas supply pipe 232a in this order from an upstream direction. In addition, a second precursor gas supply pipe 232e is connected to the first precursor gas supply pipe 232a at a downstream side of the valve 243a. A $(CH_3)_2Si_2Cl_4$ (TCDMDS) gas supply source 242e, for example, as a second precursor gas supply source, an MFC 241e, which is a flow rate controller (flow rate control part), and a valve 243e, which is an opening/closing valve, are sequentially installed in the second precursor gas supply pipe 232e in this order from an upstream direction. A third precursor gas supply pipe 232f is connected to the first precursor gas supply pipe 232a at a downstream side of a junction of the first precursor gas supply pipe 232a and the second precursor gas supply pipe 232e. An $Si_2Cl_6$ (HCDS) gas supply source 242f, for example, as a third precursor gas supply source, an MFC 241f, which is a flow rate controller (flow rate control unit), and a valve 243f, which is an opening/closing valve, are sequentially installed in the third precursor gas supply pipe 232f in this order from an upstream direction. A fourth precursor gas supply pipe 232g is connected to the first precursor gas supply pipe 232a at a downstream side of a junction of the first precursor gas supply pipe 232a and the third precursor gas supply pipe 232f. An $Si[N(C_2H_5)_2]_2H_2$ (BDEAS) gas supply source 242g, for example, as a fourth precursor gas supply source, an MFC 241g, which is a flow rate controller (flow rate control unit), and a valve 243g, which is an opening/closing valve, are sequentially installed in the fourth precursor gas supply pipe 232g in this order from an upstream direction. Also, a first inert gas supply pipe 232i is connected to the first precursor gas supply pipe 232a at a downstream side of a junction of the first precursor gas supply pipe 232a and the fourth precursor gas supply pipe 232g. An $N_2$ gas supply source 242i, for example, as a first inert gas supply source, an MFC 241i, which is a flow rate controller (flow rate control unit), and a valve 243i, which is an opening/closing valve, are sequentially installed in the first inert gas supply pipe 232i in this order from an upstream direction.

In addition, the above-described first nozzle 249a is connected to a leading end portion of the first precursor gas supply pipe 232a. As shown in FIG. 2, the first nozzle 249a is installed in a circular arc-shaped space between an inner wall of the reaction tube 203 and the wafers 200. The first nozzle 249a is vertically disposed along the inner wall of the reaction tube 203 to rise upward in a stacking direction of the wafers 200. That is, the first nozzle 249a is installed at a side of a wafer arrangement region, in which the wafers 200 are arranged. The first nozzle 249a is configured as an L-shaped long nozzle, and has its horizontal portion installed to penetrate through a sidewall of the manifold 209 and its vertical portion installed to rise from one end portion of the wafer arrangement region toward the other end portion thereof. A plurality of gas supply holes 250a through which gas is supplied is formed in a side surface of the first nozzle 249a. As shown in FIG. 2, the gas supply holes 250a are opened toward a center of the reaction tube 203 to supply gas toward the wafers 200. The gas supply holes 250a are formed in a plural number from a lower portion to an upper portion of the reaction tube 203. The gas supply holes 250a have the same opening area and are formed at an equal pitch.

A precursor gas supply system is mainly configured with the precursor gas supply pipes 232a, 232e, 232f and 232g, the MFCs 241a, 241e, 241f and 241g, and the valves 243a, 243e, 243f and 243g. The first nozzle 249a, the BTCSM gas supply source 242a, the TCDMDS gas supply source 242e, the HCDS gas supply source 242f, and the BDEAS gas supply source 242g may also be included in the precursor gas supply system. In addition, a first inert gas supply system is mainly configured with the first inert gas supply pipe 232i, the MFC 241i, and the valve 243i. Also, the $N_2$ gas supply source 242i may be included in the first inert gas supply system. The first inert gas supply system also functions as a purge gas supply system.

The precursor gas supply system may also be an assembly of a plurality of supply lines (supply system) for respectively supplying a plurality of types of precursor gases having different molecular structures. That is, the precursor gas supply system may be an assembly of a BTCSM gas supply line mainly configured with the first precursor gas supply pipe 232a, the MFC 241a, and the valve 243a, a TCDMDS gas supply line mainly configured with the second precursor gas supply pipe 232e, the MFC 241e, and the valve 243e, a HCDS gas supply line mainly configured with the third precursor gas supply pipe 232f, the MFC 241f and the valve 243f, and a BDEAS gas supply line mainly configured with the fourth precursor gas supply pipe 232g, the MFC 241g, and the valve 243g. Here, the first nozzle 249a or each corresponding precursor gas supply source 242a, 242e, 242f or 242g may be included in each supply line.

An $H_2O$ gas supply source 242b, for example, as a first oxidizing gas supply source, an MFC 241b, which is a flow rate controller (flow rate control part), and a valve 243b, which is an opening/closing valve, are sequentially installed in the first oxidizing gas supply pipe 232b in this order from an upstream direction. In addition, a second oxidizing gas supply pipe 232d is connected to the first oxidizing gas supply pipe 232b at a downstream side of the valve 243b. An $O_2$ gas supply source 242d, for example, as a second oxidizing gas supply source, an MFC 241d, which is a flow rate controller (flow rate control part), and a valve 243d, which is an opening/closing valve, are sequentially installed in the second oxidizing gas supply pipe 232d in this order from an upstream direction. A second inert gas supply pipe 232j is connected to the first oxidizing gas supply pipe 232b at a downstream side of a junction of the first oxidizing gas supply pipe 232b and the second oxidizing gas supply pipe 232d. A $N_2$ gas supply source 242j, for example, as a second inert gas supply source, an MFC 241j, which is a flow rate controller (flow rate control unit), and a valve 243j, which is an opening/closing valve, are sequentially installed in the second inert gas supply pipe 232j in this order from an upstream direction. In addition, the above-described second nozzle 249b is connected to a leading end portion of the first oxidizing gas supply pipe 232b. The second nozzle 249b is installed inside a buffer chamber 237 that is a gas diffusion space.

As shown in FIG. 2, the buffer chamber 237 is installed in an arc-shaped space between the inner wall of the reaction tube 203 and the wafers 200. The buffer chamber 237 is disposed from the bottom to the top along the inner wall of the reaction tube 203 in the stacking direction of the wafers 200. That is, the buffer chamber 237 is installed at the side of the wafer arrangement region, in which the wafers 200 are arranged. A plurality of gas supply holes 250d through which gas is supplied is formed in an end portion of a wall of the buffer chamber 237 adjacent to the wafers 200. The gas supply holes 250d are opened toward the center of the reaction tube 203 to supply gas toward the wafers 200. The gas supply holes 250d are formed in a plural number from the lower portion to the upper portion of the reaction tube 203. The gas supply holes 250d have the same opening area and are formed at an equal opening pitch.

As shown in FIG. 2, the second nozzle 249b is installed along the inner wall of the reaction tube 203 to rise upward in the stacking direction of the wafers 200 in an end portion of the buffer chamber 237 opposite to the end portion thereof in which the gas supply holes 250d is formed. That is, the second nozzle 249b is installed at the side of the wafer arrangement region, in which the wafers 200 are arranged. The second nozzle 249b is configured as an L-shaped long nozzle and has its horizontal portion installed to penetrate through the sidewall of the manifold 209 and its vertical portion installed to rise from one end portion of the wafer arrangement region toward the other end portion thereof. A plurality of gas supply holes 250b through which gas is supplied is formed in a side surface of the second nozzle 249b. As shown in FIG. 2, the gas supply holes 250b are opened toward the center of the buffer chamber 237. The gas supply holes 250b are formed in a plural number from the lower portion to the upper portion of the reaction tube 203 in the same way as the gas supply holes 250*d* of the buffer chamber 237. The plurality of gas supply holes 250*b* may have the same opening area and the same opening pitch from an upstream side (lower portion) of the reaction tube 203 to an downstream side (upper portion) of the reaction tube 203 when a pressure difference between the interior of the buffer chamber 237 and the interior of the process chamber 201 is small. However, when the pressure difference is large, the opening area of each gas supply hole 250*b* may be set larger and the opening pitch of each gas supply hole 250*b* may be set smaller at the downstream side than the upstream side of the reaction tube 203.

In the embodiment, by adjusting the opening area or opening pitch of each gas supply hole 250*b* of the second nozzle 249*b* from the upstream side to the downstream side as described above, gases may be ejected at an almost same flow rate from the respective gas supply holes 250*b* despite a flow velocity difference. In addition, the gases ejected from the respective gas supply holes 250*b* are first introduced into the buffer chamber 237, and flow velocities of the gases become uniform in the buffer chamber 237. That is, the gases ejected from the respective gas supply holes 250*b* of the second nozzle 249*b* into the buffer chamber 237 are mitigated in particle velocity of the respective gases in the buffer chamber 237, and then are ejected from the respective gas supply holes 250*d* of the buffer chamber 237 into the process chamber 201. Therefore, the gases ejected from the respective gas supply holes 250*b* of the second nozzle 249*b* into the buffer chamber 237 have a uniform flow rate and flow velocity when the gases are ejected from the respective gas supply holes 250*d* of the buffer chamber 237 into the process chamber 201.

An oxidizing gas supply system is mainly configured with the oxidizing gas supply pipes 232*b* and 232*d*, the MFCs 241*b* and 241*d*, and the valves 243*b* and 243*d*. Also, the second nozzle 249*b*, the buffer chamber 237, the $H_2O$ gas supply source 242*b* and the $O_2$ gas supply source 242*d* may be included in the oxidizing gas supply system. In addition, a second inert gas supply system is mainly configured with the second inert gas supply pipe 232*j*, the MFC 241*j*, and the valve 243*j*. The $N_2$ gas supply source 242*j* may also be included in the second inert gas supply system. The second inert gas supply system also functions as a purge gas supply system.

The oxidizing gas supply system may also be an assembly of a plurality of supply lines (supply system) for respectively supplying a plurality of types of oxidizing gases having different molecular structures. That is, the oxidizing gas supply system may be an assembly of an $H_2O$ gas supply line mainly configured with the first oxidizing gas supply pipe 232*b*, the MFC 241*b*, and the valve 243*b*, and an $O_2$ gas supply line mainly configured with the second oxidizing gas supply pipe 232*d*, the MFC 241*d*, and the valve 243*d*. Here, the second nozzle 249*b*, the buffer chamber 237, or each corresponding oxidizing gas supply source 242*b* or 242*d* may be included in each supply line.

A $C_5H_5N$ (pyridine) gas supply source 242*c*, for example, as a first catalytic gas supply source, an MFC 241*c*, which is a flow rate controller (flow rate control part), and a valve 243*c*, which is an opening/closing valve, are sequentially installed in the first catalytic gas supply pipe 232*c* in this order from an upstream direction. In addition, a second catalytic gas supply pipe 232*h* is connected to the first catalytic gas supply pipe 232*c* at a downstream side of the valve 243*c*. A $(C_2H_5)_3N$ (TEA) gas supply source 242*h*, for example, as a second catalytic gas supply source, an MFC 241*h*, which is a flow rate controller (flow rate control part), and a valve 243*h*, which is an opening/closing valve, are sequentially installed in the second catalytic gas supply pipe 232*h* in this order from an upstream direction. In addition, a third inert gas supply pipe 232*k* is connected to the first catalytic gas supply pipe 232*c* at a downstream side of a junction of the first catalytic gas supply pipe 232*c* and the second catalytic gas supply pipe 232*h*. A $N_2$ gas supply source 242*k*, for example, as a third inert gas supply source, an MFC 241*k*, which is a flow rate controller (flow rate control unit), and a valve 243*k*, which is an opening/closing valve, are sequentially installed in the third inert gas supply pipe 232*k* in this order from an upstream direction.

In addition, the above-described third nozzle 249*c* is connected to a leading end portion of the first catalytic gas supply pipe 232*c*. As shown in FIG. 2, the third nozzle 249*c* is installed in a circular arc-shaped space between an inner wall of the reaction tube 203 and the wafers 200. The third nozzle 249*c* is vertically disposed along the inner wall of the reaction tube 203 to rise upward in a stacking direction of the wafers 200. That is, the third nozzle 249*c* is installed at a side of a wafer arrangement region, in which the wafers 200 are arranged. The third nozzle 249*c* is configured as an L-shaped long nozzle, and has its horizontal portion installed to penetrate through a sidewall of the manifold 209 and its vertical portion installed to rise from one end portion of the wafer arrangement region toward the other end portion thereof. A plurality of gas supply holes 250*c* through which gas is supplied is formed in a side surface of the third nozzle 249*c*. As shown in FIG. 2, the gas supply holes 250*c* are opened toward a center of the reaction tube 203 to supply gas toward the wafers 200. The gas supply holes 250*c* are formed in a plural number from a lower portion to an upper portion of the reaction tube 203. The gas supply holes 250*c* have the same opening area and formed at an equal opening pitch.

A catalytic gas supply system is mainly configured with the catalytic gas supply pipes 232*c* and 232*h*, the MFCs 241*c* and 241*h*, and the valves 243*c* and 243*h*. The third nozzle 249*c*, the pyridine gas supply source 242*c*, and the TEA gas supply source 242*h* may also be included in the catalytic gas supply system. In addition, a third inert gas supply system is mainly configured with the third inert gas supply pipe 232*k*, the MFC 241*k*, and the valve 243*k*. In addition, the $N_2$ gas supply source 242*k* may also be included in the third inert gas supply system. The third inert gas supply system also functions as a purge gas supply system.

The catalytic gas supply system may also be an assembly of a plurality of supply lines (supply system) for respectively supplying a plurality of types of catalytic gases having different molecular structures. That is, the catalytic gas supply system may be an assembly of a pyridine gas supply line mainly configured with the first catalytic gas supply pipe 232*c*, the MFC 241*c*, and the valve 243*c*, and a TEA gas supply line mainly configured with the second catalytic gas supply pipe 232*h*, the MFC 241*h*, and the valve 243*h*. Here, the third nozzle 249*c* or each corresponding catalytic gas supply source 242*c* or 242*h* may be included in each supply line.

In the method of supplying gas according to the embodiment, the gas may be transferred through the nozzles 249*a*, 249*b* and 249*c* and the buffer chamber 237 disposed in an arc-shaped longitudinal space defined by the inner wall of the reaction tube 203 and end portions of the stacked wafers 200. The gas is first ejected into the reaction tube 203 near the wafers 200 through the gas supply holes 250*a*, 250*b*, 250c and 250d opened in the nozzles 249a, 249b and 249c and the buffer chamber 237, respectively. Thus, a main flow of the gas in the reaction tube 203 follows a direction parallel to surfaces of the wafers 200, i.e., the horizontal direction. With this configuration, the gas can be uniformly supplied to the respective wafers 200, and thus, the film thickness of a film formed on each of the wafers 200 can be uniform. In addition, a residual gas after the reaction flows toward an exhaust port, i.e., the exhaust pipe 231, but a flow direction of the residual gas is not limited to the vertical direction but may be appropriately adjusted by a position of the exhaust port.

A chlorosilane-based precursor gas containing a methylene group, for example, which is a precursor gas containing Si, a methylene group as an alkylene group and a chloro group as a halogen group, as a precursor gas containing silicon (Si), carbon (C) and a halogen element (fluorine (F), chlorine (Cl), bromine (Br) or the like) and having an Si—C bonding, is supplied from the first precursor gas supply pipe 232a into the process chamber 201 through the MFC 241a, the valve 243a and the first nozzle 249a. Here, the chlorosilane-based precursor gas containing a methylene group is a silane-based precursor gas containing a methylene group and a chloro group, or a precursor gas at least containing Si, a methylene group containing C, and Cl as a halogen element. The chlorosilane-based precursor gas containing a methylene group supplied from the first precursor gas supply pipe 232a may include, for example, methylenebis(trichlorosilane), i.e., bis(trichlorosilyl)methane [(SiCl$_3$)$_2$CH$_2$, abbreviation: BTCSM] gas.

Figure 12A:
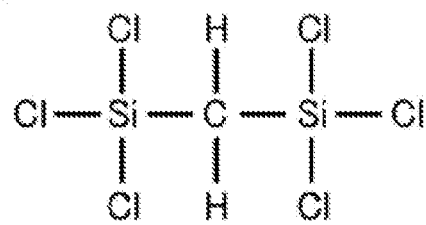
FIGS. 12A to 12F are views illustrating chemical structural formulas of various silanes used as a precursor gas, FIGS. 12A to 12F showing chemical structural formulas of BTCSM, BTCSE, TCDMDS, DCTMDS, HCDS and BDEAS, respectively.

As shown in FIG. 12A, the BTCSM contains a methylene group as an alkylene group in its chemical structural formula (In one molecule). The methylene group contained in the BTCSM has two bonding electrons each bonded to Si to form an Si—C—Si bonding. The Si—C bonding contained in the precursor gas is a part of the Si—C—Si bonding, for example, contained in the BTCSM, and the methylene group contained in the BTCSM contains C constituting the Si—C bonding.

Also, the precursor gas containing Si, C and a halogen element and having an Si—C bonding includes, for example, a chlorosilane-based precursor gas containing an ethylene group, which is a precursor gas containing Si, an ethylene group as an alkylene group, and a chloro group as a halogen group. The chlorosilane-based precursor gas containing an ethylene group may include, for example, ethylenebis(trichlorosilane), i.e., 1,2-bis(trichlorosilyl)ethane [(SiCl$_3$)$_2$C$_2$H$_4$, abbreviation: BTCSE] gas or the like.

Figure 12B:
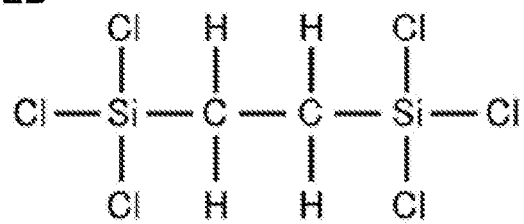

As shown in FIG. 12B, the BTCSE contains an ethylene group as an alkylene group in its chemical structural formula (In one molecule). The ethylene group contained in the BTCSE has two bonding electrons each bonded to Si to form an Si—C—C—Si bonding. The Si—C bonding contained in the precursor gas is a part of the Si—C—C—Si bonding, for example, contained in the BTCSE, and the ethylene group contained in the BTCSE contains C constituting the Si—C bonding.

Here, the alkylene group is a functional group in which two hydrogen (H) atoms are removed from a chain-like saturated hydrocarbon (alkane) represented by a general formula C$_n$H$_{2n+2}$, and is an assembly of atoms represented by a general formula C$_n$H$_{2n}$. The alkylene group includes a propylene group, a butylene group, or the like, in addition to the methylene group or the ethylene group described above as an example. As described above, the precursor gas containing Si, C and a halogen element and having an Si—C bonding includes an alkylenehalosilane-based precursor gas containing Si, an alkylene group and a halogen element. The alkylenehalosilane-based precursor gas is a halosilane-based precursor gas containing an alkylene group, and may be referred to as a gas having, for example, a structure in which an alkylene group is introduced between bonded Si and Si in a halosilane-based precursor gas while many halogen elements are bonded to bonding electrons of Si. The alkylenehalosilane-based precursor gas includes the BTCSM gas, the BTCSE gas, and the like.

A chlorosilane-based precursor gas containing a methyl group, for example, which is a precursor gas containing Si, a methyl group as an alkyl group, and a chloro group as a halogen group, as a precursor gas containing Si, C and a halogen element and having an Si—C bonding, is supplied from the second precursor gas supply pipe 232e into the process chamber 201 through the MFC 241e, the valve 243e, and the first nozzle 249a. Here, the chlorosilane-based precursor gas containing a methyl group is a silane-based precursor gas containing a methyl group and a chloro group, or a precursor gas at least containing Si, a methyl group containing C, and Cl as a halogen element. The chlorosilane-based precursor gas containing a methyl group supplied from the second precursor gas supply pipe 232e may include, for example, 1,1,2,2-tetrachloro-1,2-dimethyldisilane [(CH$_3$)$_2$Si$_2$Cl$_4$, abbreviation: TCDMDS] gas.

Figure 12C:
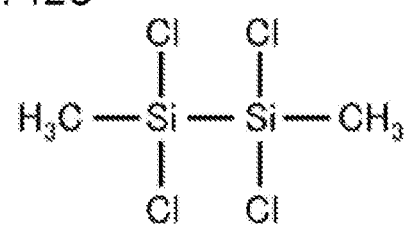

As shown in FIG. 12C, the TCDMDS contains two methyl groups as alkyl groups in its chemical structural formula (In one molecule). The two methyl groups contained in the TCDMDS have bonding electrons each bonded to Si to form an Si—C bonding. The Si—C bonding contained in the precursor gas is, for example, the Si—C bonding contained in the TCDMDS, and each of the two methyl groups contained in the TCDMDS contains C constituting the Si—C bonding.

In addition, the chlorosilane-based precursor gas containing a methyl group includes a precursor gas different from the TCDMDS gas. The other chlorosilane-based precursor gas containing a methyl group may include, for example, 1,2-dichloro-1,1,2,2-tetramethyldisilane [(CH$_3$)$_4$Si$_2$Cl$_2$, abbreviation: DCTMDS] gas and the like.

Figure 12D:
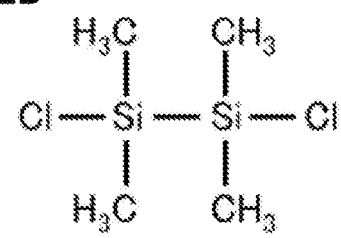

As shown in FIG. 12D, the DCTMDS contains four methyl groups as alkyl groups in its chemical structural formula (In one molecule). The four methyl groups contained in the DCTMDS have bonding electrons each bonded to Si to form an Si—C bonding. The Si—C bonding contained in the precursor gas is, for example, the Si—C bonding contained in the DCTMDS, and each of the four methyl groups contained in the DCTMDS contains C constituting the Si—C bonding.

Here, the alkyl group is a functional group in which one H atom is removed from a chain-like saturated hydrocarbon (alkane) represented by a general formula C$_n$H$_{2n+2}$, and is an assembly of atoms represented by a general formula C$_n$H$_{2n+1}$. The alkyl group includes an ethyl group, a propyl group, a butyl group, and the like, in addition to the methyl group described above as an example. As described above, the precursor gas containing Si, C and a halogen element and having an Si—C bonding includes an alkylhalosilane-based precursor gas containing Si, an alkyl group and a halogen element. The alkylhalosilane-based precursor gas is a halosilane-based precursor gas containing an alkyl group, and may also be referred to as a gas having a structure in which some halogen groups of a halosilane-based precursor gas are substituted by alkyl groups. The alkylhalosilane-based precursor gas includes the TCDMDS gas, the DCTMDS gas, and the like.

A chlorosilane-based precursor gas, for example, which is a precursor gas containing Si and a chloro group as a halogen group, as a precursor gas containing silicon (Si) and a halogen element, is supplied from the third precursor gas supply pipe 232f into the process chamber 201 through the MFC 241f, the valve 243f, and the first nozzle 249a. Here, the chlorosilane-based precursor gas is a silane-based precursor gas containing a chloro group, or a precursor gas at least containing Si and Cl as a halogen element. That is, the chlorosilane-based precursor described here may also be one of halides. The chlorosilane-based precursor gas supplied from the third precursor gas supply pipe 232f may include, for example, hexachlorodisilane ($Si_2Cl_6$, abbreviation: HCDS) gas.

Figure 12E:
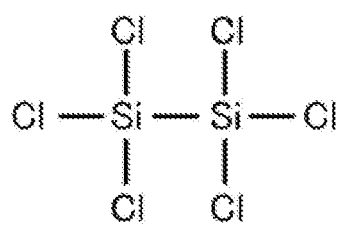

As shown in FIG. 12E, the HCDS includes Si and a chloro group in its chemical structural formula (In one molecule). In addition, the precursor gas containing Si and a halogen element may include, inorganic precursor gases such as tetrachlorosilane, i.e., silicontetrachloride ($SiCl_4$, abbreviation: STC) gas, trichlorosilane ($SiHCl_3$, abbreviation: TCS) gas, dichlorosilane ($SiH_2Cl_2$, abbreviation: DCS) gas, and monochlorosilane ($SiH_3Cl$, abbreviation: MCS) gas, in addition to the HCDS gas.

An aminosilane-based precursor gas, for example, which is a precursor gas containing Si and an amino group (amine group), as a precursor gas containing silicon (Si), carbon (C) and nitrogen (N) and having Si—N bonding, is supplied from the fourth precursor gas supply pipe 232g into the process chamber 201 through the MFC 241g, the valve 243g, and the first nozzle 249a. Here, the aminosilane-based precursor gas is a silane-based precursor gas containing an amino group, or a precursor gas at least containing Si and an amino group containing C and N. The aminosilane-based precursor gas supplied from the fourth precursor gas supply pipe 232g may include, for example, bis(diethylamino) silane ($Si[N(C_2H_5)_2]_2H_2$, abbreviation: BDEAS) gas.

Figure 12F:
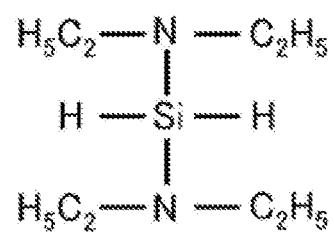
Figure 13B:
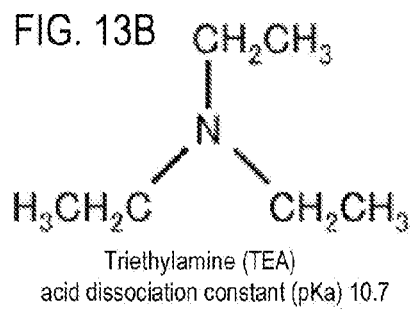
Figure 13C:
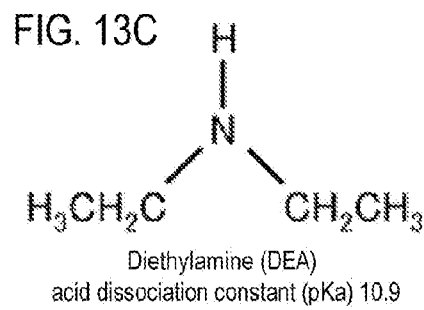
Figure 13D:
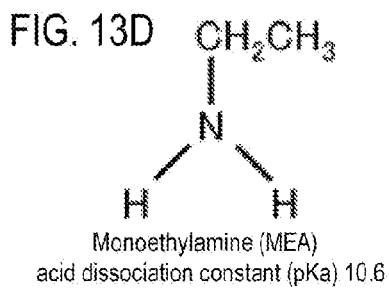
Figure 13E:
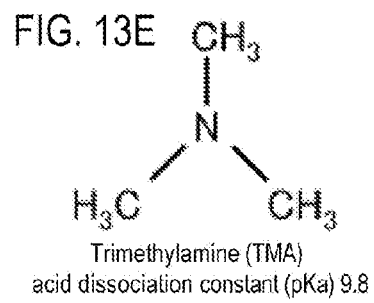
Figure 13F:
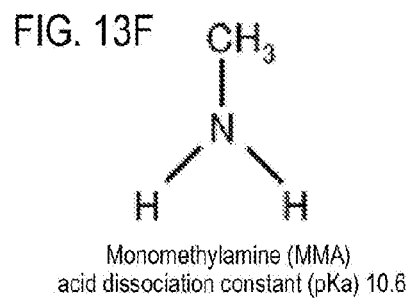

As shown in FIG. 12F, the BDEAS contains Si and an amino group in its chemical structural formula (In one molecule). In addition, the precursor gas containing Si, C and N and having Si—N bonding may include organic precursor gases such as tris(diethylamino)silane ($SiH[N(C_2H_5)_2]_3$, abbreviation: 3DEAS), tetrakis(diethylamino)silane ($Si[N(C_2H_5)_2]_4$, abbreviation: 4DEAS), tris(dimethylamino)silane ($Si[N(CH_3)_2]_3H$, abbreviation: 3DMAS) gas, and tetrakis(dimethylamino)silane ($Si[N(CH_3)_2]_4$, abbreviation: 4DMAS) gas, in addition to the BDEAS gas.

As described above, the plurality of supply lines constituting the precursor gas supply system are configured to respectively supply a plurality of types of precursor gases having different molecular structures. In addition, as described above, the respective precursor gases have different molecular structures, i.e., different chemical structural formula. The respective precursor gases may differ from one another in composition or component. The precursor gases having different molecular structures also differ from one another in chemical properties. Thus, as will be described later, by appropriately selecting the type of precursor gas according to a desired film forming process, thin films having a variety of composition ratios and film qualities can be formed with high versatility and high reproducibility in one substrate processing apparatus.

Here, the chlorosilane-based precursor gas supplied from each precursor gas supply pipe 232a, 232e or 232f refers to a chlorosilane-based precursor in a gaseous state, for example, a gas obtained by vaporizing a chlorosilane-based precursor that is a liquid state under normal temperature and pressure, a chlorosilane-based precursor that is gaseous state under normal temperature and pressure, or the like. Also, the aminosilane-based precursor gas supplied from the fourth precursor gas supply pipe 232g refers to an aminosilane-based precursor in a gaseous state, for example, a gas obtained by vaporizing an aminosilane-based precursor that is a liquid state under normal temperature and pressure, an aminosilane-based precursor that is gaseous state under normal temperature and pressure, or the like. In addition, when the term "precursor" is used herein, it may refer to "a liquid precursor in a liquid state," "a precursor gas in a gaseous state," or both of them. Therefore, when the term "chlorosilane-based precursor" is used herein, it may refer to "a chlorosilane-based precursor in a liquid state," "a chlorosilane-based precursor gas in a gaseous state," or both of them. Also, when the term "aminosilane-based precursor" is used herein, it may refer to "an aminosilane-based precursor in a liquid state," "an aminosilane-based precursor gas in a gaseous state," or both of them. In addition, when a liquid precursor in a liquid state under normal temperature and pressure such as BTCSM, BTCSE, TCDMDS, DCTMDS, HCDS, or BDEAS is used, the liquid precursor is vaporized by a vaporization system, such as a vaporizer or a bubbler, and supplied as a precursor gas (BTCSM gas, BTCSE gas, TCDMDS gas, DCTMDS gas, HCDS gas, or BDEAS gas).

A gas containing oxygen (O) (oxygen-containing gas), for example, as an oxidizing gas, is supplied from the first oxidizing gas supply pipe 232b into the process chamber 201 through the MFC 241b, the valve 243b, the second nozzle 249b, and the buffer chamber 237. The oxidizing gas supplied from the first oxidizing gas supply pipe 232b may include, for example, water vapor (an $H_2O$ gas). When supplying the $H_2O$ gas, it may be also possible to supply an oxygen ($O_2$) gas and a hydrogen ($H_2$) gas to an external combustion device (not shown) to generate an $H_2O$ gas and supply the generated $H_2O$ gas to the process chamber 201.

A gas containing O (oxygen-containing gas), for example, as an oxidizing gas, is supplied from the second oxidizing gas supply pipe 232d into the process chamber 201 through the MFC 241d, the valve 243d, the second nozzle 249b, and the buffer chamber 237. The oxidizing gas supplied from the second oxidizing gas supply pipe 232d may include, for example, oxygen ($O_2$) gas.

As described above, the plurality of supply lines constituting the oxidizing gas supply system are configured to respectively supply a plurality of types of oxidizing gases having different molecular structures. In addition, as described above, the respective oxidizing gases have different molecular structures, i.e., different chemical structural formulae. The respective oxidizing gases may differ from one another in composition or component. The oxidizing gases having different molecular structures also differ from one another in chemical properties. Thus, for example, by appropriately selecting the type of oxidizing gas according to a desired film forming process, thin films having a variety of composition ratios and film qualities can be formed with high versatility and high reproducibility in one substrate processing apparatus.

From the first catalytic gas supply pipe 232c, a catalytic gas, for example, an amine-based gas containing carbon (C), nitrogen (N) and hydrogen (H), is supplied into the process chamber 201 through the MFC 241c, the valve 243c and the third nozzle 249c. The catalytic gas weakens bonding strength of O—H bonding, which may exist on the surfaces of the wafers 200 and in the $H_2O$ gas through a catalytic action to accelerate decomposition of the precursor gases and the oxidation reaction by the $H_2O$ gas. The amine-based gas is gas containing amine in which at least one of hydrogen atoms of ammonia ($NH_3$) is substituted with a hydrocarbon group such as an alkyl group. As illustrated in FIGS. 13A to 13F, various amines used as a catalytic gas may contain N having lone pair electrons and have an acid dissociation constant (hereinafter, also referred to as "pKa") ranging from about 5 to 11, for example. Here, the acid dissociation constant (pKa) is one of indices quantitatively indicating the strength of acid, and denotes an equilibrium constant (Ka) in dissociation reaction emitting hydrogen ions from acid as a negative common logarithm. The amine-based gas includes a cyclic amine-based gas in which a hydrocarbon group has a cyclic shape or a chain-like amine-based gas in which a hydrocarbon group has a chain-like shape. As the amine-based gas supplied from the first catalytic gas supply pipe 232c, for example, a pyridine ($C_5H_5N$) gas, which is a cyclic amine-based gas, may be used. An amine-based gas containing carbon (C), nitrogen (N) and hydrogen (H), for example, as a catalytic gas which weakens bonding strength of O—H bonding that may exist on the surfaces of the wafers 200 and in the $H_2O$ gas by catalysis to promote decomposition of a precursor gas and also to promote an oxidation reaction with $H_2O$ gas, is supplied from the first catalytic gas supply pipe 232c into the process chamber 201 through the MFC 241c, the valve 243c, and the third nozzle 249c. Here, the amine-based gas is a gas containing an amine in which at least one of hydrogen atoms of ammonia ($NH_3$) is substituted by a hydrocarbon group such as an alkyl group. As shown in FIGS. 13A to 13F, a variety of amines used as the catalytic gas contains N, for example, with lone pair electrons, and has an acid dissociation constant (hereinafter, referred to as pKa) of 5 to 11 or so. Here, the acid dissociation constant (pKa) is one of indices representing a quantitative measure of the strength of an acid, and is represented by the negative common logarithm of an equilibrium constant, Ka, in a dissociative reaction in which hydrogen ions are emitted from acid. Such an amine-based gas includes a cyclic amine-based gas having hydrocarbon groups cycled or a chain-like amine-based gas having hydrocarbon groups chained. The amine-based gas supplied from the first catalytic gas supply pipe 232c may include, for example, a pyridine ($C_5H_5N$) gas, which is a cyclic amine-based gas.

As illustrated in FIG. 13A, the cyclic amine used as a catalytic gas includes, for example, aminopyridine ($C_5H_6N_2$, pKa=6.89), picoline ($C_6H_7N$, pKa=6.07), lutidine ($C_7H_9N$, pKa=6.96), piperazine ($C_4H_{10}N_2$, pKa=9.80), piperidine ($C_5H_{11}N$, pKa=11.12) and the like, in addition to pyridine ($C_5H_5N$, pKa=5.67). The cyclic amine may be a heterocyclic compound having a cyclic structure formed with a plurality of C and N, i.e., nitrogen-containing heterocyclic compound.

A catalytic gas having the same catalytic action as described above, for example, an amine-based gas containing C, N and H is supplied from the second catalytic gas supply pipe 232h into the process chamber 201 through the MFC 241h, the valve 243h, and the third nozzle 249c. As the amine-based gas supplied from the second catalytic gas supply pipe 232h, for example, a triethylamine (($C_2H_5)_3N$, abbreviation: TEA) gas, which is a chain-like amine-based gas, may be used.

As shown in FIGS. 13B to 13F along with pKa, the chain-like amine used as the amine-based catalytic gas includes, for example, diethylamine [($C_2H_5)_2NH$, abbreviation: DEA, pKa=10.9], monoethylamine [($C_2H_5)NH_2$, abbreviation: MEA, pKa=10.6], trimethylamine [($CH_3)_3N$, abbreviation: TMA, pKa=9.8], monomethylamine [($CH_3$)$NH_2$, abbreviation: MMA, pKa=10.6] and the like, in addition to the triethylamine [($C_2H_5)_3N$, abbreviation: TEA, pKa=10.7].

As described above, the plurality of supply lines constituting the catalytic gas supply system are configured to respectively supply a plurality of types of catalytic gases having different molecular structures. In addition, as described above, the respective catalytic gases have different molecular structures, i.e., different chemical structural formulae. The respective catalytic gases may differ from one another in composition or component. The catalytic gases having different molecular structures also differ from one another in chemical properties. Thus, as will be described later, by appropriately selecting the type of catalytic gas according to a desired film forming process, thin films having a variety of composition ratios and film qualities can be formed with high versatility and high reproducibility in one substrate processing apparatus.

The Nitrogen ($N_2$) gas, for example, as an inert gas, is supplied from the inert gas supply pipes 232i, 232j and 232k into the process chamber 201 through the MFCs 241i, 241j and 241k, the valves 243i, 243j and 243k, the gas supply pipes 232a, 232b and 232c, the nozzles 249a, 249b and 249c, and the buffer chamber 237, respectively.

In the buffer chamber 237, as illustrated in FIG. 2, a first rod-shaped electrode 269 that is a first electrode having an elongated structure and a second rod-shaped electrode 270 that is a second electrode having an elongated structure are disposed to span from the lower portion to the upper portion of the reaction tube 203 in the stacking direction of the wafers 200. Each of the first rod-shaped electrode 269 and the second rod-shaped electrode 270 is disposed in parallel to the second nozzle 249b. Each of the first rod-shaped electrode 269 and the second rod-shaped electrode 270 is covered with and protected by an electrode protection tube 275, which is a protection tube for protecting each electrode from an upper portion to a lower portion thereof. Any one of the first rod-shaped electrode 269 and the second rod-shaped electrode 270 is connected to a high-frequency power source 273 through a matching unit 272, and the other one is connected to a ground corresponding to a reference electric potential. By applying high-frequency (RF) power from the high-frequency power source 273 between the first rod-shaped electrode 269 and the second rod-shaped electrode 270 through the matching unit 272, plasma is generated in a plasma generation region 224 between the first rod-shaped electrode 269 and the second rod-shaped electrode 270. A plasma source as a plasma generator (plasma generating part) is mainly configured with the first rod-shaped electrode 269, the second rod-shaped electrode 270, and the electrode protection tubes 275. The matching unit 272 and the high-frequency power source 273 may also be included in the plasma source. Also, as will be described later, the plasma source functions as an activating mechanism (exciting part) that activates (excites) gas to plasma.

The electrode protection tube 275 has a structure in which each of the first rod-shaped electrode 269 and the second rod-shaped electrode 270 can be inserted into the buffer chamber 237 in a state where each of the first rod-shaped electrode 269 and the second rod-shaped electrode 270 is isolated from an internal atmosphere of the buffer chamber 237. Here, when an internal oxygen concentration in the electrode protection tube 275 is equal to an oxygen concentration in an ambient air (atmosphere), each of the first rod-shaped electrode 269 and the second rod-shaped electrode 270 inserted into the electrode protection tubes 275 is oxidized by the heat generated by the heater 207. Therefore, by charging the inside of the electrode protection tube 275 with an inert gas such as the $N_2$ gas, or by purging the inside of the electrode protection tube 275 with an inert gas such as the $N_2$ gas using an inert gas purging mechanism, the internal oxygen concentration in the electrode protection tube 275 decreases, thereby suppressing oxidation of the first rod-shaped electrode 269 or the second rod-shaped electrode 270.

The exhaust pipe 231 for exhausting an internal atmosphere of the process chamber 201 is installed at the reaction tube 203. A vacuum exhaust device, for example, a vacuum pump 246, is connected to the exhaust pipe 231 through a pressure sensor 245, which is a pressure detector (pressure detecting part) for detecting an internal pressure of the process chamber 201, and an APC (Auto Pressure Controller) valve 244, which is a pressure adjuster (pressure adjusting part). The APC valve 244 is configured to perform/stop vacuum exhaust in the process chamber 201 by opening/closing the valve with the actuated vacuum pump 246, and further to adjust the internal pressure of the process chamber 201 by adjusting a degree of the valve opening with the actuated vacuum pump 246. An exhaust system is mainly configured with the exhaust pipe 231, the APC valve 244, and the pressure sensor 245. Also, the vacuum pump 246 may be included in the exhaust system. The exhaust system is configured to adjust the degree of the valve opening of the APC valve 244 based on pressure information detected by the pressure sensor 245 while operating the vacuum pump 246 such that the internal pressure of the process chamber 201 is vacuum exhausted to a predetermined pressure (a vacuum level). In addition, the exhaust pipe 231 is not limited to being installed at the reaction tube 203 and may be installed at the manifold 209 like the respective nozzles 249a to 249c.

A seal cap 219, which functions as a furnace port cover configured to hermetically seal a lower end opening of the manifold 209, is installed under the manifold 209. The seal cap 219 is configured to contact the lower end of the manifold 209 from the below in the vertical direction. The seal cap 219, for example, may be formed of metal such as stainless steel and have a disc shape. An O-ring 220b, which is a seal member in contact with the lower end portion of the manifold 209, is installed at an upper surface of the seal cap 219. A rotary mechanism 267 configured to rotate the boat 217, which is a substrate holder to be described later, is installed below the seal cap 219. A rotary shaft 255 of the rotary mechanism 267 passes through the seal cap 219 to be connected to the boat 217. The rotary mechanism 267 is configured to rotate the wafers 200 by rotating the boat 217. The seal cap 219 is configured to move vertically by a boat elevator 115, which is an elevation mechanism vertically disposed at the outside of the reaction tube 203. The boat elevator 115 is configured to enable the boat 217 to be loaded into or unloaded from the process chamber 201 by elevating or lowering the seal cap 219. That is, the boat elevator 115 is configured as a transfer device (transfer mechanism) that transfers the boat 217 and the wafers 200 supported by the boat 217 into and out of the process chamber 201.

The boat 217, which is used as a substrate support, is made of a heat resistant material such as quartz or silicon carbide and is configured to support a plurality of the wafers 200 horizontally stacked in multiple stages with the centers of the wafers 200 concentrically aligned. In addition, a heat insulating member 218 formed of a heat resistant material such as quartz or silicon carbide is installed at a lower portion of the boat 217 and configured such that the heat from the heater 207 cannot be transferred to the seal cap 219. In addition, the heat insulating member 218 may be configured with a plurality of heat insulating plates formed of a heat resistant material such as quartz or silicon carbide, and a heat insulating plate holder configured to support the heat insulating plates in a horizontal posture in a multi-stage manner.

A temperature sensor 263, which is a temperature detector, is installed in the reaction tube 203. Based on temperature information detected by the temperature sensor 263, an electrical conduction state to the heater 207 is adjusted such that the interior of the process chamber 201 has a desired temperature distribution. The temperature sensor 263 is configured in an L-shape similar to the nozzles 249a to 249c and installed along the inner wall of the reaction tube 203.

Figure 3:
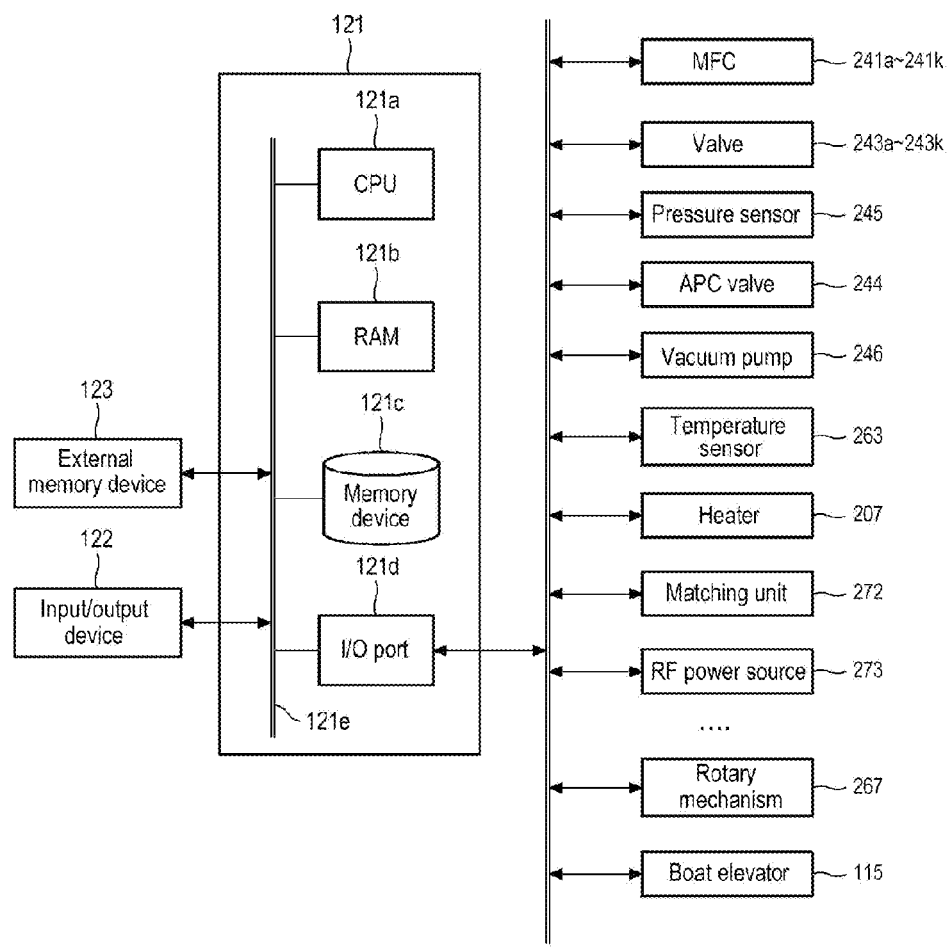
FIG. 3 is a schematic view illustrating a configuration of a controller of the substrate processing apparatus appropriately used in the first embodiment of the present disclosure.

As illustrated in FIG. 3, a controller 121, which is a control unit (control part), is configured as a computer including a CPU (Central Processing Unit) 121a, a RAM (Random Access Memory) 121b, a memory device 121c, and an I/O port 121d. The RAM 121b, the memory device 121c and the I/O port 121d are configured to exchange data with the CPU 121a via an internal bus 121e. An input/output device 122, for example, including a touch panel or the like, is connected to the controller 121.

The memory device 121c is configured with, for example, a flash memory, an HDD (Hard Disc Drive), or the like. A control program for controlling operations of the substrate processing apparatus or a process recipe, in which a sequence or condition for processing a substrate, such as for forming a thin film, which will be described later, is written, is readably stored in the memory device 121c. Also, the process recipe functions as a program for the controller 121 to execute each sequence in the substrate processing process, such as a thin film forming process described later, to obtain a predetermined result. Hereinafter, the process recipe or control program may be generally referred to as a program. Also, when the term "program" is used herein, it may include the case in which only the process recipe is included, the case in which only the control program is included, or the case in which both the process recipe and the control program are included. In addition, the RAM 121b is configured as a memory area (work area) in which a program or data read by the CPU 121a is temporarily stored.

The I/O port 121d is connected to the above-described MFCs 241a to 241k, the valves 243a to 243k, the pressure sensor 245, the APC valve 244, the vacuum pump 246, the temperature sensor 263, the heater 207, the matching unit 272, the high-frequency power source 273, the rotary mechanism 267, the boat elevator 115 and the like.

The CPU 121a is configured to read and execute the control program from the memory device 121c. According to an input of an operation command from the input/output device 122, the CPU 121a reads the process recipe from the memory device 121c. In addition, the CPU 121a is configured to control the flow rate controlling operation of various types of gases by the MFCs 241a to 241k, the opening/closing operation of the valves 243a to 243k, the opening/closing operation of the APC valve 244 and the pressure adjusting operation by the APC valve 244 based on the pressure sensor 245, the operation of starting and stopping the vacuum pump 246, the temperature adjusting operation of the heater 207 based on the temperature sensor 263, the rotation and rotation speed adjusting operation of the boat 217 by the rotary mechanism 267, the elevation operation of the boat 217 by the boat elevator 115, the impedance adjusting operation of the matching unit 272, the operation of supplying power by the high-frequency power source 273, and the like according to contents of the read process recipe.

Moreover, the controller 121 is not limited to being configured as a dedicated computer but may be configured as a general-purpose computer. For example, the controller 121 according to the embodiment may be configured with preparing an external memory device 123 (for example, a magnetic tape, a magnetic disc such as a flexible disc or a hard disc, an optical disc such as a CD or DVD, a magneto-optical disc such as an MO, a semiconductor memory such as a USB memory or a memory card), in which the program is stored, and installing the program on the general-purpose computer using the external memory device 123. Also, a means for supplying a program to a computer is not limited to the case in which the program is supplied through the external memory device 123. For example, the program may be supplied using a communication means such as the Internet or a dedicated line, rather than through the external memory device 123. Also, the memory device 121c or the external memory device 123 is configured as a non-transitory computer-readable recording medium. Hereinafter, these means for supplying the program will be simply referred to as "a recording medium." In addition, when the term "recording medium" is used herein, it may include a case in which only the memory device 121c is included, a case in which only the external memory device 123 is included, or a case in which both the memory device 121c and the external memory device 123 are included.

(2) Thin Film Forming Process

Next, an example of a sequence of forming a thin film on a substrate, which is one of the processes of manufacturing a semiconductor device by using the processing furnace 202 of the above-described substrate processing apparatus, will be described. In the following description, operations of the respective parts constituting the substrate processing apparatus are controlled by the controller 121.

In this embodiment, a thin film containing silicon (Si), oxygen (O) and carbon (C) is formed on the wafer 200 as a substrate by performing a cycle by a predetermined number of times, the cycle including: supplying a precursor gas containing silicon (Si), carbon (C) and a halogen element and having an Si—C bonding, and a catalytic gas to the wafer 200; and supplying an oxidizing gas and a catalytic gas to the wafer 200.

Each of the acts is performed under a non-plasma atmosphere.

Moreover, in this embodiment, in order to form a thin film having a composition ratio of a stoichiometric composition or of another predetermined composition ratio different from the stoichiometric composition, supply conditions of a plural type of gases containing a plurality of elements constituting the thin film to be formed are controlled. For example, the supply conditions are controlled such that at least one element of the plurality of elements constituting the thin film to be formed stoichiometrically exceeds another element. Hereinafter, an example of a sequence of forming a film while controlling a ratio of the plurality of elements constituting the thin film to be formed, i.e., a composition ratio of the thin film, will be described.

Figure 4:
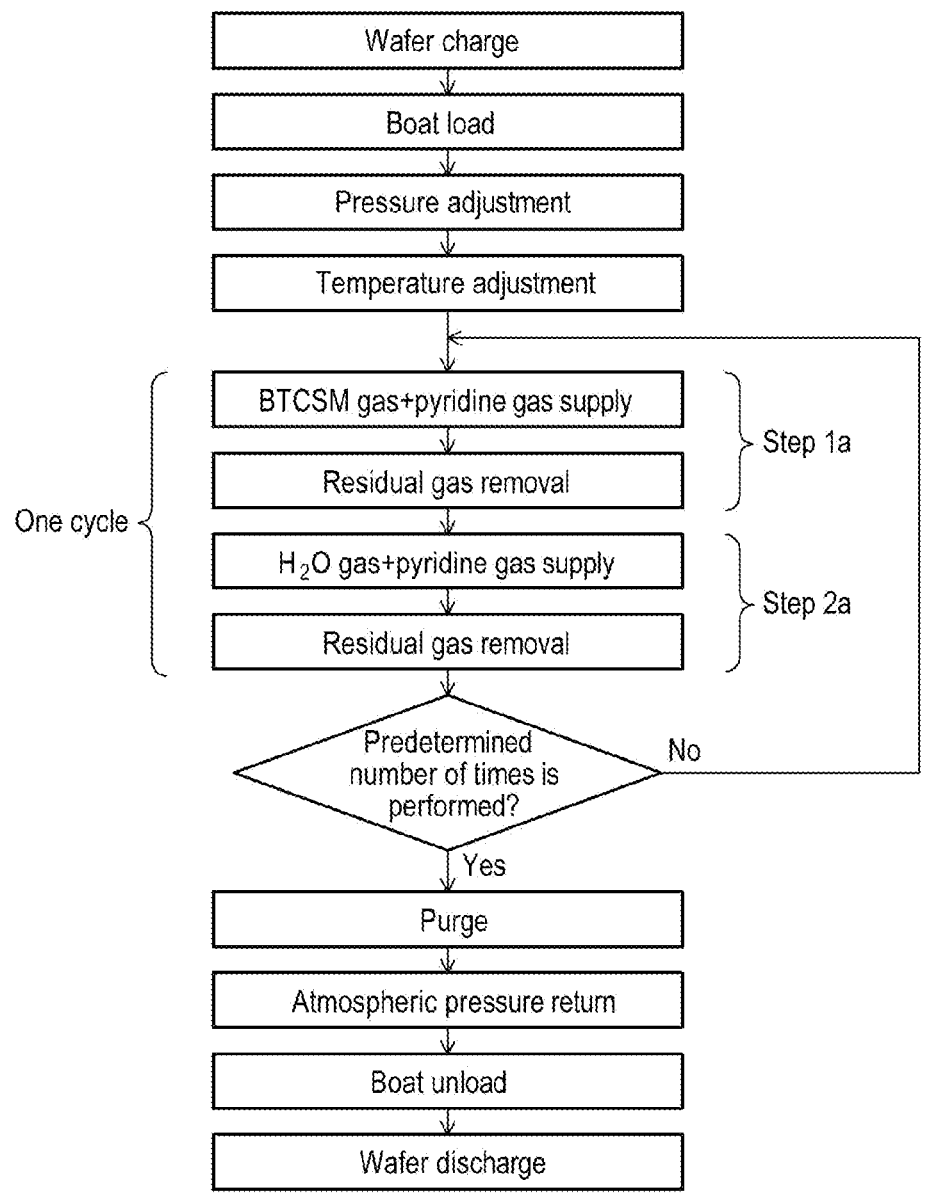
FIG. 4 is a flow chart illustrating a flow of film formation in a film forming sequence according to the first embodiment of the present disclosure.
Figure 5:
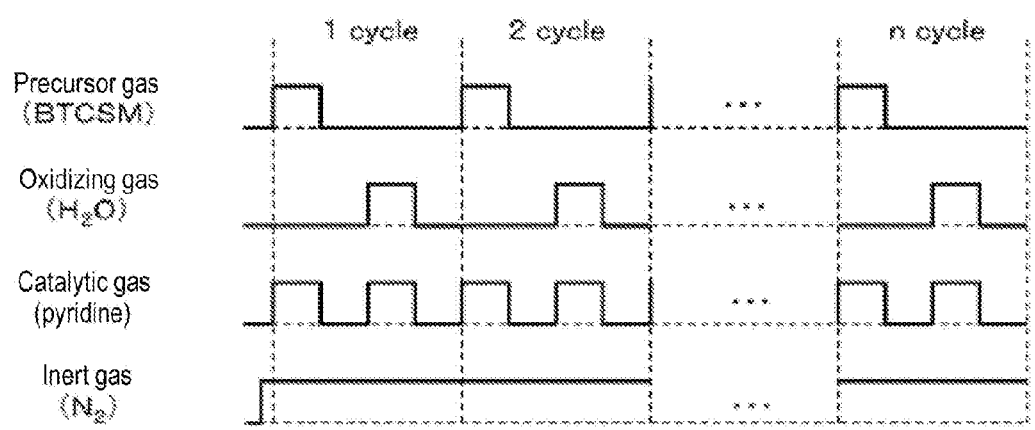
FIG. 5 is a view illustrating gas supply timings in the film forming sequence according to the first embodiment of the present disclosure.

Hereinafter, a film forming sequence of this embodiment will be described in detail with reference to FIGS. 4 and 5. FIG. 4 is a flow chart illustrating a flow of film formation in a film forming sequence according to this embodiment. FIG. 5 is a view illustrating gas supply timings in the film forming sequence according to the embodiment.

Here, an example of forming a silicon oxycarbide film (hereinafter, referred to as an SiOC film) as a thin film containing Si, O and C on a wafer 200 by performing a cycle a predetermined number of times (n times) will be described. The cycle includes: supplying a BTCSM gas as a precursor gas and a pyridine gas as a catalytic gas to the wafer 200; and supplying an $H_2O$ gas as an oxidizing gas and a pyridine gas as a catalytic gas to the wafer 200. The SiOC film may be an SiO film containing C or an SiC film doped (added) with C.

Moreover, when the term "wafer" is used herein, it may refer to "the wafer itself" or "the wafer and a laminated body (a collected body) of predetermined layers or films formed on the surface of the wafer" (i.e., the wafer including the predetermined layers or films formed on the surface may be referred to as a wafer). In addition, the phrase "a surface of a wafer" as used herein may refer to "a surface (an exposed surface) of a wafer itself" or "a surface of a predetermined layer or film formed on the wafer, i.e., the uppermost surface of the wafer, which is a laminated body."

Accordingly, "a predetermined gas is supplied to a wafer" may mean that "a predetermined gas is directly supplied to a surface (an exposed surface) of a wafer itself" or that "a predetermined gas is supplied to a layer or a film formed on a wafer, i.e., on the uppermost surface of a wafer as a laminated body." Also, "a predetermined layer (or film) is formed on a wafer" may mean that "a predetermined layer (or film) is directly formed on a surface (an exposed surface) of a wafer itself" or that "a predetermined layer (or film) is formed on a layer or a film formed on a wafer, i.e., on the uppermost surface of a wafer as a laminated body."

Moreover, the term "substrate" as used herein may be synonymous with the term "wafer," and in this case, the terms "wafer" and "substrate" may be used interchangeably in the above description.

(Wafer Charging and Boat Loading)

When the plurality of wafers 200 are charged on the boat 217 (wafer charging), as illustrated in FIG. 1, the boat 217 supporting the plurality of wafers 200 is raised by the boat elevator 115 to be loaded into the process chamber 201 (boat loading). In this state, the seal cap 219 seals the lower end of the manifold 209 via the O-ring 220b.

(Pressure Adjustment and Temperature Adjustment)

The pressure in the interior of the process chamber 201 is evacuated by the vacuum pump 246 to reach a desired pressure (vacuum level). Here, the internal pressure of the process chamber 201 is measured by the pressure sensor 245, and the APC valve 244 is feedback-controlled based on the measured pressure information (pressure adjustment). The vacuum pump 246 maintains a regular operation state at least until processing of the wafers 200 is terminated. Further, the wafers 200 within the process chamber 201 are heated by the heater 207 to a desired temperature. Here, electrical conduction state of the heater 207 is feedback-controlled based on the temperature information detected by the temperature sensor 263 such that the interior of the process chamber 201 reaches a desired temperature distribution (temperature adjustment). Heating of the interior of the process chamber 201 by the heater 207 is continuously performed at least until processing of the wafers 200 is terminated. However, which will be described later, when the processing of the wafers 200 is performed at room temperature, heating of the interior of the process chamber 201 by the heater 207 may not be performed. Thereafter, the boat 217 and wafers 200 begin to be rotated by the rotary mechanism 267 (wafer rotation). The rotation of the boat 217 and wafers 200 by the rotary mechanism 267 is continuously performed at least until processing of the wafers 200 is terminated.

(Process of Forming SiOC Film)

Next, the following two steps, i.e., Steps 1a and 2a, are sequentially executed.

[Step 1a]

(Supply of BTCSM Gas+Pyridine Gas)

The valve 243a of the first precursor gas supply pipe 232a is opened to flow a BTCSM gas into the first precursor gas supply pipe 232a. A flow rate of the BTCSM gas flowing into the first precursor gas supply pipe 232a is controlled by the MFC 241a. The flow-rate-controlled BTCSM gas is supplied into the process chamber 201 through the gas supply holes 250a of the first nozzle 249a, and exhausted through the exhaust pipe 231. In this way, the BTCSM gas is supplied to the wafer 200 (BTCSM gas supply). During the BTCSM gas supply, the valve 243i is opened to flow an inert gas such as $N_2$ gas into the first insert gas supply pipe 232i. A flow rate of the $N_2$ gas flowing into the first inert gas supply pipe 232i is controlled by the MFC 241i. The flow-rate-controlled $N_2$ gas is supplied together with the BTCSM gas into the process chamber 201, and exhausted through the exhaust pipe 231.

In addition, the valve 243c of the first catalytic gas supply pipe 232c is opened to flow a pyridine gas into the first catalytic gas supply pipe 232c. A flow rate of the pyridine gas flowing into the first catalytic gas supply pipe 232c is controlled by the MFC 241c. The flow-rate-controlled pyridine gas is supplied into the process chamber 201 through the gas supply holes 250c of the third nozzle 249c, and exhausted through the exhaust pipe 231. In this way, the pyridine gas is supplied to the wafer 200 (pyridine gas supply). During the pyridine gas supply, the valve 243k is opened to flow the inert gas such as $N_2$ gas into the third inert gas supply pipe 232k. A flow rate of the $N_2$ gas flowing into the third inert gas supply pipe 232k is controlled by the MFC 241k. The flow-rate-controlled N2 gas is supplied together with the pyridine gas into the process chamber 201, and exhausted through the exhaust pipe 231.

In this case, in order to prevent infiltration of the BTCSM gas and the pyridine gas into the buffer chamber 237 or the second nozzle 249b, the valve 243j is opened to flow $N_2$ gas into the second inert gas supply pipe 232j. The $N_2$ gas is supplied into the process chamber 201 through the first oxidizing gas supply pipe 232b, the second nozzle 249b and the buffer chamber 237, and exhausted through the exhaust pipe 231.

The APC valve 244 is appropriately controlled to set the internal pressure of the process chamber 201 to fall within a range of, for example, 1 to 13300 Pa. In some embodiments, the internal pressure of the process chamber 201 may range from 20 to 1330 Pa, for example, 1330 Pa. A supply flow rate of the BTCSM gas controlled by the MFC 241a ranges from 1 to 2000 sccm, for example. A supply flow rate of the pyridine gas controlled by the MFC 241c may be set so that the ratio of a supply flow rate (sccm) of the pyridine gas to a supply flow rate (sccm) of the pyridine gas falls within a range of, for example, 0.01 to 100, in some embodiments, 0.05 to 10. A supply flow rate of each of the $N_2$ gases controlled by the MFC 241i to 241k may fall within a range of, for example, 100 to 10000 sccm. A time duration for which the BTCSM gas and the pyridine gas are supplied to the wafer 200, i.e., a gas supply time (irradiation time), may, for example, fall within a range of 1 to 100 seconds, and in some embodiments, fall within a range of 5 to 30 seconds.

The temperature of the heater 207 may be set such that a temperature of the wafers 200 may fall within a range, for example, from room temperature to 200 degrees C., from room temperature to 150 degrees C., or from room temperature to 100 degrees C. In a case where a catalytic gas is not supplied during the BTCSM gas supply, if a temperature of the wafer 200 is lower than 250 degrees C., it may be difficult for BTCSM to be chemically adsorbed onto the wafer 200, resulting in a failure of obtaining a practical film formation rate. This problem, however, can be solved in this embodiment, because the pyridine gas is supplied as a catalytic gas although the temperature of the wafer 200 is lower than 250 degrees C. With the presence of the pyridine gas, the temperature of the wafer 200 may be equal to or lower than 200 degrees C., 150 degrees C. or 100 degrees C., thereby reducing the heat amount applied to the wafer 200 and desirably controlling the thermal budget of the wafer 200. Also, with the presence of the pyridine gas, BTCSM may be sufficiently adsorbed onto the wafer 200 at a temperature equal to or higher than room temperature, thereby obtaining a sufficient film formation rate. Thus, a temperature of the wafer 200 may fall within a range from room temperature to 200 degrees C., from room temperature to 150 degrees C., or from room temperature to 100 degrees C.

Under the foregoing conditions, the BTCSM gas is supplied to the wafer 200 to form a silicon-containing layer (Si-containing layer) containing C and Cl and having a thickness from below one atomic layer to several atomic layers, for example, as a first layer on the wafer 200 (the base film of the surface). The Si-containing layer containing C and Cl may be a silicon layer (Si layer) containing C and Cl, may be an adsorption layer of the BTCSM gas, or may include the both.

Here, the Si layer containing C and Cl generally refers to a continuous layer or a discontinuous layer formed of Si and containing C and Cl, or a silicon thin film (Si thin film) containing C and Cl formed by overlapping these layers. In some cases, a continuous layer formed of Si and containing C and Cl may be referred as a Si thin film containing C and Cl. In addition, Si constituting the Si layer containing C and Cl includes Si whose bonding to C or Cl is completely broken as well as Si whose bonding to C or Cl is not completely broken.

Further, the adsorption layer of the BTCSM gas includes a continuous chemisorption layer of the BTCSM gas molecules and a discontinuous chemisorption layer of the BTCSM gas molecules, as well. The adsorption layer of the BTCSM gas includes a chemisorption layer having a thickness equal to or less than one molecular layer formed of BTCSM molecules. In addition, the BTCSM $((SiCl_3)_2CH_2)$ molecules constituting the adsorption layer of the BTCSM gas includes molecules in which an Si—C bonding is partially broken or in which an Si—Cl bonding is partially broken, as well as those represented by the chemical structural formula in FIG. 12A. That is, the adsorption layer of the BTCSM gas includes a chemisorption layer of BTCSM molecules or a physisorption layer of BTCSM molecules.

A layer having a thickness smaller than one atomic layer refers to an atomic layer which is discontinuously formed, and a layer having a thickness equal to one atomic layer refers to an atomic layer which is continuously formed. Also, a layer having a thickness smaller than one molecular layer refers to a molecular layer which is discontinuously formed, and a layer having a thickness equal to one molecular layer refers to a molecular layer which is continuously formed. Further, the Si-containing layer containing C and Cl may include both the Si layer containing C and Cl and the adsorption layer of the BTCSM gas, and as described above, the expressions such as "one atomic layer", "several atomic layers" may be used for the Si-containing layer containing C and Cl.

When a thickness of the Si-containing layer containing C and Cl formed on the wafer 200 exceeds several atomic layers, an effect of the modification in Step 2a, which will be described later, does not affect the Si-containing layer containing C and Cl. Also, a minimum value of the thickness of the Si-containing layer containing C and Cl that may be formed on the wafer 200 is less than one atomic layer. Thus, the thickness of the Si-containing layer containing C and Cl may fall within a range of less than about one atomic layer to several atomic layers. By reducing the thickness of the Si-containing layer containing C and Cl to be one atomic layer or less, i.e., to be equal to or less than one atomic layer, the effect of the modification reaction in Step 2a, which will be described later may be relatively increased and a time required for the modification reaction in Step 2a may be shortened. Further, a time required for forming the Si-containing layer containing C and Cl in Step 1a may also be shortened. As a result, since a process time per cycle may be shortened, an overall process time may also be shortened. That is, a film forming rate may also be increased. In addition, by setting the thickness of the Si-containing layer containing C and Cl to be equal to or less than one atomic layer, the film thickness uniformity can also be easily controlled.

Under a condition in which the BTCSM gas is self-decomposed (pyrolyzed), i.e., under a condition in which a pyrolysis reaction of the BTCSM gas occurs, Si is deposited on the wafer 200 to form an Si layer containing C and Cl. Under a condition in which the BTCSM gas is not self-decomposed (not pyrolyzed), i.e., under a condition in which a pyrolysis reaction of the BTCSM gas does not occur, the BTCSM gas is adsorbed onto the wafer 200 to form the adsorption layer of the BTCSM gas. Forming the silicon layer containing C and Cl on the wafer 200 can increase the film forming rate than forming the adsorption layer of the BTCSM gas on the wafer 200. However, in this embodiment, since the temperature of the wafer 200 is so low as to be 200 degrees C. or lower, for example, the formation of the adsorption layer of the BTCSM gas on the wafer 200 may be in a prominent position to formation of the Si layer containing C and Cl on the wafer 200. Also, when a catalytic gas is not supplied, a physisorption state weaker than a chemisorption state is likely to have a dominant position in bonding of BTCSM molecules to the base film such as the surface of the wafer 200 or in bonding between BTCSM molecules in the adsorption layer of the BTCSM gas. That is, most of the adsorption layer of the BTCSM gas is likely to be formed as a BTCSM gas physisorption layer.

Figure 6A:
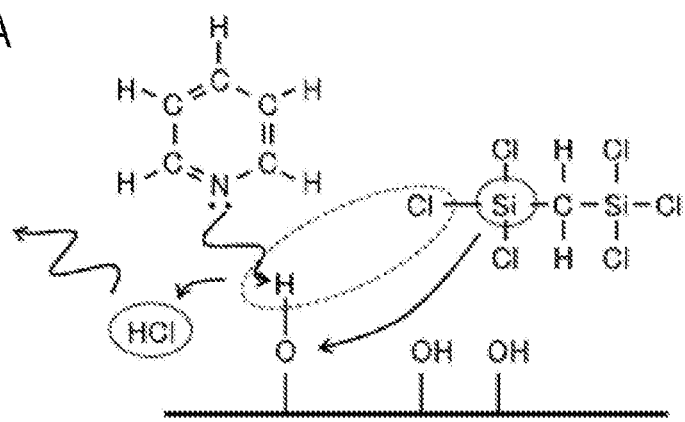

Here, the pyridine gas as a catalytic gas weakens the bonding strength of the O—H bonding existing in the surface of the wafer 200 to accelerate decomposition of the BTCSM gas and facilitates formation of the Si-containing layer containing C and Cl due to chemisorption of BTCSM molecules. That is, as illustrated in FIG. 6A, the pyridine gas as a catalytic gas acts on the O—H bonding existing in the surface of wafer 200 or the Si-containing layer containing C and Cl, for example, to weaken the O—H bonding strength. H having weakened bonding strength reacts with Cl of the BTCSM gas to generate a hydrogen chloride (HCl) gas so as to be separated, and the BTCSM molecule (halide) losing Cl is chemically adsorbed onto a surface of the wafer 200. That is, a chemisorption layer of the BTCSM gas is formed on the surface of the wafer 200. The reason why the pyridine gas weakens bonding strength of O—H is because N atom having lone pair electrons in the pyridine molecule attracts H. For example, the foregoing acid dissociation constant (pKa) may be used as an index for a degree of action by which a predetermined compound containing the N atom or the like attracts H.

More specifically, a compound having a large pKa, which indicates, as a negative common logarithm, an equilibrium constant (Ka) in a dissociation reaction where hydrogen ions are released from acid, has strong attraction force to H. For example, by using a compound having pKa equal to or greater than 5 as a catalytic gas, decomposition of the BTCSM gas may be accelerated to facilitate a formation of a Si-containing layer containing C and Cl. On the other hand, when pKa of a catalytic gas is excessively large, Cl separated from the BTCSM molecule and a catalytic gas are bonded to generate a component, i.e., salt (ion compound) such as ammonium chloride ($NH_4Cl$), which may become a particle. In order to restrain this, kPa of the catalytic gas may be set to be 11 or less. In some embodiments, kPa of the catalytic gas may be set to be 7 or less. Since the pyridine gas has relatively large kPa of about 5.67, the pyridine gas has strong attraction force to H. Also, since pKa of the pyridine gas is smaller than 7, particles are hardly generated.

In the aforementioned manner, by using the pyridine gas as a catalytic gas, decomposition of the BTCSM gas may be accelerated even under a low temperature condition, for example, equal to or lower than 200 degrees C. Accordingly, the Si-containing layer containing C and Cl is formed such that the formation of a chemisorption layer is more dominant than the formation of a physisorption layer of the BTCSM gas.

Also, by using the BTCSM gas as a precursor gas which contains Si, C and a halogen element and has an Si—C bonding, C may be introduced in the first layer. The first layer containing C is modified in Step 2a performed thereafter to form, for example, a silicon oxycarbide layer (SiOC layer) containing C at a high concentration, or an SiOC film consisting of the SiOC layers laminated and containing C at a high concentration.

Here, in the SiO film obtained by using a catalytic gas under a low temperature condition, a wet etching rate (hereinafter, also referred to as "WER") with respect to hydrofluoric acid at 1% concentration (1% HF aqueous solution) is, for example, about 600 Å/min. Although the SiO film is obtained by using plasma under a low temperature condition, WER may be, for example, about 200 Å/min. In an aspect that WER of a thermal oxide film obtained by thermally oxidizing silicon wafer in an oxidation furnace is, for example, about 60 Å/min, WER of the SiO film formed under a low temperature condition is equal to or more than triple. Such a high WER indicates that the etching resistance of the SiO film is lower than the thermal oxide film, for example. In order to enhance the etching resistance, for example, it is desirable to form the SiO film containing C or the like, i.e., the SiOC film.

In case of film formation at a relatively high temperature, the SiOC film may be formed according to a following method, for example. That is, in addition to a process of forming a Si-containing layer by using the HCDS gas, the BDEAS gas or the like and a process of modifying the Si-containing layer with an oxidizing gas to form a silicon oxide layer (SiO layer), a process of exciting the hydrocarbon-based gas such as the propylene ($C_3H_6$) gas, for example, into the plasma and supplying the plasma to the wafer 200 is prepared. Thus, C is introduced to the Si-containing layer or the SiO layer to form a SiOC layer, thereby resultantly forming the SiOC film.

However, when a film is formed at a relatively low temperature of 200 degrees C. or lower, for example, as in this embodiment, it is difficult to introduce C to the SiO film to form the SiOC film. That is, since a sufficient carbon concentration (C concentration) is not obtained in forming a thin film, the SiO film rarely containing C, for example, may be formed. This may make it difficult to increase the etching resistance to a sufficient level.

Thus, in this embodiment, for example, the BTCSM gas as an alkylenehalosilane-based precursor gas is used. By using the BTCSM gas, C can be introduced to the first layer of the SiO film in the process of forming the first layer as an initial layer on the wafer 200, which allows to form an SiOC layer or an SiOC film having a sufficient C concentration. Also, the C concentration in the SiOC layer or the SiOC film may be controlled with high precision.

(Removal of Residual Gas)

After the Si-containing layer containing C and Cl is formed as the first layer on the wafer 200, the valve 243a of the first precursor gas supply pipe 232a is closed to stop the supply of the BTCSM gas. Also, the valve 243c of the first catalytic gas supply pipe 232c is closed to stop the supply of the pyridine gas. At this time, while the APC valve 244 of the exhaust pipe 231 is in an open state, the pressure of the interior of the process chamber 201 is evacuated by the vacuum pump 246, and the residual BTCSM gas and the residual pyridine gas remaining in the process chamber 201, which do not react or remain after the formation of the Si-containing layer containing C and Cl, are removed from the process chamber 201 (removal of residual gas). Also, at this time, the valves 243i to 243k are in an open state, and the supply of the $N_2$ gas as an inert gas into the process chamber 201 is maintained. The $N_2$ gas acts as the purge gas, and thus, the residual BTCSM gas and the residual pyridine gas remaining in the process chamber 201, which do not react or remain after the formation of the Si-containing layer containing C and Cl, can be effectively removed from the process chamber 201.

The residual gas remaining in the process chamber 201 may not completely be removed, and the interior of the process chamber 201 may not completely be purged. When the residual gas remaining in the process chamber 201 is very small in amount, no adverse effect may occur in Step 2a performed thereafter. Here, a flow rate of the $N_2$ gas supplied into the process chamber 201 need not be high, and for example, approximately the same amount of the $N_2$ gas as the volume of the reaction tube 203 (the process chamber 201) may be supplied to perform the purge such that no adverse effect occurs in Step 2a. As described above, since the interior of the process chamber 201 is not completely purged, the purge time can be reduced and the throughput can be improved. In addition, the consumption of the $N_2$ gas can be suppressed to a minimal necessity.

As the precursor gas containing Si, C and a halogen element and having an Si—C bonding, a 1,2-bis(trichlorosilyl)ethane (($SiCl_3)_2C_2H_4$, abbreviation: BTCSE) gas, a 1,1,2,2-tetrachloro-1,2-dimethyldisilane (($CH_3)_2Si_2Cl_4$, abbreviation: TCDMDS) gas, a 1,2-dichloro-1,1,2,2-tetramethyldisilane (($CH_3)_4Si_2Cl_2$, abbreviation: DCTMDS) gas and the like may be used, in addition to the bis(trichlorosilyl)methane (($SiCl_3)_2CH_2$, abbreviation: BTCSM) gas.

Here, by selecting a type of a precursor gas supplied in the process of supplying a precursor gas and a catalytic gas, the C concentration in the SiOC layer, further, in the SiOC film formed by stacking the SiOC layer may be controlled. That is, in the process of supplying a precursor gas and a catalytic gas, among a plural type of precursor gases each having a different molecular structure, a specific precursor gas may be selected and supplied as a precursor gas, thereby controlling the C concentration in the SiOC layer or the SiOC film. In order to select a specific precursor gas from among a plural type of precursor gases and supply the same, a specific supply line may be selected from among a plurality of supply lines that supplies a plural type of precursor gases having different molecular structures. As described above, in an example of film forming sequence according to this embodiment, the BTCSM gas supply line is selected from among the BTCSM gas supply line, the TCDMDS gas supply line and the like, to supply a BTCSM gas as a specific precursor gas.

As a factor allowing for controlling of the C concentration in the SiOC film according to a type of the selected precursor gas, for example, a difference between dispositions of C in a molecular structure of each precursor gas may be considered. That is, the BTCSM gas, the BTCSE gas or the like as alkylenehalosilane-based precursor gas having an Si—C—Si bonding or Si—C—C—Si bonding in one molecule has a molecular structure in which C is interposed between Si and Si. Thus, a state in which a number of Cl is bonded to remaining bonding electrons of Si is maintained. For example, in case of both the BTCSM gas and the BTCSE gas, Cl is bonded to each of three bonding electrons among four bonding electrons of Si. A great number of Cl contained in a molecule is anticipated to enhance reactivity of the BTCSM gas, the BTCSE gas or the like. Thus, by using the BTCSM gas, the BTCSE gas or the like, for example, a film forming rate of the SiOC film may be enhanced. Also, since reactivity and film forming rate of the BTCSM gas, the BTCSE gas or the like are enhanced by contained Cl, an available conditional range (process window) of the film forming process using the BTCSM gas, the BTCSE gas or the like is extended. Thus, for example, since a film forming condition for obtaining a desired C concentration can be selected within such wide process window, increasing the C concentration in the SiOC film is resultantly facilitated. Also, controllability of the C concentration in the SiOC film can be enhanced. In addition, for example, the number of C contained in the BTCSM gas is small, relative to that of the TCDMDS gas or the like, for example, but this is not thought to disadvantageously work on enhancement of the C concentration in the SiOC film. The inventors found that the enhancement of the C concentration is more relatively promoted when the BTCSM gas is used than when the TCDMDS gas is used.

In addition, the TCDMDS gas, the DCTMDS gas or the like as alkylhalosilane-based precursor gas in which an alkyl group such as a methyl group is bonded to Si has a molecular structure in which some chloro groups of the chlorosilane-based precursor gas are substituted with methyl groups. Thus, as the number of Cl is reduced in the gas molecules, reaction is relatively slowly made as much in the TCDMDS gas, the DCTMDS gas or the like, and thus, more dense SiOC film may be easily obtained. Accordingly, for example, although the SiOC film has the appropriately restrained C concentration, it can easily maintain the high etching resistance. Further, in comparison between the TCDMDS gas and the DCTMDS gas, it is confirmed that the DCTMDS gas containing a great number of methyl groups, i.e., a great number of C, in the molecule acts more advantageously on an introduction amount of C to the film.

As described above, when the foregoing process is performed, for example, the SiOC layer containing C at a high concentration may be formed by selectively supplying the BTCSM gas, the BTCSES gas or the like. Alternatively, the SiOC layer having an appropriately restrained C concentration, while maintaining the etching resistance, may be formed by selectively supplying the TCDMDS gas, the DCTMDS gas or the like. That is, by selecting and supplying a specific precursor gas among a plural type of precursor gases, the C concentration in the SiOC layer, i.e., in the SiOC film, can be controlled with high precision.

In the foregoing description, silicon concentration (Si concentration) and oxygen concentration (O concentration) may also be relatively changed by controlling the C concentration in the SiOC film. That is, a composition of the SiOC film may be entirely changed, or a type of the precursor gas may be selected in order to control the overall composition of the SiOC film.

Also, a plurality of process recipes (programs describing process order or processing conditions) used to form various thin films as described above may be prepared for every type of precursor gas, i.e., for different gas systems in advance to facilitate the selection of types of precursor gases. An operator may properly select an appropriate process recipe according to a desired gas system or film composition to execute film formation processing.

In addition, as a catalytic gas, a cyclic amine-based gas such as an aminopyridine ($C_5H_6N_2$, pKa=6.89) gas, a picoline ($C_6H_7N$, pKa=6.07) gas, a lutidine ($C_7H_9N$, pKa=6.96) gas, a piperazine ($C_4H_{10}N_2$, pKa=9.80) gas, or a piperidine ($C_5H_{11}N$, pKa=11.12) gas, in addition to the pyridine $C_5H_5N$, pKa=5.67) gas, may be used. Also, a chain-like amine-based gas such as a triethylamine (($C_2H_5$)$_3$N, abbreviation: TEA, pKa=10.7) gas, a diethylamine (($C_2H_5$)$_2$NH, abbreviation: DEA, pKa=10.9) gas, a monoethylamine (($C_2H_5$)NH$_2$, abbreviation: MEA, pKa=10.6) gas, a trimethylamine (($CH_3$)$_3$N, abbreviation: TMA, pKa=9.8) gas, or a monomethylamine (($CH_3$)NH$_2$, abbreviation: MMA, pKa=10.6) gas may be used. As an inert gas, a rare gas such as an Ar gas, a He gas, a Ne gas, or a Xe gas, in addition to the $N_2$ gas, may be used.

[Step 2a]
(Supply of $H_2O$ Gas+Pyridine Gas)

After Step 1a is terminated and the residual gas within the process chamber 201 is removed, the valve 243b of the first oxidizing gas supply pipe 232b is opened to flow an $H_2O$ gas into the first oxidizing gas supply pipe 232b. The $H_2O$ gas flows from the first oxidizing gas supply pipe 232b and a flow rate thereof is controlled by the MFC 241b. The flow-rate-controlled $H_2O$ gas is supplied into the buffer chamber 237 through the gas supply holes 250b of the second nozzle 249b. The $H_2O$ gas supplied into the buffer chamber 237 is supplied into the process chamber 201 through the gas supply holes 250d, and exhausted through the exhaust pipe 231. In this way, the $H_2O$ gas is supplied to the wafer 200 under a non-plasma atmosphere ($H_2O$ gas supply). At this time, the valve 243j is opened to flow the $N_2$ gas as an inert gas into the second inert gas supply pipe 232j. A flow rate of the $N_2$ gas flowing into the second inert gas supply pipe 232j is controlled by the MFC 241j. The flow-rate-controlled $N_2$ gas is supplied together with the $H_2O$ gas into the process chamber 201, and exhausted through the exhaust pipe 231.

Also, at this time, the valve 243c of the first catalytic gas supply pipe 232c is opened to flow the pyridine gas into the first catalytic gas supply pipe 232c. A flow rate of the pyridine gas flowing into the first catalytic gas supply pipe 232c is controlled by the MFC 241c. The flow-rate-controlled pyridine gas is supplied into the process chamber 201 through the gas supply holes 250c of the third nozzle 249c, and exhausted through the exhaust pipe 231. In this way, the pyridine gas is supplied to the wafer 200 (pyridine gas supply). At this time, the valve 243k is opened to flow the inert gas such as the $N_2$ gas into the third inert gas supply pipe 232k. A flow rate of the $N_2$ gas flowing into the third inert gas supply pipe 232k is controlled by the MFC 241k. The flow-rate-controlled $N_2$ gas is supplied together with the pyridine gas into the process chamber 201, and exhausted through the exhaust pipe 231.

Moreover, at this time, in order to prevent infiltration of the $H_2O$ gas and the pyridine gas into the first nozzle 249a, the valve 243i is opened to flow the $N_2$ gas into the first inert gas supply pipe 232i. The $N_2$ gas is supplied into the process chamber 201 through the first precursor gas supply pipe 232a and the first nozzle 249a, and exhausted through the exhaust pipe 231.

At this time, the APC valve 244 is appropriately controlled to set the internal pressure of the process chamber 201 to fall within a range of, for example, 1 to 13300 Pa. In some embodiments, the internal pressure of the process chamber 201 is set to range from 20 to 1330 Pa, for example, 1330 Pa. A supply flow rate of the $H_2O$ gas controlled by the MFC 241b may be controlled to fall within a range of, for example, 1000 to 10000 sccm. Also, a supply flow rate of the pyridine gas is controlled by the MFC 241c so that the ratio of a supply flow rate (sccm) of the pyridine gas to a supply flow rate (sccm) of $H_2O$ gas may be set to fall within a range of, for example, 0.01 to 100, in some embodiments, 0.05 to 10. Supply flow rates of the $N_2$ gas controlled by the MFCs 241i to 241k are set to fall within a range of, for example, 100 to 10000 sccm, respectively. A time duration for which the $H_2O$ gas and the pyridine gas are supplied to the wafer 200, i.e., a gas supply time (or irradiation time), may be controlled to fall within a range of, for example, 1 to 100 seconds, in some embodiments, 5 to 30 seconds. A temperature of the heater 207 may be set such that the wafer 200 has a temperature within a range like that of the case in which the BTCSM gas is supplied in Step 1a, i.e., within a range, for example, from room temperature to 200 degrees C., from room temperature to 150 degrees C., and from room temperature to 100 degrees C.

The $H_2O$ gas supplied into the process chamber 201 is activated by heat and exhausted through the exhaust pipe 231. At this time, the $H_2O$ gas activated by heat is supplied to the wafer 200. That is, the gas flowing into the process chamber 201 is thermally activated the $H_2O$ gas, and the BTCSM gas does not flow in the process chamber 201. Thus, the $H_2O$ gas is supplied in an activated state to the wafer 200, without causing a gas phase reaction, and reacts with at least a portion of the first layer (the Si-containing layer containing C and Cl) formed on the wafer 200 in Step 1a. Accordingly, the first layer is thermally oxidized with non-plasma so as to be modified into a second layer containing Si, O and C, i.e., an SiOC layer.

Figure 6B:
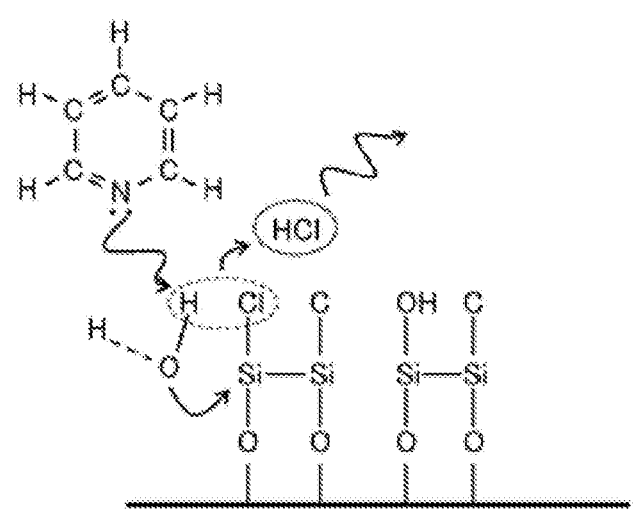

Here, the pyridine gas as a catalytic gas weakens the bonding strength of a O—H bonding of the $H_2O$ gas, accelerating decomposition of the $H_2O$ gas and accelerating the reaction between the $H_2O$ gas and the Si-containing layer containing C and Cl. That is, as illustrated in FIG. 6B, the pyridine gas acts as a catalyst on the O—H bonding of the $H_2O$ gas to weaken the bonding strength of O—H. H with the weakened bonding strength and Cl of the Si-containing layer containing C and Cl and formed on the wafer 200 react with each other to generate a hydrogen chloride (HCl) gas, which is separated, and O of the H$_2$O gas, which has lost H, is bonded to Si of the Si-containing layer having at least some C remaining after the separation of Cl.

In this case, the C concentration in the SiOC layer, further, in the SiOC film may be controlled by adjusting a supply amount of the pyridine gas which is supplied in the process of supplying the H$_2$O gas and the pyridine gas. That is, when a supply amount of the pyridine gas is increased, an effect of the pyridine gas may be increased to accelerate decomposition of the H$_2$O gas and accelerate the reaction between the H$_2$O gas and the Si-containing layer containing C and Cl. That is, since oxidizing power of the H$_2$O gas is increased, the H$_2$O gas reacts with the Si-containing layer containing C and Cl. In this case, a possibility that the Si—C bonding, as well as the Si—Cl bonding included in the Si-containing layer containing C and Cl, is separated is also increased, and thus, C of the SiOC layer may be easily separated. Thus, the C concentration in the SiOC layer or the SiOC film may be appropriately lowered. Conversely, when a supply amount of the pyridine gas is reduced, an effect of the pyridine gas is reduced to restrain the acceleration of decomposition of the H$_2$O gas or acceleration of a reaction between the H$_2$O gas and the Si-containing layer containing C and Cl. That is, the oxidizing power of the H$_2$O gas is weakened, and thus, a reaction between the H$_2$O gas and the Si-containing layer containing C and Cl may be appropriately restrained. Accordingly, only the separation of the Si—Cl bonding and the separation of Cl contained in the Si-containing layer containing C and Cl mainly occur, and the separation of the Si—C bonding and the separation of C contained in the Si-containing layer containing C and Cl hardly occur. Thus, C may easily remain in the SiOC layer, and thus, the C concentration in the SiOC layer or the SiOC film may be increased.

In this manner, by adjusting a supply amount of the pyridine gas, the oxidizing power of the H$_2$O gas may be controlled to control the C concentration in the SiOC layer, further, in the SiOC film, with high precision. Also, adjusting a supply amount of the pyridine gas may refer to adjusting a ratio of a flow rate of the pyridine gas to the sum of flow rates of the H$_2$O gas and the pyridine gas. Also, accordingly, a partial pressure of the pyridine gas within the process chamber 201 may be controlled.

That is, by adjusting the ratio of a flow rate of the pyridine gas to the sum of the flow rates of the H$_2$O gas and the pyridine gas supplied in the process of supplying the H$_2$O gas and the pyridine gas, the C concentration in the SiOC layer or the SiOC film may be controlled with high precision. That is, a flow rate ratio P$_{RATIO}$ obtained as F$_H$/(F$_H$+F$_P$) is controlled by using the flow rate F$_H$ of the H$_2$O gas supplied into the process chamber 201 and the flow rate F$_P$ of the pyridine gas supplied into the process chamber 201. Accordingly, the C concentration in the SiOC layer, further, in the SiOC film, may be controlled with high precision by controlling the oxidizing power of the H$_2$O gas. Since the oxidizing power of the H$_2$O gas is increased by increasing the flow rate ratio P$_{RATIO}$, the C concentration in the SiOC film may be appropriately lowered. Also, since oxidizing power of the H$_2$O gas is reduced by reducing the flow rate ratio P$_{RATIO}$, the C concentration in the SiOC film may be increased.

In addition, by adjusting a partial pressure of the pyridine gas supplied in the process of supplying the H$_2$O gas and the pyridine gas within the process chamber 201, the oxidizing power of the H$_2$O gas may be controlled to control the C concentration in the SiOC layer, further, in the SiOC film, with high precision. In this case, the partial pressure V$_P$ of the pyridine gas within the process chamber 201 is obtained by equation of V$_P$=[F$_P$/(F$_H$+F$_P$+F$_N$)]×V by using the flow rate F$_H$ of the H$_2$O gas supplied into the process chamber 201, the flow rate F$_P$ of the pyridine gas supplied into the process chamber 201, the flow rate F$_N$ of the N$_2$ gas supplied into the process chamber 201, and a total pressure V within the process chamber 201. As described above, other gases such as the N$_2$ gas may also be used. However, the ratio of the partial pressure between the H$_2$O and the pyridine gas is still controlled, and adjusting the partial pressure V$_P$ of the pyridine gas may be used to similarly control a supply amount of the pyridine gas or the flow rate ratio P$_{RATIO}$. That is, by increasing the partial pressure V$_P$ of the pyridine gas, the oxidizing power of the H$_2$O gas may be increased to appropriately reduce the C concentration in the SiOC film. Also, by decreasing the partial pressure V$_P$ of the pyridine gas, the oxidizing power of the H$_2$O gas may be reduced to increase the C concentration in the SiOC film.

In this case, the Si concentration and the O concentration may be relatively changed by controlling the C concentration in the SiOC film. That is, the overall composition of the SiOC film may be changed, or a supply amount, a partial pressure or the flow rate ratio P$_{RATIO}$ of the pyridine gas may be controlled for the purpose of controlling the composition of the SiOC film overall.

In addition, the adjusting of a supply amount, a partial pressure or a flow rate ratio with respect to the catalytic gas supplied in the process of supplying the oxidizing gas and the catalytic gas may be independently performed from the adjusting of a supply amount, a partial pressure or a flow rate ratio with respect to the catalytic gas supplied in the process of supplying the foregoing precursor gas and the catalytic gas. That is, the supply amounts, the partial pressures and the flow rate ratios with respect to the catalytic gases in both processes may be controlled to be identical or to be different from each other, respectively.

In this case, a plurality of process recipes (programs describing process order or processing conditions) in which the supply amounts, flow rates and the like of the catalytic gases are set to have different numerical values may be prepared in advance to facilitate adjusting of the supply amount or the partial pressure of the catalytic gas or adjusting of the flow rate ratio with respect to the corresponding catalytic gas. The operator may properly select an appropriate process recipe according to a desired film composition to perform film formation processing.

(Removal of Residual Gas)

Thereafter, the valve 243b of the first oxidizing gas supply pipe 232b is closed to stop the supply of the H$_2$O gas. Also, the valve 243c of the first catalytic gas supply pipe 232c is closed to stop the supply of the pyridine gas. At this time, while the APC valve 244 of the exhaust pipe 231 is in an open state, the pressure of the interior of the process chamber 201 is evacuated by the vacuum pump 246, and the residual H$_2$O gas or the residual pyridine gas remaining in the process chamber 201 which does not react or remains after reaction, or reaction byproducts are removed from the process chamber 201 (removal of residual gas). Also, at this time, the valves (243i to 243k) are in an open state, and the supply of the N$_2$ gas as an inert gas into the process chamber 201 is maintained. The N$_2$ gas acts as a purge gas, whereby the residual H$_2$O gas or the residual pyridine gas remaining in the process chamber 201 which does not react or remains after formation of the second layer, or the reaction byproducts can be effectively removed from the process chamber 201.

The gas residual remaining in the process chamber 201 may not completely be removed, and the interior of the process chamber 201 may not completely be purged. When the residual gas remaining in the process chamber 201 is very small in amount, there is no adverse effect generated in Step 1a to be performed thereafter. Here, a flow rate of the $N_2$ gas supplied into the process chamber 201 need not be high, and for example, approximately the same amount of the $N_2$ gas as the volume of the reaction tube 203 (the process chamber 201) may be supplied to perform the purge such that there is no adverse effect generated in Step 1. As described above, as the interior of the process chamber 201 is not completely purged, the purge time can be reduced, thereby improving the throughput. In addition, the consumption of the $N_2$ gas can also be suppressed to a minimal necessity.

As the oxidizing gas, hydrogen peroxide ($H_2O_2$) gas or the like, in addition to the $H_2O$ gas, may be used. Also, the gas not containing hydrogen (H), i.e., the oxygen ($O_2$) gas, an ozone ($O_3$) gas or the like may be used alone or together with $H_2$ gas. As the catalytic gas, various amine-based gases as described above by way of example, in addition to the pyridine gas, may be used. As the inert gas, a rare gas such as an Ar gas, a He gas, a Ne gas and a Xe gas, in addition to the $N_2$ gas, may be used.

Here, the C concentration in the SiOC layer or in the SiOC film may be controlled by selecting a type of the catalytic gas supplied in the process of supplying the oxidizing gas and the catalytic gas. That is, in the process of supplying the oxidizing gas and the catalytic gas, a specific catalytic gas, among a plural type of catalytic gases having different molecular structures, may be selectively supplied as a catalytic gas to control the C concentration in the SiOC layer or the SiOC film. In order to select and supply a specific catalytic gas among the plural type of catalytic gases, a specific supply line may be selected from among a plurality of supply lines that supplies a plural type of catalytic gases having different molecular structures to supply a specific catalytic gas. As described above, in the film forming sequence according to this embodiment, the pyridine gas is supplied as a specific catalytic gas by selecting the pyridine gas supply line among the pyridine gas supply line, the TEA gas supply line and the like.

As a factor allowing for controlling of the C concentration in the SiOC film according to a type of selected catalytic gas, for example, a difference in acid dissociation constant (pKa), which is one of indices of the strength of a catalytic action in each catalytic gas, may be considered. That is, the catalytic action of the pyridine gas having a smaller pKa is weaker, whereby its effect of accelerating decomposition of the $H_2O$ gas or accelerating a reaction between the $H_2O$ gas and the Si-containing layer containing C and Cl is presumed to be weakened. When the oxidizing power of the $H_2O$ gas is weakened, a reaction between the $H_2O$ gas and the Si-containing layer containing C and Cl, in particular, the separation of the Si—C bonding and the separation of C are appropriately restrained, and thus, C may tend to strongly remain in the SiOC layer. Also, a TEA gas, a piperidine gas or the like having greater pKa has a higher catalytic action, whereby its effect of accelerating decomposition of the $H_2O$ gas or accelerating the reaction between the $H_2O$ gas and the Si-containing layer containing C and Cl is increased. When the oxidizing power of the $H_2O$ gas is increased, the reaction between the $H_2O$ gas and the Si-containing layer containing C and Cl, in particular, the separation of the Si—C bonding and the separation of C occur, so that carbon (C), which may be resistant to remain in the SiOC layer, remains in the SiOC layer. Thus, the SiOC layer containing C with a higher concentration may be formed by selecting the pyridine gas or the like, in performing the foregoing process. Alternatively, the SiOC layer in which the C concentration is appropriately restrained may be formed by selecting the TEA gas, the piperidine gas or the like. That is, by selecting and supplying a specific catalytic gas among a plural type of catalytic gases, the C concentration in the SiOC layer, i.e., in the SiOC film, may be controlled with high precision.

As another factor for controlling of the C concentration in the SiOC film according to a type of a selected catalytic gas, for example, a difference in vapor pressure between respective catalytic gases, a difference in vapor pressure between salts generated according to reactions by respective catalytic gases, or the like may be considered. When vapor pressures of the components related to the catalytic reaction are different, an existence ratio of respective components in a vapor phase in a reaction system, i.e., for example, whether the separation of C from the film is easy or not, or the like may also be changed. As a result, the C concentration in the SiOC layer or the SiOC film may be changed.

The factors taken as examples in the above description including pKa of the catalytic gas, balance between the vapor pressure of the catalytic gas and the vapor pressure of generated salt, i.e., difference in vapor pressures, and the like are considered to better control of the C concentration in the SiOC layer or the SiOC film.

In the above, the Si concentration and the O concentration may be relatively changed by controlling the C concentration in the SiOC film. That is, the composition of the SiOC film may be changed on the whole, or a type of the catalytic gas may be selected for the purpose of controlling the composition of the SiOC film on the whole.

Also, a type of the catalytic gas supplied in the process of supplying the oxidizing gas and the catalytic gas may be identical to or different from that of the catalytic gas supplied in the process of supplying the precursor gas and the catalytic gas as mentioned above. The inventors thought that the pyridine gas is desirable as a catalytic gas through each process, when comprehensively determined within a gas system and a conditional range of this embodiment. The TEA gas and the piperidine gas are also considered to be desirable.

In addition, process recipes (programs describing process order or processing conditions) used to form various thin films as described above may be prepared for every type of catalytic gas, i.e., for different gas systems in advance to facilitate the selection of type of precursor gases. The operator may properly select an appropriate process recipe according to a desired gas system or film composition to execute film formation processing.

(Performing Predetermined Number of Times)

The foregoing Steps 1a and 2a may be set as one cycle, and the cycle may be performed once or more, i.e., a predetermined number of times (n times) to form the SiOC film having a predetermined composition and a predetermined film thickness on the wafer 200. In some embodiments, the foregoing cycle is repeated a predetermined number of times. That is, in some embodiments, a thickness of the SiOC layer formed per cycle is set to be smaller than a desired film thickness and the foregoing cycle is repeated a predetermined number of times until a desired film thickness is obtained.

At this time, ratios of the respective element components in the SiOC layer including the Si component, the O component and the C component (i.e., the Si concentration, the O concentration and the C concentration) may be finely controlled by adjusting the processing conditions such as the internal pressure of the process chamber 201 or the gas supply time in each step, whereby a composition ratio of the SiOC film may be more closely controlled.

Further, when the cycle is performed a predetermined number of times, the expression of "a predetermined gas is supplied to the wafer 200" in each step after at least the second cycle means that "a predetermined gas is supplied to a layer formed on the wafer 200, i.e., on the uppermost surface of the wafer 200 as a laminated body", and the expression of "a predetermined layer is formed on the wafer 200" means that "a predetermined layer is formed on a layer formed on the wafer 200, i.e., on the uppermost surface of the wafer 200 as a laminated body". This is the same as described above, and also the same in other embodiments, which will be described later.

(Purging and Returning to Atmospheric Pressure)

After the film forming processing of forming the SiOC film having a predetermined composition and a predetermined film thickness is performed, the valves 243i to 243k are opened to supply the $N_2$ gas as an inert gas into the process chamber 201 from each of the inert gas supply pipes 232i to 232k and the $N_2$ gas is exhausted through the exhaust pipe 231. The $N_2$ gas acts as a purge gas, whereby the interior of the process chamber 201 is purged with the inert gas and the residual gas remaining in the process chamber 201 and reaction byproducts are removed from the process chamber 201 (purge). Thereafter, an atmosphere in the process chamber 201 is substituted with the inert gas (inert gas substitution), and the internal pressure of the process chamber 201 returns to normal pressure (return to atmospheric pressure).

(Boat Unloading and Wafer Discharging)

Thereafter, the seal cap 219 is lowered by the boat elevator 115 to open the lower end of the manifold 209, and the processed wafers 200 supported by the boat 217 are unloaded to the outside of the reaction tube 203 through the lower end of the manifold 209 (boat unloading). Then, the processed wafers 200 are discharged from the boat 217 (wafer discharging).

(3) Effects of Embodiment

According to this embodiment, one or more effects are provided as described below.

(a) According to the film forming sequence of this embodiment, the BTCSM gas and the pyridine gas are supplied to the wafer 200 in Step 1a. As described above, since the precursor gas having the Si—C bonding is used, C may be introduced, for example, into the SiOC layer with a high concentration. As a result, the SiOC film having a high C concentration may be formed. In addition, the C concentration in the SiOC film may be controlled with high precision. Thus, the SiOC film having the high etching resistance, for example, may be obtained.

(b) Further, according to the film forming sequence of this embodiment, in the process of supplying the precursor gas and the catalytic gas in Step 1a, a specific precursor gas, among a plural type of precursor gases having different molecular structures, is selectively supplied as a precursor gas. That is, the alkylenhalosilane-based precursor gas (BTCSM gas, BTCSE gas or the like) having the Si—C—Si bonding or the Si—C—C—Si bonding in the chemical structural formula (In one molecule) is selectively supplied, or the alkylhalosilane-based precursor gas (TCDMDS gas, DCTMDS gas or the like) in which an alkyl group is bonded to Si is selectively supplied. Thus, the C concentration in the SiOC layer may be changed according to the selected precursor gas, and as a result, the C concentration in the SiOC film may be controlled with high precision.

(c) Further, according to the film forming sequence of this embodiment, in the process of supplying the $H_2O$ gas and the pyridine gas in Step 2a, a supply amount, a partial pressure of the pyridine gas, or the foregoing flow rate ratio ($P_{RATIO}$) supplied are controlled. By doing so, the oxidizing power of the $H_2O$ gas may be weakened or strengthened by controlling the strength of the catalytic action of the pyridine gas, and as a result, the C concentration in the SiOC layer, further, in the SiOC film, may be increased or decreased. Thus, the SiOC film having the high etching resistance, for example, may be obtained.

(d) Moreover, according to the film forming sequence of this embodiment, in the process of supplying the oxidizing gas and the catalytic gas in Step 2a, a specific catalytic gas, among a plural type of catalytic gases having different molecular structures, is selected and supplied as a catalytic gas. That is, for example, a catalytic gas having appropriate strength of catalytic action, among various catalytic gases having different strengths of catalytic action, is selected and supplied. By doing so, the oxidizing power of the oxidizing gas may be weakened or strengthened, and as a result, the C concentration in the SiOC layer, further, in the SiOC film, may be increased or decreased according to the selected catalytic gas. Thus, the SiOC film having the high etching resistance, for example, may be obtained.

(e) In addition, the substrate processing apparatus according to this embodiment includes a plurality of precursor gas supply lines and is configured to select and supply a specific precursor gas among a plural type of precursor gases having different molecular structures. Further, the substrate processing apparatus according to this embodiment includes a plurality of catalytic gas supply lines and is configured to select and supply a specific catalytic gas among a plural type of catalytic gases having different molecular structures. Thus, selecting and supplying a specific precursor gas or a specific catalytic gas among the plural type of gases according to a desired film composition or the like is facilitated. Accordingly, SiOC films having various composition ratios and film qualities can be formed with high versatility and high reproducibility using a single substrate processing apparatus. Furthermore, a degree of freedom of operating the apparatus with respect to the addition or replacement of a type of gas or the like may be secured.

(f) Further, the substrate processing apparatus according to this embodiment has a plurality of process recipes for different types of precursor gases or catalytic gases, i.e., for different gas systems. In addition, the substrate processing apparatus according to this embodiment has a plurality of process recipes in which supply amounts, flow rates or the like of catalytic gases are set to different numerical values. That is, the substrate processing apparatus according to this embodiment has a plurality of process recipes for different processing conditions. Thus, a specific precursor gas or catalytic gas, among a plural type of gases, may be selected and supplied according to a desired film composition, and also, adjusting a supply amount, a partial pressure and a flow rate ratio of the catalytic gas may be facilitated. The operator may properly select an appropriate process recipe, among the plurality of process recipes, to execute the film formation processing according to a desired film composition and the like. Thus, SiOC films having various composition ratios and film qualities can be formed with high versatility and high reproducibility using a single substrate processing apparatus. In addition, an operation burden (burden of inputting processing order, processing conditions or the like)

of the operator may be reduced, and thus, processing of the substrate may be rapidly initiated while avoiding a manipulation error.

Moreover, according to this embodiment, the SiOC film is formed at a low temperature equal to or lower than 200 degrees C. Thus, since the precursor gas having the Si—C bonding is used under the low temperature condition, the C concentration in the thin film may be increased or may be controlled with high precision.

(4) Modifications of Embodiment

Figure 7A:
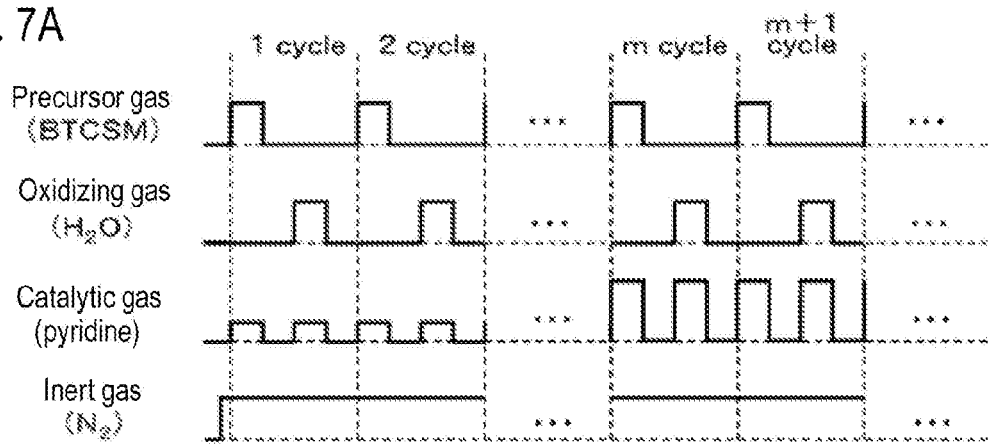
FIGS. 7A, 7B, and 7C are views illustrating gas supply timings in a film forming sequence according to modifications of the first embodiment of the present disclosure, FIG. 7A being a view illustrating a modification 1, FIG. 7B being a view illustrating a modification 2, and FIG. 7C being a view illustrating a modification 3.
Figure 7B:
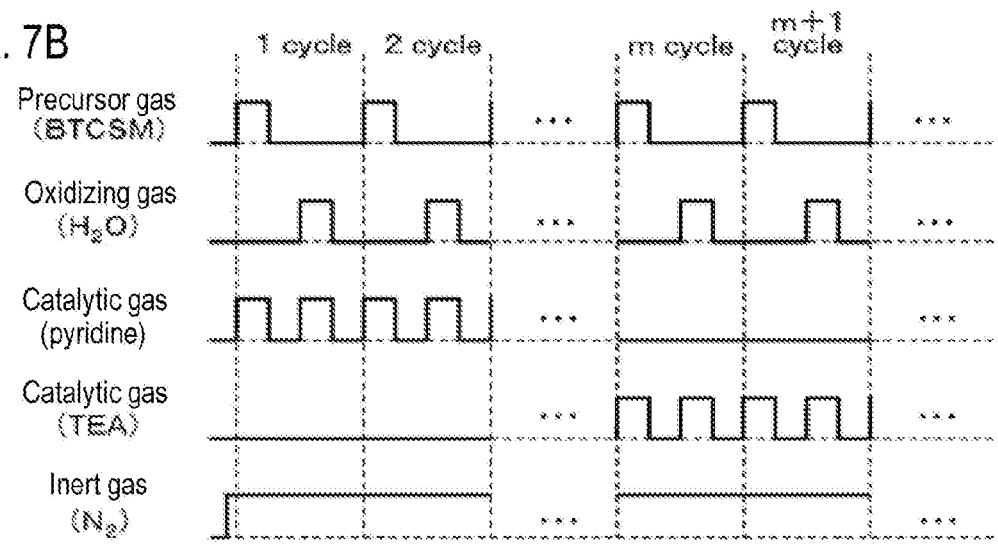
Figure 7C:
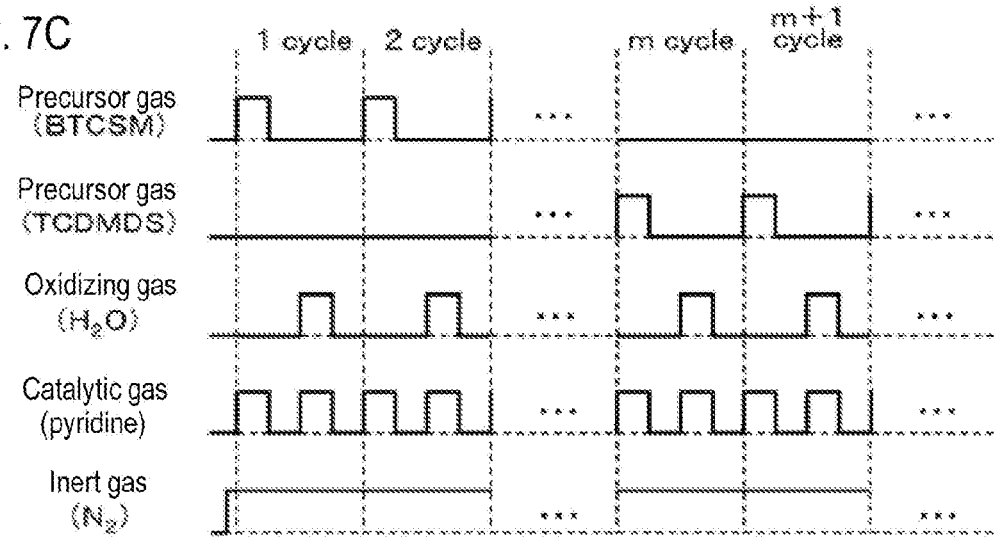

Next, modifications of this embodiment will be described with reference to FIGS. 7A, 7B and 7C. FIGS. 7A, 7B, and 7C are views illustrating gas supply timings in a film forming sequence according to modifications of this embodiment, in which FIG. 7A is a view illustrating a modification 1, FIG. 7B is a view illustrating a modification 2, and FIG. 7C is a view illustrating a modification 3.

As illustrated in FIG. 7A, in a film forming sequence of the modification 1, the cycle of Steps 1a and 2a is performed a predetermined number of times in the process of forming the SiOC film, and a supply amount of the pyridine gas supplied in the process of supplying the H$_2$O and the pyridine gas is changed, for example, in the m-th cycle, while the cycle is performed a predetermined number of times.

Accordingly, the C concentration in the SiOC film may be changed in film thickness direction. In the example of FIG. 7A, a supply amount of the pyridine gas is changed from a low flow rate to a high flow rate, and thus, the C concentration in an upper layer (side distant from the wafer 200) of the SiOC film may be reduced, relative to the C concentration in a lower layer (side close to the wafer 200). Conversely, the supply amount of the pyridine gas may be changed from a high flow rate to a low flow rate. Also, the supply amount of the pyridine gas may be changed only one or more times according to a desired film composition. At this time, the supply amount of the pyridine gas may be increased from a low flow rate to a high flow rate in a stepwise manner, may be decreased from a high flow rate to a low flow rate in a stepwise manner, or may be changed alternately between appropriate combinations of flow rates.

Further, as illustrated in FIG. 7B, in a film forming sequence of the modification 2, the cycle of Steps 1a and 2a is performed a predetermined number of times in the process of forming the SiOC film, and a type of catalytic gas supplied in the process of supplying the H$_2$O gas and the catalytic gas is changed, for example, from the pyridine gas to the TEA gas in the m-th cycle, while the cycle is performed a predetermined number of times.

Thus, the C concentration in the SiOC film may be changed in the film thickness direction. In the example of FIG. 7B, the pyridine gas is changed to the TEA gas having relatively strong catalytic action to the initially used pyridine gas, and thus, the C concentration in an upper layer (side distant from the wafer 200) of the SiOC film may be reduced, relative to the C concentration in a lower layer (side close to the wafer 200). Without being limited to the example of FIG. 7B, the type of catalytic gas may be changed only one or more times, according to a desired film composition. Also, two or three or more types of catalytic gases may be used. A combination or order of catalytic gases in use may be set arbitrarily.

As illustrated in FIG. 7C, in a film forming sequence of the modification 3, the cycle of Steps 1a and 2a is performed a predetermined number of times in the process of forming the SiOC film, and a type of precursor gas supplied in the process of supplying the precursor gas and the pyridine gas is changed, for example, from the BTCSM gas to the TCDMDS gas in the m-th cycle, while the cycle is performed a predetermined number of times.

Hereinafter, the supply order of the TCDMDS gas to the wafer 200 will now be described. The supply order or processing conditions of the BTCSM gas, the H$_2$O gas, the pyridine gas and the like are the same as those of the foregoing embodiment, and therefore, a description thereof will be omitted.

The valve 243e of the second precursor gas supply pipe 232e is opened to flow the TCDMDS gas into the second precursor gas supply pipe 232e. A flow rate of the TCDMDS gas flowing into the second precursor gas supply pipe 232e is controlled by the MFC 241e. The flow-rate-controlled TCDMDS gas is supplied into the process chamber 201 through the gas supply holes 250a of the first nozzle 249a, and exhausted through the exhaust pipe 231. In this way, the TCDMDS gas is supplied to the wafer 200 (TCDMDS gas supply). At this time, the valve 243i is opened to flow an inert gas such as the N$_2$ gas into the first inert gas supply pipe 232i. A flow rate of the N$_2$ gas flowing into the first inert gas supply pipe 232i is controlled by the MFC 241i. The flow-rate-controlled N$_2$ gas is supplied together with the TCDMDS gas into the process chamber 201, and exhausted through the exhaust pipe 231.

The pyridine gas is supplied together with the TCDMDS gas to the wafer 200 to weaken bonding strength of the O—H bonding existing on the surface of the wafer 200 to accelerate decomposition of the TCDMDS gas and accelerate the formation of the Si-containing layer containing C and Cl through chemisorption of TCDMDS molecules. In this manner, the pyridine gas also exhibits a catalytic action with respect to the TCDMDS gas, like the case of the BTCSM gas.

Also, processing conditions such as the internal pressure of the process chamber 201, the supply flow rate and supply time of each gases including the precursor gas, the catalytic gas, the N$_2$ gas and the like, and a temperature of the wafer 200 may be within the same range as those of the foregoing embodiment, for example. Also, when the TCDMDS gas and the pyridine gas is supplied, the N$_2$ gas is supplied to prevent infiltration of the TCDMDS gas and the pyridine gas to the nozzle 249b which is not in use, as in the foregoing embodiment.

As described above, while the cycle of Steps 1a and 2a is performed a predetermined number of times, the C concentration in the SiOC film may be changed in the film thickness direction by changing a type of the precursor gas. In the example of FIG. 7C, the precursor gas is changed from the initially used BTCSM gas to the TCDMDS gas, and thus, the C concentration in an upper layer (side distant from the wafer 200) of the SiOC film may be reduced, relative to the C concentration in a lower layer (side close to the wafer 200), for example. Without being limited to the example of FIG. 7C, a type of precursor gas may be changed only one or more times according to a desired film composition. Also, two or three or more types of precursor gases may be used. A combination of precursor gases in use may be arbitrarily selected from precursor gases containing Si, C and a halogen element and having an Si—C bonding. The usage order of precursor gases may be set arbitrarily.

As described above, as in the modifications illustrated in FIGS. 7A to 7C, the C concentration, the Si concentration or the O concentration in the SiOC film may be appropriately controlled in the film thickness direction by changing the C concentration in the SiOC film in the film thickness direction, thus further easily obtaining the SiOC film having a desired composition. Accordingly, SiOC films having different etching resistance in the film thickness direction, for example, may be obtained.

Second Embodiment

Next, a second embodiment of the present disclosure will be described.
(1) Multi-Layered Film Forming Process
In the foregoing first embodiment, the example of forming the SiOC film by performing the cycle including Steps 1a and 2a a predetermined number of times has been described. In this embodiment, in addition to the foregoing process of forming the SiOC film, a step of supplying a chlorosilane-based precursor gas different from that used in the foregoing process and a catalytic gas to the wafer 200, and a step of supplying an oxidizing gas and a catalytic gas to the wafer 200 are performed a predetermined number of times. Thus, a multi-layered film including an SiOC film and a different type of silicon oxide film (an $SiO_2$ film, hereinafter, referred to as "SiO film") from the SiOC film is formed.

Figure 8:
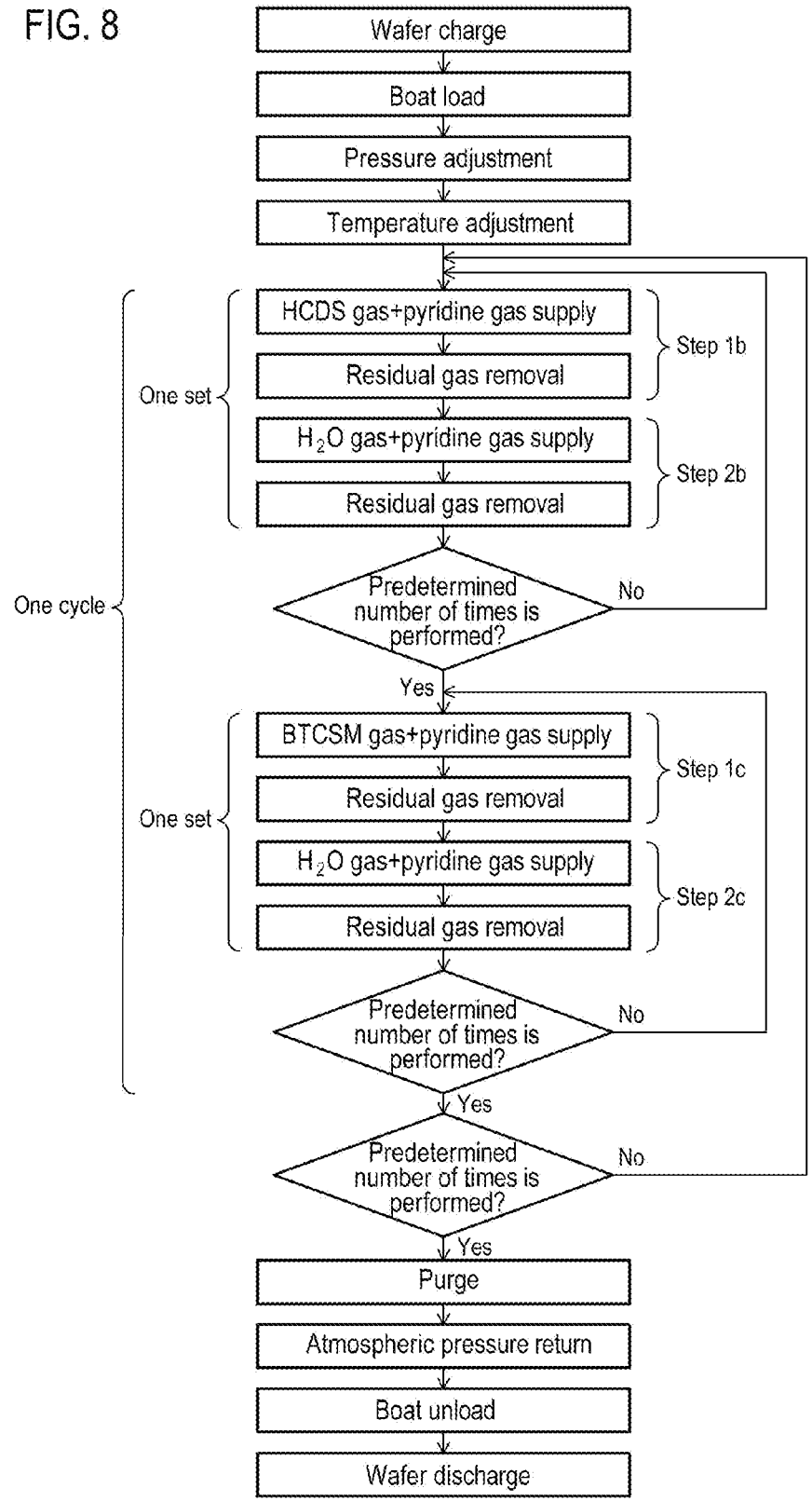
FIG. 8 is a flow chart illustrating a flow of film formation in a film forming sequence according to a second embodiment of the present disclosure.
Figure 9A:
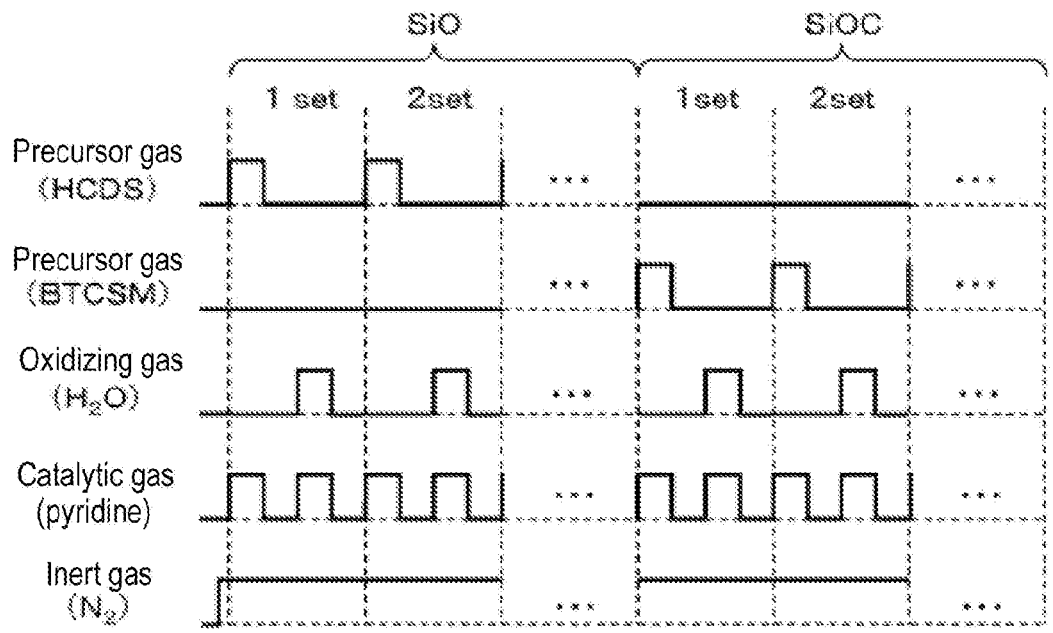
FIGS. 9A and 9B are views illustrating gas supply timings in the film forming sequence according to the second embodiment of the present disclosure, FIG. 9A being a view illustrating an example of a stacked film forming sequence and FIG. 9B being a view illustrating an example of a laminated film forming sequence.
Figure 9B:
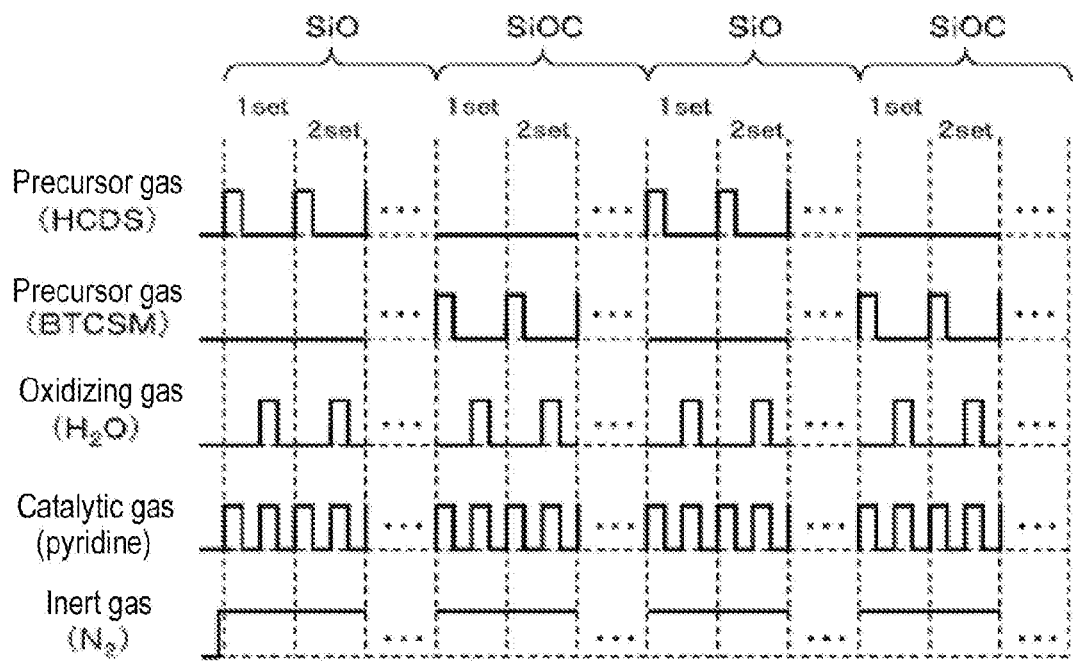

Hereinafter, a film forming sequence according to this embodiment will be described with reference to FIGS. 8, 9A and 9B. FIG. 8 is a view illustrating a procedural flow in a film forming sequence according to this embodiment. FIGS. 9A and 9B are views illustrating gas supply timings in the film forming sequence according to this embodiment, in which FIG. 9A is a view illustrating an example of a sequence of forming a stack film and FIG. 9B is a view illustrating an example of a sequence of forming a laminate film. In this embodiment, the substrate processing apparatus illustrated in FIGS. 1 and 2 is used, as in the foregoing embodiment. In the following description, operations of respective elements constituting the substrate processing apparatus are controlled by the controller 121

In the film forming sequence according to this embodiment, a multi-layered film of the SiO film and the SiOC film is formed on the wafer 200 by performing a cycle a predetermined number of times. The cycle includes: a process of forming a silicon oxide film (an SiO film) as a first thin film containing silicon (Si) and oxygen (O) by performing a set of processes a predetermined number of times, the processes including a process of supplying an HCDS gas as a precursor gas containing a silicon (Si) and a halogen element and a pyridine gas as a catalytic gas to the wafer 200 (Step 1b) and a process of supplying an $H_2O$ gas as an oxidizing gas and a pyridine gas as a catalytic gas to the wafer 200 (Step 2b); and a process of forming a silicon oxycarbide film (an SiOC film) as a second thin film containing silicon (Si), oxygen (O) and carbon (C) by performing a set of processes a predetermined number of times, the processes including a process of supplying a BTCSM gas as a precursor gas, which contains silicon (Si), carbon (C) and a halogen element and has a Si—C bonding, and a pyridine gas as a catalytic gas to the wafer 200 (Step 1c) and a process of supplying a $H_2O$ gas as an oxidizing gas and a pyridine gas as a catalytic gas to the wafer 200 (Step 2c).
(SiO Film Forming Process)
After performing the wafer charging, the boat loading, the pressure adjustment and the temperature adjustment, the following two Steps 1b and 2b are sequentially executed.
[Step 1b]
(Supply of HCDS Gas+Pyridine Gas)
The valve 243f of the third precursor gas supply pipe 232f is opened to flow the HCDS gas into the third precursor gas supply pipe 232f. A flow rate of the HCDS gas flowing into the third precursor gas supply pipe 232f is controlled by the MFC 241f. The flow-rate-controlled HCDS gas is supplied into the process chamber 201 through the gas supply holes 250a of the first nozzle 249a, and exhausted through the exhaust pipe 231. In this way, the HCDS gas is supplied to the wafer 200 (HCDS gas supply). At this time, the valve 243i is opened to flow an inert gas such as the $N_2$ gas into the first insert gas supply pipe 232i. A flow rate of the $N_2$ gas flowing into the first inert gas supply pipe 232i is controlled by the MFC 241i. The flow-rate-controlled $N_2$ gas is supplied together with the HCDS gas into the process chamber 201, and exhausted through the exhaust pipe 231.

In the aforementioned manner, the HCDS gas is supplied to the wafer 200 to form the Si-containing layer containing Cl and having a thickness, for example, from below one atomic layer to several atomic layers on the wafer 200 (on the base film of the surface) as a first layer. The Si-containing layer containing Cl may be an Si layer containing Cl, may be an adsorption layer of the HCDS gas, or may include the both.

Here, the Si layer containing Cl generally includes a discontinuous layer as well as a continuous layer formed of Si and containing Cl, or the Si thin film containing Cl formed by overlapping these layers. In some cases, the continuous layer formed of Si and containing Cl may also be referred as the Si thin film containing Cl. Also, Si constituting the Si layer containing Cl includes Si whose bonding to Cl is completely broken as well as Si whose bonding to Cl is not completely broken.

Here, the adsorption layer of the HCDS gas includes a continuous chemisorption layer of the HCDS gas molecules and a discontinuous chemisorption layer of the HCDS gas molecules, as well. The adsorption layer of the HCDS gas includes a chemisorption layer having a thickness equal to or less than one molecular layer formed of HCDS molecules. In addition, the HCDS ($Si_2Cl_6$) molecules constituting the adsorption layer of the HCDS gas include molecules in which the Si—C bonding is partially broken, as well as those represented by the chemical structural formula in FIG. 12E.

Further, a pyridine gas is supplied to the wafer 200 in the same supply order as that of the foregoing embodiment. The pyridine gas is supplied together with the HCDS gas to the wafer 200 to weaken the bonding strength of the O—H bonding present on the surface of the wafer 200 to accelerate decomposition of the HCDS gas and accelerate the formation of the Si-containing layer containing Cl through chemisorption of HCDS molecules. In this manner, the pyridine gas also exhibits a catalytic action with respect to the HCDS gas, like the case of the BTCSM gas described above.

At this time, the internal pressure of the process chamber 201, the supply flow rate and the supply time of each of the precursor gas, the catalytic gas, the $N_2$ gas, a temperature of the wafer 200, and the like may be within the same range as those of the foregoing embodiment, for example. In addition, when the HCDS gas and the pyridine gas are supplied, the $N_2$ gas is supplied to prevent infiltration of the HCDS gas and the pyridine gas to the nozzle 249b which is not in use, as in the foregoing embodiment.
(Removal of Residual Gas)
After the Si-containing layer containing Cl is formed as the first layer on the wafer 200, the valve 243f of the third precursor gas supply pipe 232f is closed to stop the supply of the HCDS gas. Also, the supply of the pyridine gas is stopped and a residual gas is removed from the process chamber 201 in the same order as that of the foregoing embodiment.

[Step 2b]

(Supply of $H_2O$ Gas+Pyridine Gas)

After Step 1b is terminated and a residual gas is removed from the process chamber 201, the $H_2O$ gas and the pyridine gas are supplied to the wafer 200 in the same supply order as that of the foregoing embodiment. The $H_2O$ gas supplied to the wafer 200 is activated by heat and decomposition thereof is accelerated by the pyridine gas to react with at least a portion of the first layer (Si-containing layer containing Cl) formed on the wafer 200 in Step 1b. Thus, the first layer is thermally oxidized with non-plasma so as to be modified into a second layer containing Si and O, i.e., a silicon oxide layer (SiO) layer.

At this time, processing conditions such as the internal pressure of the process chamber 201, the supply flow rate and supply time of each of the oxidizing gas, the catalytic gas, the $N_2$ gas, and a temperature of the wafer 200 may be within the same range as those of the foregoing embodiment, for example. In addition, when the $H_2O$ gas and the pyridine gas is supplied, the $N_2$ gas is supplied to prevent infiltration of the $H_2O$ gas and the pyridine gas to the nozzle 249a which is not in use, as in the foregoing embodiment.

(Removal of Residual Gas)

Thereafter, the supply of the $H_2O$ gas and the pyridine gas is stopped in the same order as that of the foregoing embodiment, and a residual gas is removed from the process chamber 201.

(Performing Predetermined Number of Times)

The foregoing Steps 1b and 2b may be taken as one set, and this set may be performed once or more (a predetermined number of times) to form the SiO film having a predetermined composition and a predetermined film thickness on the wafer 200. In some embodiments, the foregoing set is repeated a predetermined number of times. That is, in some embodiments, a thickness of the SiO layer formed per set is set to be smaller than a desired film thickness and the foregoing set is repeated a predetermined number of times until a desired film thickness is obtained.

(SiOC Film Forming Process)

In the SiOC film forming process, Steps 1c and 2c are sequentially executed in the same order and under the same process conditions as those of Steps 1a and 2a of the foregoing embodiment. The related Steps 1c and 2c may be taken as one set and this set may be performed once or more (a predetermined number of times) to form the SiOC film having a predetermined composition and a predetermined film thickness on the wafer 200.

(Performing Predetermined Number of Times)

An SiO film forming process in which the foregoing Steps 1b and 2b are taken as one set and this set is performed a predetermined number of times and an SiOC film forming process in which Steps 1c and 2c are taken as one set and this set is performed a predetermined number of times are set as one cycle, and this cycle is performed once or more (a predetermined number of times) to form a multi-layered film of the SiO film and the SiOC film on the wafer 200. Either the SiO film forming process or the SiOC film forming process may initiate the cycle.

As illustrated in FIG. 9A, by performing the cycle including the SiO film forming process and the SiOC film forming process once, a multi-layered film (stacked film) where a single SiO film and a single SiOC film are stacked may be formed.

Alternatively, as illustrated in FIG. 9B, by performing the cycle including the SiO film forming process and the SiOC film forming process a predetermined number of times, a multi-layered film (laminated film) where a plurality of SiO films and a plurality of SiOC films are stacked may be formed.

In any case, the number of the set including Steps 1b and 2b and the number of the set including Steps 1c and 2c included in one cycle may be the same or different from each other according to a desired ratio between the film thicknesses of the SiO film and the SiOC film. By alternately performing the respective sets the same number of times, a multi-layered film having an approximately equal film thickness ratio of the SiO film and the SiOC film may be formed. Alternatively, by performing the respective sets different number of times, a multi-layered film having unequal film thickness ratio of the SiO film and the SiOC film may be formed.

(2) Modification of Embodiment

Figure 11A:
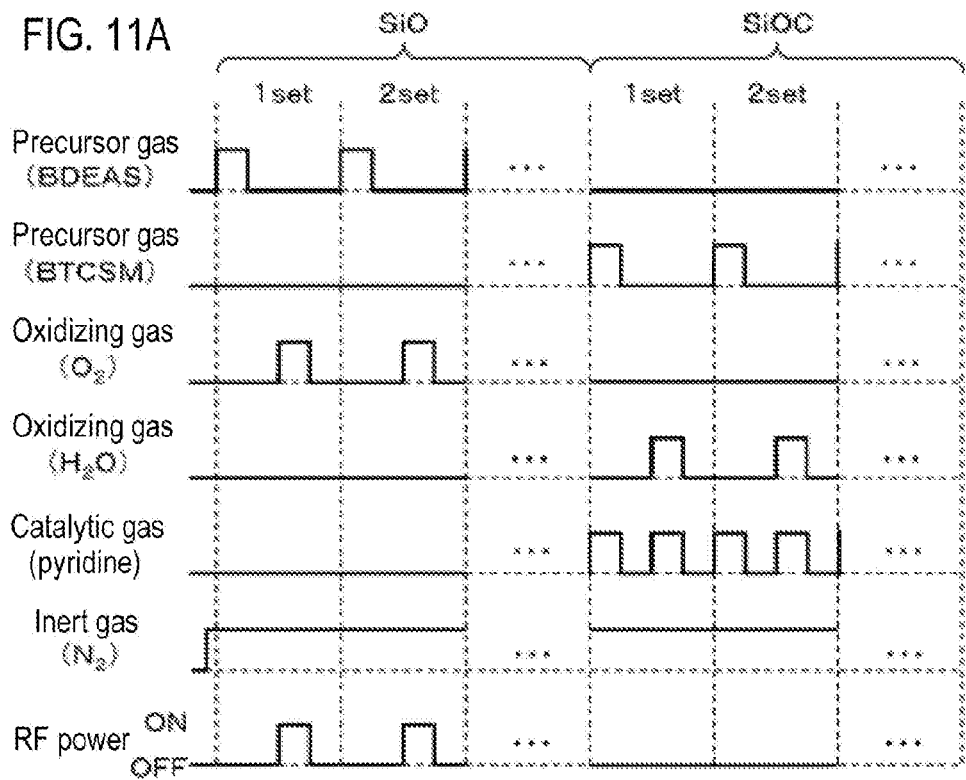
FIGS. 11A and 11B are views illustrating timings of gas supply and RF power supply in the film forming sequence according to the modification of the second embodiment of the present disclosure, FIG. 11A being a view illustrating an example of a stacked film forming sequence and FIG. 11B being a view illustrating an example of a laminated film forming sequence.
Figure 11B:
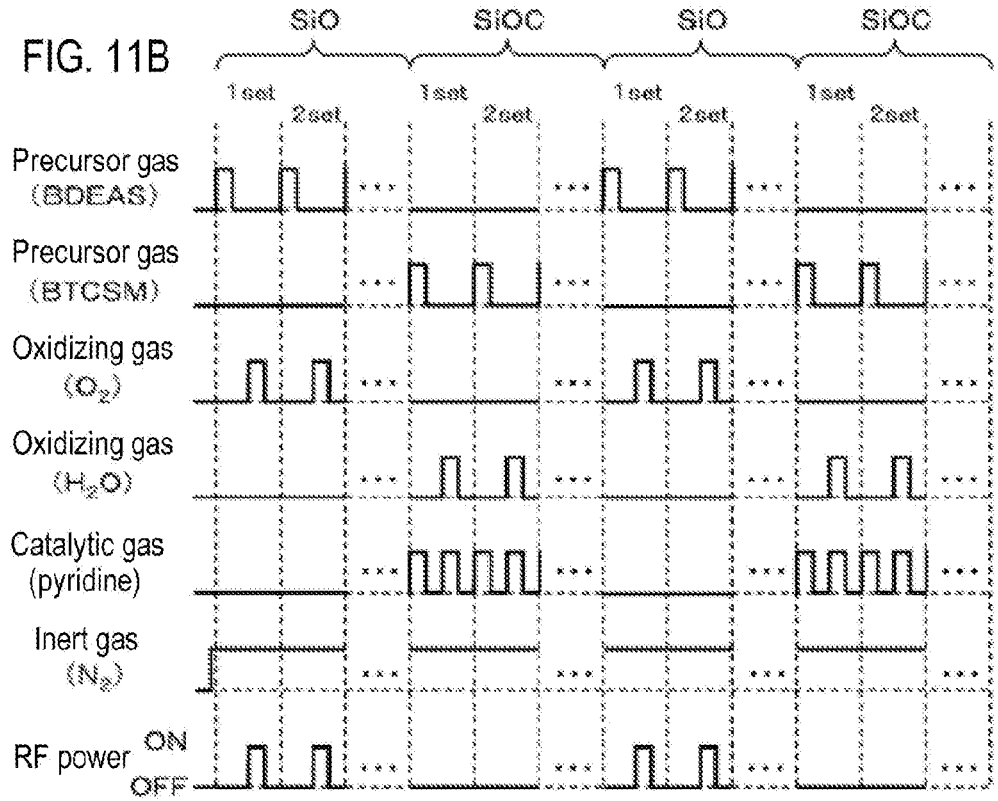

In this embodiment, the example, in which the SiO film is formed by using the HCDS gas and the H2O gas together with the catalytic gas and a multi-layered film of the SiO film and the SiOC film is formed, has been described. In a modification of this embodiment, an example, in which the SiO film is formed by using a precursor gas different from that used in the foregoing example and an oxidizing gas excited by plasma, without using a catalytic gas, and a multi-layered film of the SiO film and the SiOC film is formed, will be described with reference to FIGS. 10, 11A and 11B. FIG. 10 is a flow chart illustrating a flow of film formation in a film forming sequence according to a modification of this embodiment. FIGS. 11A and 11B are views illustrating timings of a gas supply and a RF power supply in the film forming sequence according to the modification of this embodiment, in which FIG. 11A is a view illustrating an example of a sequence of forming a stack film and FIG. 11B is a view illustrating an example of a sequence of forming a laminate film.

In the film forming sequence of the modification, a multi-layered film of the SiO film and the SiOC film is formed on the wafer 200 by performing a cycle a predetermined number of times. The cycle includes: a process of forming a silicon oxide film (SiO film) as a first thin film containing silicon (Si) and oxygen (O) by performing a set of processes a predetermined number of times, the processes including a process of supplying a BDEAS gas as a precursor gas containing silicon (Si), carbon (C) and nitrogen (N) and having Si—N bonding to the wafer 200 (Step 1d) and a process of supplying an $O_2$ gas excited by plasma as an oxidizing gas excited by plasma to the wafer 200 (Step 2d); and a process of forming a silicon oxycarbide film (SiOC film) as a second thin film containing silicon (Si), oxygen (O) and carbon (C) by performing a set of processes a predetermined number of times, the processes including a process of supplying a BTCSM gas as a precursor gas, which contains silicon (Si), carbon (C) and a halogen element and has a Si—C bonding, and a pyridine gas as a catalytic gas to the wafer 200 (Step 1e) and a process of supplying an $H_2O$ gas as an oxidizing gas and a pyridine gas as a catalytic gas to the wafer 200 (Step 2e).

(SiO Film Forming Process)

After performing the wafer charging, the boat loading, the pressure adjustment and the temperature adjustment, the following two Steps 1d and 2d are sequentially executed.

[Step 1d]
(Supply of BDEAS Gas)

The valve 243g of the fourth precursor gas supply pipe 232g is opened to flow the BDEAS gas into the fourth precursor gas supply pipe 232g. A flow rate of the BDEAS gas flowing into the fourth precursor gas supply pipe 232g is controlled by the MFC 241g. The flow-rate-controlled BDEAS gas is supplied into the process chamber 201 through the gas supply holes 250a of the first nozzle 249a, and exhausted through the exhaust pipe 231. In this way, the BDEAS gas is supplied to the wafer 200 (BDEAS gas supply). At this time, the valve 243i is opened to flow an inert gas such as the $N_2$ gas into the first insert gas supply pipe 232i. A flow rate of the $N_2$ gas flowing into the first inert gas supply pipe 232i is controlled by the MFC 241i. The flow-rate-controlled $N_2$ gas is supplied together with the BDEAS gas into the process chamber 201, and exhausted through the exhaust pipe 231.

At this time, in order to prevent infiltration of the BDEAS gas into the buffer chamber 237, the second nozzle 249b and the third nozzle 249c, the valves 243j and 243k are opened to flow the $N_2$ gas into the second inert gas supply pipe 232j and the third inert gas supply pipe 232k. The $N_2$ gas is supplied to the process chamber 201 through the first oxidizing gas supply pipe 232b, the first catalytic gas supply pipe 232c, the second nozzle 249b, the third nozzle 249c and the buffer chamber 237, and exhausted through the exhaust pipe 231.

In the aforementioned manner, the BDEAS gas is supplied to the wafer 200 to form an Si-containing layer containing N and C and having a thickness, for example, from below one atomic layer to several atomic layers on the wafer 200 (the base film of the surface) as a first layer. The Si-containing layer containing N and C may be the Si layer containing N and C, may be an adsorption layer of the BDEAS gas, or may include the both.

Here, the Si layer containing N and C generally includes a discontinuous layer as well as a continuous layer formed of Si and containing N and C, or the Si thin film containing N and C formed by overlapping these layers. In some cases, a continuous layer formed of Si and containing N and C may also be considered as the Si thin film containing N and C. Also, Si constituting the Si layer containing N and C includes Si whose bonding to N is completely broken as well as Si whose bonding to N is not completely broken.

Here, the adsorption layer of the BDEAS gas includes a continuous chemisorption layer of the BDEAS gas molecules and a discontinuous chemisorption layer of the BDEAS gas molecules, as well. That is, the adsorption layer of the BDEAS gas includes a chemisorption layer having a thickness equal to or less than one molecular layer formed of BDEAS molecules. Also, the BDEAS ($Si[N(C_2H_5)_2]_2H_2$) molecules constituting the adsorption layer of the BDEAS gas includes molecules in which bonding between Si and N, between Si and H, and between N and C is partially broken, as well as those represented by the chemical structural formula in FIG. 12F. That is, the adsorption layer of the BDEAS gas includes a chemisorption layer of BDEAS molecules and a physisorption layer of BDEAS molecules.

The BDEAS gas is easily adsorbed onto the wafer 200 or the like, and has high decomposability and reactivity. Thus, the BDEAS gas may react even under a relatively low temperature condition, for example, equal to or lower than 200 degrees C., without using the catalytic gas such as the pyridine gas, to form the Si-containing layer containing N and C on the wafer 200.

Processing conditions such as the internal pressure of the process chamber 201, the supply flow rate and supply time of each of the precursor gas, the $N_2$ gas and the like, and the temperature of the wafer 200 may be set within the same range as those of the foregoing embodiment, for example.

(Removal of Residual Gas)

After the Si-containing layer containing N and C is formed as the first layer on the wafer 200, the valve 243g of the fourth precursor gas supply pipe 232g is closed to stop the supply of the BDEAS gas. The residual gas is removed from the process chamber 201 in the same order as that of the foregoing embodiment.

[Step 2d]
(Supply of $O_2$ Gas)

After Step 1d is terminated and the residual gas within the process chamber 201 is removed, the valve 243d of the second oxidizing gas supply pipe 232d is opened to flow the $O_2$ gas into the second oxidizing gas supply pipe 232d. The $O_2$ gas flows through the second oxidizing gas supply pipe 232d and a flow rate thereof is controlled by the MFC 241d. The flow-rate-controlled $O_2$ gas is supplied into the buffer chamber 237 through the gas supply holes 250b of the second nozzle 249b. At this time, the RF power is applied between the first rod-shaped electrode 269 and the second rod-shaped electrode 270 from the RF power source 273 through the matching unit 272, whereby the $O_2$ gas supplied into the buffer chamber 237 is plasma-excited and supplied as active species into the process chamber 201 through the gas supply holes 250d, and exhausted through the exhaust pipe 231. In this way, the $O_2$ gas activated (excited) by plasma is supplied to the wafer 200 ($O_2$ gas supply). At this time, the valve 243j is opened to flow the $N_2$ gas as an inert gas into the second inert gas supply pipe 232j. A flow rate of the $N_2$ gas flowing into the second inert gas supply pipe 232j is controlled by the MFC 241j. The flow-rate-controlled $N_2$ gas is supplied together with the $O_2$ gas into the process chamber 201 and exhausted through the exhaust pipe 231.

At this time, in order to prevent infiltration of the $O_2$ gas into the first nozzle 249a and the third nozzle 249c, the valves 243i and 243k are opened to flow the $N_2$ gas into the first inert gas supply pipe 232i and the third inert gas supply pipe 232k. The $N_2$ gas is supplied into the process chamber 201 through the first precursor gas supply pipe 232a, the first catalytic gas supply pipe 232c, the first nozzle 249a and the third nozzle 249c, and exhausted through the exhaust pipe 231.

In the aforementioned manner, even though the internal temperature of the process chamber 201 is relatively low, for example, lower than 200 degrees C., the $O_2$ gas may be activated by using plasma, without using a catalytic gas such as a pyridine gas, for example.

The gas flowing into the process chamber 201 is an $O_2$ gas excited by plasma and containing active species such as oxygen radical ($O_2^*$), for example. At this time, the BDEAS gas does not flow into the process chamber 201. Thus, the $O_2$ gas is supplied in an activated state to the wafer 200 without causing a gas phase reaction, and the Si-containing layer containing N and C formed on the wafer 200 in Step 1d is mainly oxidized by the active species. Energy of the active species is higher than bonding energy of the Si—N bonding and Si—H bonding included in the Si-containing layer containing N and C. Thus, by providing the energy of the active species to the Si-containing layer containing N and C, the Si—N bonding and Si—H bonding included in the Si-containing layer are separated. N and H which are separated from Si and C bonded to N are removed from the Si-containing layer containing N and C and discharged as $N_2$, $H_2$, $CO_2$ or the like. Also, the bonding electrons of Si remaining as N and H are separated from Si are connected to O contained in the active species, thereby forming the Si—O bonding. In this way, the Si-containing layer containing N and C as the first layer may be modified into a second layer containing Si and O, i.e., the SiO layer.

At this time, the internal pressure of the process chamber 201, the supply flow rate and supply time of each oxidizing gas, the $N_2$ gas and the like, a temperature of the wafer 200, and the like may be set within the same range as those of the foregoing embodiment, for example. Also, the RF power applied between the first rod-shaped electrode 269 and the second rod-shaped electrode 270 from the RF power source 273 is set to fall within a range of, for example, 50 to 1000 W.

(Removal of Residual Gas)

After the SiO layer is formed as the second layer on the wafer 200, the valve 243d of the second oxidizing gas supply pipe 232d is closed to stop the supply of the $O_2$ gas. Also, the residual gas is removed from the process chamber 201 in the same order as that of the foregoing embodiment.

(Performing Predetermined Number of Times)

The foregoing Steps 1d and 2d may be taken as one set, and this set may be performed once or more (a predetermined number of times) to form the SiO film having a predetermined composition and a predetermined film thickness on the wafer 200. In some embodiments, the foregoing set is repeated a predetermined number of times. That is, in some embodiments, a thickness of the SiO layer formed per set is set to be smaller than a desired film thickness and the foregoing set is repeated a predetermined number of times until a desired film thickness is obtained.

(SiOC Film Forming Process and Performing Predetermined Number of Times)

The SiOC film forming process and performing each process a predetermined number of times may be performed in the same order and the same process order as those of the foregoing embodiment. That is, an SiO film forming process in which Steps 1d and 2d are taken as one set and this set is performed a predetermined number of times, and an SiOC film forming process in which Steps 1e and 2e are taken as one set, like Steps 1a and 2a of the foregoing embodiment, and this set is performed a predetermined number of times are set as one cycle, and this cycle is performed once or more (a predetermined number of times) to form a multi-layered film of the SiO film and the SiOC film on the wafer 200.

As illustrated in FIG. 11A, by performing the cycle including the SiO film forming process and the SiOC film forming process once, a single SiO film and a single SiOC film may be stacked to form a multi-layered film (stacked film).

Alternatively, as illustrated in FIG. 11B, by performing the cycle including the SiO film forming process and the SiOC film forming process a predetermined number of times, a multi-layered film (laminated film) formed by stacking a plurality of SiO films and a plurality of SiOC films may be formed.

In this modification, the order of the respective sets including Steps 1d, 2d, 1e and 2e, the number of the respective sets, and the like may be arbitrarily determined according to a desired ratio of film thickness of the SiO film and the SiOC film.

Other Embodiments

While the embodiments of the present disclosure have been described in detail so far, the present disclosure is not limited to the foregoing embodiments or modifications and may be modified variously within the scope of the present disclosure.

For example, in Steps 2a, 2c and 2e of the foregoing embodiments, the Si-containing layer containing C and Cl is modified to the SiOC layer by using the oxidizing gas such as the $H_2O$ gas together with the catalytic gas, but the Si-containing layer containing C and Cl may be modified to the SiOC layer by using an oxidizing gas such as $O_2$ gas excited by plasma.

Further, in the foregoing embodiments, the SiOC film is formed by using an oxidizing gas such as $H_2O$ gas, but the present disclosure is not limited thereto. For example, the Si-containing layer containing C and Cl may be nitrided by using a nitriding gas containing nitrogen (N) to form an SiOCN film. Alternatively, a silicon-based insulating film (Si-based insulating film) such as SiOCN film may be formed by appropriately combining an oxidizing gas and a nitriding gas. As the nitriding gas, an ammonia ($NH_3$) gas, a diagene ($N_2H_2$) gas, a hydrazine ($N_2H_4$) gas, an $N_3H_8$ gas, the gas containing a compound thereof may be used, for example.

In the foregoing embodiments, the chlorosilane-based precursor gas is used as a precursor gas to form the SiOC film or the SiO film, but besides the chlorosilane-based precursor gas, a halosilane-based precursor gas, for example, a fluorosilane-based precursor gas, a bromosilane-based precursor gas may also be used. Here, the fluorosilane-based precursor gas is a silane-based precursor gas containing a fluoro group as a halogen group, and is a precursor gas containing at least silicon (Si) and fluorine (F). Further, the bromosilane-based precursor gas is a silane-based precursor gas containing a bromo group as a halogen group, and is a precursor gas containing at least silicon (Si) and bromine (Br).

As described above, the present disclosure may be appropriately applied to a case of forming a thin film such as the Si-based insulating film (an SiOC film, an SiCN film, or an SiOCN film) by using a precursor gas containing Si, C and a halogen element and having the Si—C bonding and the oxidizing gas.

By using the Si-based insulating film formed according to the foregoing embodiments or modifications as a side wall spacer, it is possible to provide a technique of forming a device having a small leakage current and excellent processibility.

In addition, by using the Si-based insulating film formed according to the foregoing embodiments or modifications as an etch stopper, it is possible to provide a technique of forming a device having excellent processibility.

According to the embodiments and modifications as described above, in case of using a catalytic gas, the Si-based insulating film having an ideal stoichiometry ratio (SR) may be formed without using plasma even at a low temperature region. Also, in the sense that the Si-based insulating film may be formed without plasma, the present disclosure may be applied to a process involving potential plasma damage such as an SADP film of a DPT, for example.

In addition, it is preferred that a plurality of process recipes (programs with processing procedures or processing conditions written) used in forming a variety of the thin films be individually prepared according to substrate processing types (the type of film to be formed, a composition ratio, a film quality, a film thickness and the like). In addition, when the substrate processing is initiated, it is preferred to appropriately select a suitable process recipe among the plurality of process recipes according to a substrate processing type. Specifically, it is preferred that the plurality of process recipes individually prepared according to substrate processing types be previously stored (installed) in the memory device 121c provided in the substrate processing apparatus through an electrical communication line or a recording medium (e.g., the external memory device 123) in which the process recipes are recorded. In addition, when the substrate processing is initiated, it is preferred that the CPU 121a provided in the substrate processing apparatus appropriately select a suitable process recipe among the plurality of process recipes stored in the memory device 121c according to a substrate processing type. With this configuration, thin films having a variety of film types, composition ratios, film qualities and film thicknesses can be formed with high versatility and high reproducibility in one substrate processing apparatus. In addition, since an operator's work load (a load of inputting processing procedures or processing conditions, or the like) can be reduced, it is possible to rapidly initiate the substrate processing while avoiding an operational error.

Here, the above-described process recipe is not limited to a newly prepared recipe and may be prepared, for example, by modifying an existing process recipe that is already installed in the substrate processing apparatus. When the process recipe is modified, the modified process recipe may be installed to the substrate processing apparatus through an electrical communication line or a recording medium in which the process recipe is recorded. In addition, the process recipe previously installed in the existing substrate processing apparatus may be directly changed by manipulating the input/output device 122 of the substrate processing apparatus.

Also, in the film forming sequence according to the above-described embodiments and the like, an example in which the SiOC film or the like is formed at room temperature has also been described. In this case, the inside of the process chamber 201 need not be heated by the heater 207, so that the substrate processing apparatus may not be provided with the heater. Accordingly, the configuration of the heating system of the substrate processing apparatus can be simplified, so that the substrate processing apparatus may have a more inexpensive and simple configuration.

Moreover, while it has been described as an example in the above-described embodiments and the like that a thin film is formed using a batch type substrate processing apparatus in which a plurality of substrates are processed at a time, the present disclosure is not limited thereto but may be applied to a case in which a thin film is formed using a single-wafer type substrate processing apparatus in which one or several substrates are processed at a time. Although it has been described as an example in the above-described embodiments that the substrate processing apparatus having the hot wall type processing furnace is used to form a thin film, the present disclosure is not limited thereto but may be appropriately applied to a case in which a substrate processing apparatus having a cold wall type processing furnace is used to form a thin film.

The respective foregoing embodiments and modifications may be appropriately combined to be used.

EXAMPLES

As examples of the present disclosure, SiOC films were formed on a wafer on the basis of the film forming sequence according to the foregoing embodiments, in which a catalytic gas is supplied both in supplying a precursor gas and in supplying an oxidizing gas, by using the substrate processing apparatus according to the foregoing embodiments, and various characteristics of the respective SiOC films were evaluated. In the examples, a gas system and temperature conditions were appropriately varied.

FIGS. 14A to 14D are views illustrating results of the examples. FIG. 14A illustrates a table showing composition ratios, a refractive indices and wet etching rates (WER) of SiOC films formed by using different precursor gases, oxidizing gases, and catalytic gases. FIG. 14B is a graph showing an example of using a TCDMDS gas as a precursor gas. FIG. 14C is a graph showing an example of using a DCTMDS gas as a precursor gas. FIG. 14D is a graph showing an example of using a BTCSM gas as a precursor gas.

That is, respective items in the left end portion of the table of FIG. 14A denote used gas systems, and precursor gas/oxidizing gas/catalytic gas are shown in this order. For example, "TCDMDS/$O_3$/TEA" means that a TCDMDS gas is supplied as a precursor gas, an $O_3$ gas is supplied as an oxidizing gas, and a TEA gas is supplied as a catalytic gas both when the TCDMDS gas is supplied and when the $O_3$ gas is supplied. Also, in the table, composition ratios (Atomicratio)[%] of carbon (C), nitrogen (N), oxygen (O), silicon (Si) and chlorine (Cl) included in each SiOC film, a refractive index (R.I.) of each SiOC film in light having a predetermined wavelength, and WER[Å/min] by a solution containing hydrogen fluoride (HF) of 1% concentration (1% HF aqueous solution) of each SiOC film are shown. The composition ratios of the respective SiOC films were measured from a surface of each film in a film thickness direction using an XPS. Respective numerical values of the composition ratios are representative values in predetermined measurement depths. Refractive indices of the respective SiOC films were measured by an ellipsometer. WER of the respective SiOC films were calculated from film thicknesses of the SiOC films measured by the ellipsometer before and after the wet etching. A low WER indicates that the etching resistance of the SiOC film with respect to a HF aqueous solution is high, and a high WER indicates that the etching resistance of the SiOC film with respect to a HF aqueous solution is low.

The graphs of FIGS. 14B, 14C, and 14D denote composition ratios of the SiOC films formed using TCDMDS/$O_3$/Piperidine, DCTMDS/$O_3$/TEA, and BTCSM/$H_2O$/TEA in this order from the left, among the gas systems shown in the table, respectively. In the respective graphs, the horizontal axis indicates a measurement depth (Depth)[a.u.] in each SiOC film, and the measurement depth is increased from the left to the right while the vertical axis is considered as the uppermost surface of each SiOC film. In the respective graphs, the vertical axis indicates a composition ratio (Atomicratio)[%] in each SiOC film. A right side region of each graph in which the composition ratio of Si reaches approximately 100% corresponds to an internal region of a silicon wafer as a base of each SiOC film.

According to the table and graphs of FIGS. 14A to 14D, it can be seen that the SiOC film containing high C concentration is formed by using a precursor gas containing Si, C and a halogen element and having the Si—C bonding, a predetermined oxidizing gas, and a predetermined catalytic gas. Also, it can be seen that a refractive index of each film is approximately the same, and thus, a predetermined SiOC film is stably obtained. WER of the SiO film formed by using the HCDS gas as a comparative example was approximately 1000/min. In comparison, it can be seen that WER of all the SiOC films was sufficiently low and a desirable etching resistance was obtained.

FIG. 15 is a view illustrating results of examples of the present disclosure, in which a table shows film forming rates, refractive indices, and temperature dependency of WER of SiOC films formed by using a predetermined precursor gas, different types of oxidizing gases and catalytic gases.

Respective items in the left end portion of the table of FIG. 15 denote gas systems of an oxidizing gas and a catalytic gas used when a BTCSM gas was used as a precursor gas, and oxidizing gas-catalytic gas are shown in this order. For example, "$H_2O$-TEA" indicates that the BTCSM gas is supplied as a precursor gas, the $H_2O$ gas is supplied as an oxidizing gas, and the TEA gas is supplied as a catalytic gas both when the BTCSM gas is supplied and when the $H_2O$ gas is supplied. Further, in each column of the table, whether the SiOC film is formed or nor ("YES"/ "NO") and a film forming rate (cycle rate) of a formed film [/cycle] (in parenthesis), a refractive index (R.I.) of a formed film in light having a predetermined wavelength, and WER [/min] of a formed film by an 1% HF aqueous solution are shown sequentially from the above.

According to FIG. 15, it can be seen that, when the $H_2O$ gas and the TEA gas are used as an oxidizing gas and a catalytic gas, respectively, the SiOC film having a low WER is obtained at 70 degrees C. Also, it can be seen that when the $O_3$ gas and the TEA gas are used as an oxidizing gas and a catalytic gas, respectively, a film can be formed within a wide temperature range. However, it can be seen that a porous SiOC film containing moisture is formed at a low temperature equal to or lower than 50 degrees C., and the porous SiOC film has a high WER. It is considered that such high WER is obtained because the obtained SiOC film has a porous shape, in comparison to the fact that a thermal oxide film having a low WER has an amorphous shape. Further, it can be seen that an SiO film that rarely contains C is obtained at a high temperature equal to or higher than 100 degrees C. Also, it can be seen that, when the $H_2O$ gas or the $O_3$ gas is used as an oxidizing gas and the piperidine gas is used as a catalytic gas, salt due to the piperidine is deposited on the wafer at a low temperature equal to or lower than 50 degrees C., without forming the SiOC film ("NO"). Moreover, it can be seen that, when the $H_2O$ gas and the pyridine gas are used as an oxidizing gas and a catalytic gas, respectively, the SiOC film having a low WER is obtained at a temperature of 50 degrees C. Such the SiOC film has desirable film thickness and high uniformity of film quality in a wafer surface.

In this sense, within the range of the table of FIG. 15, it can be considered that the gas systems of the $H_2O$ gas and the pyridine gas with which the SiOC film having a low WER at the lowermost temperature of 50 degrees C. was obtained are the best. Further, it can be considered that the gas systems of the $H_2O$ gas and the TEA gas with which the SiOC film having a similar low WER at a low temperature of 70 degrees C. was obtained are second best. And, it can be considered that the gas systems of the $O_3$ gas and the TEA gas come next.

Figure 16A:
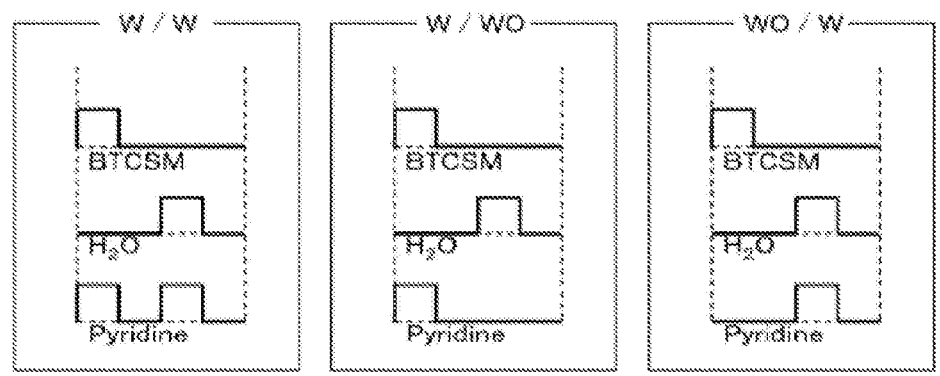
FIGS. 16A and 16B are views illustrating results of examples of the present disclosure, FIG. 16A showing gas supply timing diagrams and FIG. 16B being a graph showing effects of a pyridine gas over a BTCSM gas and an $H_2O$ gas in terms of SiOC film forming rates.
Figure 16B:
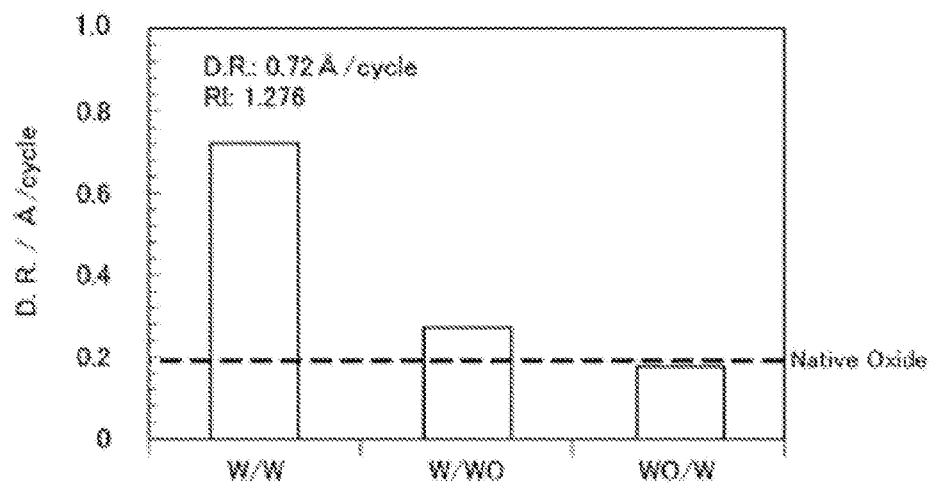

FIGS. 16A and 16B are views illustrating results of examples of the present disclosure, in which FIG. 16A is a gas supply timing diagram and FIG. 16B is a graph showing effects of a pyridine gas over a BTCSM gas and an $H_2O$ gas in terms of SiOC film forming rates.

The horizontal axis of the graph of FIG. 16B indicates evaluation samples wherein an example W/W in which the pyridine gas is supplied both when the BTCSM gas is supplied and when $H_2O$ gas is supplied, an example W/WO in which the pyridine gas is supplied only when the BTCSM gas is supplied but is not supplied when the $H_2O$ gas is supplied, and an example WO/W in which the pyridine gas is supplied only when the $H_2O$ gas is supplied but is not supplied when the BTCSM gas is supplied, are shown in order from the left side. The vertical axis of the graph indicates a film forming rate (D.R.) (cycle rate)[/cycle] of the SiOC film.

According to FIGS. 16A and 16B, it can be seen that the film forming rate was the lowest in the example WO/W, and the next lowest in the example W/WO. Meanwhile, it can be seen that the film forming rate was remarkably increased in the example W/W. In this sense, it can be seen that, if the pyridine gas is not supplied both when the BTCSM gas is supplied and when the $H_2O$ gas is supplied, the film forming rate of the SiOC film is significantly lowered. In particular, in the example WO/W in which the pyridine gas is not supplied when the BTCSM gas is supplied, it can be seen that the thickness of the SiOC layer formed per cycle is almost the same to that of a natural oxide film. In this sense, it can be seen that, it is preferable to supply the pyridine gas both when the BTCSM gas is supplied and when the $H_2O$ gas is supplied.

<Aspects of the Present Disclosure>

Hereinafter, some aspects of the present disclosure will be additionally stated.

(Supplementary Note 1)

According to an aspect of the present disclosure, there is provided a method of manufacturing a semiconductor device, including forming a thin film containing silicon, oxygen and carbon on a substrate by performing a cycle a predetermined number of times, the cycle including: supplying a precursor gas containing silicon, carbon and a halogen element and having an Si—C bonding, and a first catalytic gas to the substrate; and supplying an oxidizing gas and a second catalytic gas to the substrate.

(Supplementary Note 2)

In the method of manufacturing a semiconductor device according to Supplementary Note 1, each of the act of supplying the precursor gas and the first catalytic gas and the act of supplying the oxidizing gas and the second catalytic gas is performed under a non-plasma atmosphere.

(Supplementary Note 3)

In the method of manufacturing a semiconductor device according to Supplementary Note 1 or 2, a carbon concentration in the thin film is controlled by adjusting a supply amount of the second catalytic gas supplied in the act of supplying the oxidizing gas and the second catalytic gas.

(Supplementary Note 4)

In the method of manufacturing a semiconductor device according to any one of Supplementary Notes 1 to 3, a carbon concentration in the thin film is controlled by adjusting a ratio of a flow rate of the second catalytic gas to a sum of flow rates of the oxidizing gas and the second catalytic gas supplied in the act of supplying the oxidizing gas and the second catalytic gas.

(Supplementary Note 5)

In the method of manufacturing a semiconductor device according to any one of Supplementary Notes 1 to 4, the act of forming the thin film is performed while the substrate is accommodated in a process chamber, and a carbon concentration in the thin film is controlled by adjusting a partial pressure of the second catalytic gas, within the process chamber, supplied in the act of supplying the oxidizing gas and the second catalytic gas.

(Supplementary Note 6)

In the method of manufacturing a semiconductor device according to any one of Supplementary Notes 1 to 5, in the act of supplying the oxidizing gas and the second catalytic gas, a carbon concentration in the thin film is controlled by selecting and supplying, as the second catalytic gas, a specific catalytic gas from among a plural type of catalytic gases having different molecule structures.

(Supplementary Note 7)

In the method of manufacturing a semiconductor device according to any one of Supplementary Notes 1 to 6, in the act of supplying the oxidizing gas and the second catalytic gas, a carbon concentration in the thin film is controlled by selecting a specific supply line from among a plurality of supply lines that supplies a plural type of catalytic gases having different molecule structures, and supplying a specific catalytic gas through the specific supply line.

(Supplementary Note 8)

In the method of manufacturing a semiconductor device according to any one of Supplementary Notes 1 to 7, in the act of supplying the precursor gas and the first catalytic gas, a carbon concentration in the thin film is controlled by selecting and supplying, as the precursor gas, a specific precursor gas from among a plural type of precursor gases having different molecule structures.

(Supplementary Note 9)

In the method of manufacturing a semiconductor device according to any one of Supplementary Notes 1 to 8, in the act of supplying the precursor gas and the first catalytic gas, a carbon concentration in the thin film is controlled by selecting a specific supply line from among a plurality of supply lines that supplies a plural type of precursor gases having different molecule structures, and supplying a specific precursor gas through the specific supply line.

(Supplementary Note 10)

In the method of manufacturing a semiconductor device according to any one of Supplementary Notes 1 to 98, in the act of forming the thin film, the cycle is performed a predetermined number of times, and a carbon concentration in the thin film is changed in a film thickness direction by changing a supply amount of the second catalytic gas supplied in the act of supplying the oxidizing gas and the second catalytic gas, while the cycle is performed a predetermined number of times.

(Supplementary Note 11)

In the method of manufacturing a semiconductor device according to any one of Supplementary Notes 1 to 10, in the act of forming the thin film, the cycle is performed a predetermined number of times, and a carbon concentration in the thin film is changed in a film thickness direction by changing a type of the second catalytic gas supplied in the act of supplying the oxidizing gas and the second catalytic gas, while the cycle is performed a predetermined number of times.

(Supplementary Note 12)

In the method of manufacturing a semiconductor device according to any one of Supplementary Notes 1 to 11, in the act of forming the thin film, the cycle is performed a predetermined number of times, and a carbon concentration in the thin film is changed in a film thickness direction by changing a type of the precursor gas supplied in the act of supplying the precursor gas and the first catalytic gas, while the cycle is performed a predetermined number of times.

(Supplementary Note 13)

In the method of manufacturing a semiconductor device according to any one of Supplementary Notes 1 to 12, in the act of supplying the precursor gas and the first catalytic gas and the act of supplying the oxidizing gas and second catalytic gas, the first and second catalytic gases being the same type are supplied in different supply amounts, respectively.

(Supplementary Note 14)

In the method of manufacturing a semiconductor device according to any one of Supplementary Notes 1 to 12, in the act of supplying the precursor gas and the first catalytic gas and the act of supplying the oxidizing gas and the second catalytic gas, the first and second catalytic gases being different types are supplied, respectively.

(Supplementary Note 15)

In the method of manufacturing a semiconductor device according to any one of Supplementary Notes 1 to 14, the precursor gas contains at least one selected from the group consisting of an alkyl group and an alkylene group.

(Supplementary Note 16)

In the method of manufacturing a semiconductor device according to Supplementary Note 15, the precursor gas containing the alkylene group contains at least one selected from the group consisting of Si—C—Si bonding and Si—C—C—Si bonding.

(Supplementary Note 17)

In the method of manufacturing a semiconductor device according to any one of Supplementary Notes 1 to 16, the precursor gas contains at least one selected from the group consisting of an alkyl group containing carbon constituting the Si—C bonding and an alkylene group containing carbon constituting the Si—C bonding.

(Supplementary Note 18)

In the method of manufacturing a semiconductor device according to Supplementary Note 17, the precursor gas containing the alkylene group contains at least one selected from the group consisting of Si—C—Si bonding containing the Si—C bonding in a portion thereof and Si—C—C—Si bonding containing the Si—C bonding in a portion thereof.

(Supplementary Note 19)

In the method of manufacturing a semiconductor device according to any one of Supplementary Notes 1 to 18, the precursor gas includes at least one selected from the group consisting of a bis(trichlorosilyl)methane (($SiCl_3$)$_2CH_2$) gas, a 1,2-bis(trichlorosilyl)ethane (($SiCl_3$)$_2C_2H_4$) gas, a 1,1,2,2-tetrachloro-1,2-dimethyldisilane (($CH_3$)$_2Si_2Cl_4$) gas, and a 1,2-dichloro-1,1,2,2-tetramethyldisilane (($CH_3$)$_4Si_2Cl_2$) gas.

(Supplementary Note 20)

In the method of manufacturing a semiconductor device according to any one of Supplementary Notes 1 to 19, the precursor gas includes at least one selected from the group consisting of a bis(trichlorosilyl)methane (($SiCl_3$)$_2CH_2$) gas, a 1,2-bis(trichlorosilyl)ethane (($SiCl_3$)$_2C_2H_4$) gas.

(Supplementary Note 21)

In the method of manufacturing a semiconductor device according to any one of Supplementary Notes 1 to 20, the precursor gas includes a bis(trichlorosilyl)methane (($SiCl_3$)$_2CH_2$) gas.

(Supplementary Note 22)

In the method of manufacturing a semiconductor device according to any one of Supplementary Notes 1 to 21, each of the first and second catalytic gas includes an amine-based gas.

(Supplementary Note 23)

In the method of manufacturing a semiconductor device according to any one of Supplementary Notes 1 to 22, each of the first and second catalytic gases includes at least one selected from the group consisting of a triethylamine (($C_2H_5$)$_3N$) gas, a pyridine ($C_5H_5N$) gas, an aminopyridine ($C_5H_6N_2$) gas, a picoline ($C_6H_7N$) gas, a lutidine ($C_7H_9N$) gas, a piperazine ($C_4H_{10}N_2$) gas, and a piperidine ($C_5H_{11}N$) gas.

(Supplementary Note 24)

In the method of manufacturing a semiconductor device according to any one of Supplementary Notes 1 to 23, each of the first and second catalytic gases includes at least one selected from the group consisting of a triethylamine (($C_2H_5$)$_3$N) gas, a pyridine ($C_5H_5N$) gas, and a piperidine ($C_5H_{11}N$) gas.

(Supplementary Note 25)

In the method of manufacturing a semiconductor device according to any one of Supplementary Notes 1 to 24, each of the first and second catalytic gases includes a pyridine ($C_5H_5N$) gas.

(Supplementary Note 26)

In the method of manufacturing a semiconductor device according to any one of Supplementary Notes 1 to 25, in each of the act of supplying the precursor gas and the first catalytic gas and the act of supplying the oxidizing gas and the second catalytic gas, a temperature of the substrate ranges from room temperature to 200 degrees C.

(Supplementary Note 27)

In the method of manufacturing a semiconductor device according to any one of Supplementary Notes 1 to 26, in each of the act of supplying the precursor gas and the first catalytic gas and the act of supplying the oxidizing gas and the second catalytic gas, a temperature of the substrate ranges from room temperature to 150 degrees C.

(Supplementary Note 28)

In the method of manufacturing a semiconductor device according to any one of Supplementary Notes 1 to 27, in each of the act of supplying the precursor gas and the first catalytic gas and the act of supplying the oxidizing gas and the second catalytic gas, a temperature of the substrate ranges from room temperature to 100 degrees C.

(Supplementary Note 29)

According to another aspect of the present disclosure, there is provided a method of manufacturing a semiconductor device, including forming a thin film containing silicon, oxygen and carbon on a substrate by performing a cycle a predetermined number of times, the cycle including: supplying a precursor gas containing silicon, carbon and a halogen element and having an Si—C bonding, and a catalytic gas to the substrate; and supplying an oxidizing gas excited by plasma to the substrate.

(Supplementary Note 30)

According to still another aspect of the present disclosure, there is provided a method of manufacturing a semiconductor device, including forming a multi-layered film of a first thin film and a second thin film on a substrate by performing a cycle a predetermined number of times, the cycle including: forming the first thin film including silicon and oxygen by performing a set of processes a predetermined number of times, the processes including a process of supplying a precursor gas containing silicon and a halogen element and a first catalytic gas to the substrate, and a process of supplying an oxidizing gas and a second catalytic gas to the substrate; and forming the second thin film including silicon, oxygen and carbon by performing a set of processes a predetermined number of times, the processes including a process of supplying a precursor gas containing silicon, carbon and a halogen element and having an Si—C bonding, and a third catalytic gas to the substrate, and a process of supplying an oxidizing gas and a fourth catalytic gas to the substrate.

(Supplementary Note 31)

According to still another aspect of the present disclosure, there is provided a method of manufacturing a semiconductor device, including forming a multi-layered film of a first thin film and a second thin film on a substrate by performing a cycle a predetermined number of times, the cycle including: forming the first thin film including silicon and oxygen by performing a set of processes a predetermined number of times, the processes including a process of supplying a precursor gas containing silicon, carbon and nitrogen and having Si—N bonding to the substrate, and a process of supplying an oxidizing gas excited by plasma to the substrate; and forming the second thin film including silicon, oxygen and carbon by performing a set of processes a predetermined number of times, the processes including a process of supplying a precursor gas containing silicon, carbon and a halogen element and having an Si—C bonding, and a first catalytic gas to the substrate, and a process of supplying an oxidizing gas and a second catalytic gas to the substrate.

(Supplementary Note 32)

In the method of manufacturing a semiconductor device according to Supplementary Note 30 or 31, in the act of forming the multi-layered film, a plurality of the first thin films and a plurality of the second thin films are laminated by performing the cycle a predetermined number of times, to form the laminated film.

(Supplementary Note 33)

According to still another aspect of the present disclosure, there is provided a method of processing a substrate, including forming a thin film containing silicon, oxygen and carbon on a substrate by performing a cycle a predetermined number of times, the cycle including: supplying a precursor gas containing silicon, carbon and a halogen element and having an Si—C bonding, and a first catalytic gas to the substrate; and supplying an oxidizing gas and a second catalytic gas to the substrate.

(Supplementary Note 34)

According to still another aspect of the present disclosure, there is provided a substrate processing apparatus, including: a process chamber configured to accommodate a substrate therein; a precursor gas supply system configured to supply a precursor gas containing silicon, carbon and a halogen element and having an Si—C bonding into the process chamber; an oxidizing gas supply system configured to supply an oxidizing gas into the process chamber; a catalytic gas supply system configured to supply first and second catalytic gases into the process chamber; and a control unit configured to control the precursor gas supply system, the oxidizing gas supply system, and the catalytic gas supply system such that a thin film containing silicon, oxygen and carbon is formed on the substrate by performing a cycle a predetermined number of times, the cycle including supplying the precursor gas and the first catalytic gas to the substrate in the process chamber, and supplying the oxidizing gas and second catalytic gas to the substrate in the process chamber.

(Supplementary Note 35)

According to still another aspect of the present disclosure, there is provided a program that causes a computer to perform a process of forming a thin film containing silicon, oxygen and carbon on a substrate by performing a cycle a predetermined number of times, the cycle including: supplying a precursor gas containing silicon, carbon and a halogen element and having an Si—C bonding, and a first catalytic gas to the substrate in a process chamber of a substrate processing apparatus; and supplying an oxidizing gas and a second catalytic gas to the substrate in the process chamber.

(Supplementary Note 36)

According to still another aspect of the present disclosure, there is provided a non-transitory computer-readable recording medium storing a program that causes a computer to perform a process of forming a thin film containing silicon, oxygen and carbon on a substrate by performing a cycle a predetermined number of times, the cycle including: supplying a precursor gas containing silicon, carbon and a halogen element and having an Si—C bonding, and a first catalytic gas to the substrate in a process chamber of a substrate processing apparatus; and supplying an oxidizing gas and a second catalytic gas to the substrate in the process chamber.

According to a method of manufacturing a semiconductor device, a substrate processing apparatus and a recording medium of the present disclosure, it is possible to increasing carbon concentration in a thin film or controlling the carbon concentration with high precision.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising forming a thin film containing silicon, oxygen and carbon on a substrate by performing a cycle a predetermined number of times, the cycle comprising:
   supplying a precursor gas containing silicon, carbon and a halogen element and having an Si—C bonding, together with a first catalytic gas to the substrate, the first catalytic gas containing N having lone pair electrons; and
   supplying an oxidizing gas together with a second catalytic gas to the substrate, the second catalytic gas containing N having lone pair electrons,
   wherein a carbon concentration in the thin film is controlled by adjusting at least one of a supply amount of the second catalytic gas, a ratio of a flow rate of the second catalytic gas to a sum of flow rates of the oxidizing gas and the second catalytic gas, and a partial pressure of the second catalytic gas in the act of supplying the oxidizing gas together with the second catalytic gas.

2. The method of claim 1, wherein each of the act of supplying the precursor gas and the first catalytic gas and the act of supplying the oxidizing gas and the second catalytic gas is performed under a non-plasma atmosphere.

3. The method of claim 1, wherein, in the act of forming the thin film, the cycle is performed a plurality number of times, and
   a carbon concentration in the thin film is changed in a film thickness direction by changing a supply amount of the second catalytic gas supplied in the act of supplying the oxidizing gas and the second catalytic gas, while the cycle is performed the plurality number of times.

4. The method of claim 1, wherein, in the act of forming the thin film, the cycle is performed a plurality number of times, and
   a carbon concentration in the thin film is changed in a film thickness direction by changing a type of the second catalytic gas supplied in the act of supplying the oxidizing gas and the second catalytic gas, while the cycle is performed the plurality number of times.

5. The method of claim 1, wherein, in the act of forming the thin film, the cycle is performed a plurality number of times, and
   a carbon concentration in the thin film is changed in a film thickness direction by changing a type of the precursor gas supplied in the act of supplying the precursor gas and the first catalytic gas, while the cycle is performed the plurality number of times.

6. The method of claim 1, wherein, in the act of supplying the precursor gas and the first catalytic gas and the act of supplying the oxidizing gas and the second catalytic gas, the first and second catalytic gases being the same type are supplied in different supply amounts, respectively.

7. The method of claim 1, wherein, in the act of supplying the precursor gas and the first catalytic gas and the act of supplying the oxidizing gas and the second catalytic gas, the first and second catalytic gases being different types are supplied, respectively.

8. The method of claim 1, wherein the precursor gas contains at least one selected from the group consisting of an alkyl group and an alkylene group.

9. The method of claim 1, wherein the precursor gas contains at least one selected from the group consisting of an Si—C—Si bonding and an Si—C—C—Si bonding.

10. The method of claim 1, wherein each of the first and second catalytic gases comprises an amine-based gas.

11. The method of claim 1, wherein, in each of the act of supplying the precursor gas and the first catalytic gas and the act of supplying the oxidizing gas and the second catalytic gas, a temperature of the substrate ranges from room temperature to 200 degrees C.

12. The method of claim 1, wherein each of the first catalytic gas and the second catalytic gas has an acid dissociation constant ranging from about 5 to 11.

13. The method of claim 1, wherein each of the first catalytic gas and the second catalytic gas includes at least one selected from the group consisting of pyridine, aminopyridine, picoline, lutidine, piperazine, piperidine, triethylamine, diethylamine, monoethylamine, trimethylamine and monomethylamine.

14. The method of claim 1, wherein each of the first catalytic gas and the second catalytic gas includes a cyclic amine-based gas.

15. The method of claim 1, wherein each of the first catalytic gas and the second catalytic gas includes at least one selected from the group consisting of pyridine, aminopyridine, picoline, lutidine, piperazine and piperidine.

16. The method of claim 1, wherein the first catalytic gas weakens bonding strength of O—H bonding which exists on a surface of the substrate before supplying the precursor gas and the first catalytic gas, and
   wherein the second catalytic gas weakens bonding strength of O—H bonding included in the oxidizing gas.

* * * * *